United States Patent
Tice et al.

(10) Patent No.: US 6,412,413 B1
(45) Date of Patent: Jul. 2, 2002

(54) MEDIA CLAMP FOR EXTERNAL DRUM IMAGING SYSTEM

(75) Inventors: William W. Tice, Amherst, NH (US); Thomas Marincic, Wilmington; Thomas E. Robinson, Walpole, both of MA (US)

(73) Assignee: Agfa Corporation, Wilmington, MA (US)

( * ) Notice: Subject to any disclaimer, the term of this patent is extended or adjusted under 35 U.S.C. 154(b) by 0 days.

(21) Appl. No.: 09/573,064

(22) Filed: May 17, 2000

Related U.S. Application Data
(60) Provisional application No. 60/184,880, filed on Feb. 25, 2000.

(51) Int. Cl.[7] .............................. B41F 21/00; B41F 21/06
(52) U.S. Cl. ..................... 101/409; 101/415.1; 101/477; 101/389.1
(58) Field of Search .............................. 101/415.1, 477, 101/409, 378, 382.1, 383, 389.1, 463.1; 271/82, 277, 276

(56) References Cited

U.S. PATENT DOCUMENTS

| | | | | |
|---|---|---|---|---|
| 3,918,707 A | * | 11/1975 | Villemer et al. ............ 271/277 |
| 4,138,102 A | * | 2/1979 | Palmer ..................... 101/389.1 |
| 4,250,810 A | | 2/1981 | Fowler et al. ........... 101/415.1 |
| 4,727,806 A | | 3/1988 | Green, Sr. ............... 101/415.1 |
| 5,016,531 A | | 5/1991 | Schroeder ................ 101/415.1 |
| 5,052,120 A | | 10/1991 | Lubberts ................... 101/415.1 |
| 5,284,093 A | | 2/1994 | Guaraldi et al. ......... 101/415.1 |
| 5,383,001 A | | 1/1995 | Bosy ........................... 101/378 |
| 5,516,096 A | | 5/1996 | Whiteside et al. .......... 101/409 |
| 5,685,226 A | | 11/1997 | Fuller ...................... 101/415.1 |
| 5,809,890 A | | 9/1998 | Knauer et al. ........... 101/415.1 |
| 6,334,392 B1 | * | 1/2002 | Kawada et al. .......... 101/415.1 |

* cited by examiner

Primary Examiner—Leslie J. Evanisko
(74) Attorney, Agent, or Firm—Edward L. Kelley

(57) ABSTRACT

A media handling system is provided for an imaging system, such as an external drum platesetter. An edge clamp used to secure a printing plate onto a cylindrical media support surface of the external drum is movable about the drum surface to accommodate the use of different size plates. The edge clamp includes a clamping bar which is radially movable with respect to the media support surface to attach to the media support surface and capture an edge of the printing plate by employing vacuum hold down force.

32 Claims, 45 Drawing Sheets

MEDIA CLAMP FOR EXTERNAL DRUM IMAGING SYSTEM

This application claims the benefit of provisional No. 60/184,880, filed Feb. 25, 2000.

FIELD OF THE INVENTION

The present invention is in the field of imaging systems. More particularly, the present invention provides a media handling system for an external drum image recording apparatus for recording images onto sheets of recording material such as printing plates.

BACKGROUND OF THE INVENTION

In external drum image recording devices, a movable optical carriage is used to displace an image exposing or recording source in a slow scan direction while a cylindrical drum supporting recording material on an external surface thereof is rotated with respect to the image exposing source. The drum rotation causes the recording material to advance past the exposing source along a direction which is substantially perpendicular to the slow scan direction. The recording material is therefore advanced past the exposing source by the rotating drum in a fast scan direction.

An image exposing source may include an optical system for scanning one or more exposing or recording beams. Each recording beam may be separately modulated according to a digital information signal representing data corresponding to the image to be recorded.

The recording media to be imaged by an external drum imaging system is commonly supplied in discrete sheets and may comprise a plurality of plates, hereinafter collectively referred to as "plates" or "printing plates." Each plate may comprise one or more layers supported by a support substrate, which for many printing plates is a plano-graphic aluminum sheet. Other layers may include one or more image recording (i.e., "imageable") layers such as a photosensitive, radiation sensitive, or thermally sensitive layer, or other chemically or physically alterable layers. Printing plates which are supported by a polyester support are also known and can be used in the present invention. Printing plates are available in a wide variety of sizes, typically ranging, e.g., from 9"×12", or smaller, to 58"×80", or larger. The printing plate may additionally comprise a flexographic printing plate.

BRIEF DESCRIPTION OF THE DRAWINGS

The features of the present invention will best be understood from a detailed description of the invention and embodiments thereof selected for the purpose of illustration and shown in the accompanying drawings in which.

DETAILED DESCRIPTION OF THE INVENTION

Figure 1:
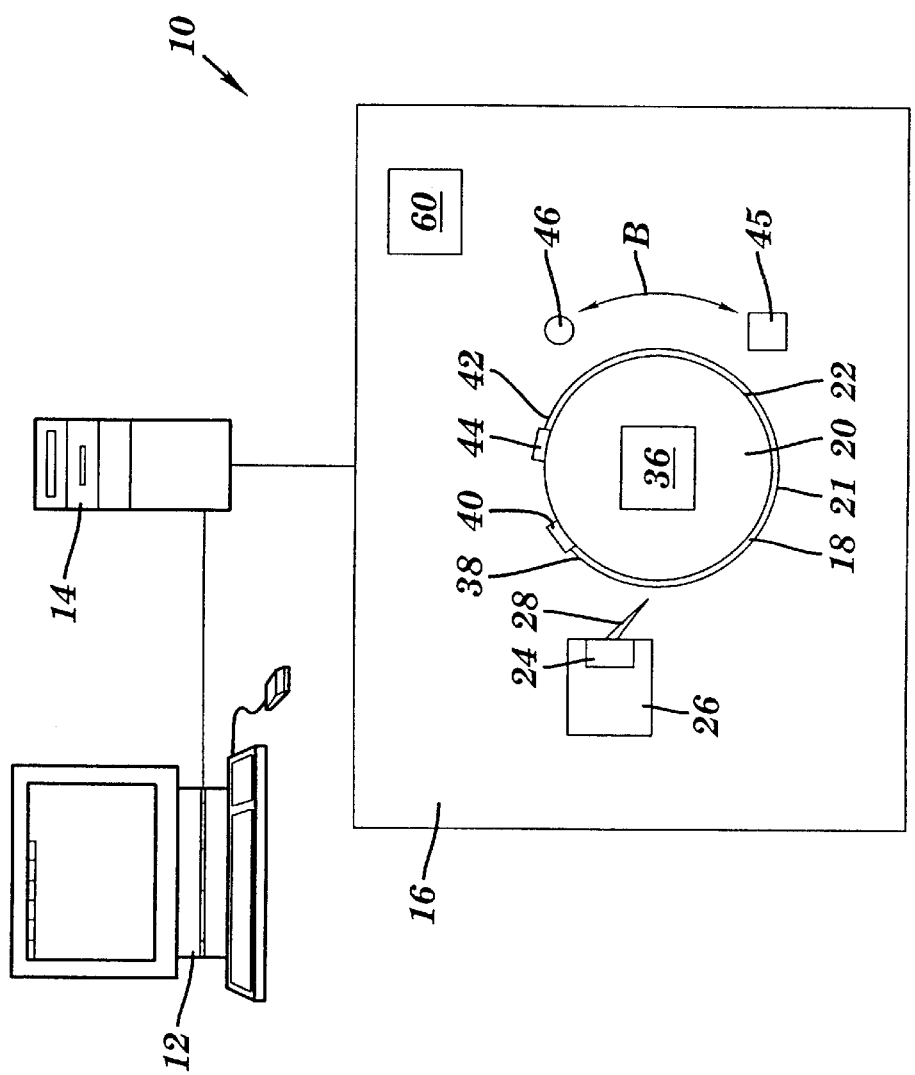
FIG. 1 illustrates an external drum imaging system for recording images onto a supply of recording media such as a printing plate.

The features of the present invention are illustrated in detail in the accompanying drawings, wherein like reference numerals refer to like elements throughout the drawings. Although the drawings are intended to illustrate the present invention, the drawings are not necessarily drawn to scale.

An example of an imaging system 10 employing an external drum image recording system is illustrated in FIG.

1. In this example, the imaging system 10 comprises an external drum platesetter configured to record digital data onto a printing plate. Although described below with regard to an external drum platesetter, many aspects of the present invention may be used in conjunction with a wide variety of other types of external drum, internal drum, or flatbed imaging systems, including imagesetters and the like, without departing from the intended scope of the present invention.

The imaging system 10 generally includes a front end computer or workstation 12 for the design, layout, editing, and/or processing of digital files representing pages to be printed, a raster image processor (RIP) 14 for further processing the digital pages to provide rasterized page data (e.g., rasterized digital files) for driving an image recorder, and an image recorder, such as an external drum platesetter 16, for recording the rasterized digital files onto a printing plate or other recording media. The external drum platesetter 16 records the digital data (i.e., "job") provided by the RIP 14 onto a supply of photosensitive, radiation sensitive, thermally sensitive, or other type of suitable printing plate 18. In the present invention, the printing plate 18 is manually loaded onto a staging area of the external drum platesetter 16 by an operator. Alternately, or in addition to manual loading, the printing plate may be provided and loaded onto the external drum platesetter 16 by a media supply or autoloading system 60. The media supply system 60 may accept a plurality of the same size printing plates 18, and/or may accept a plurality of different size printing plates 18.

Figure 2:
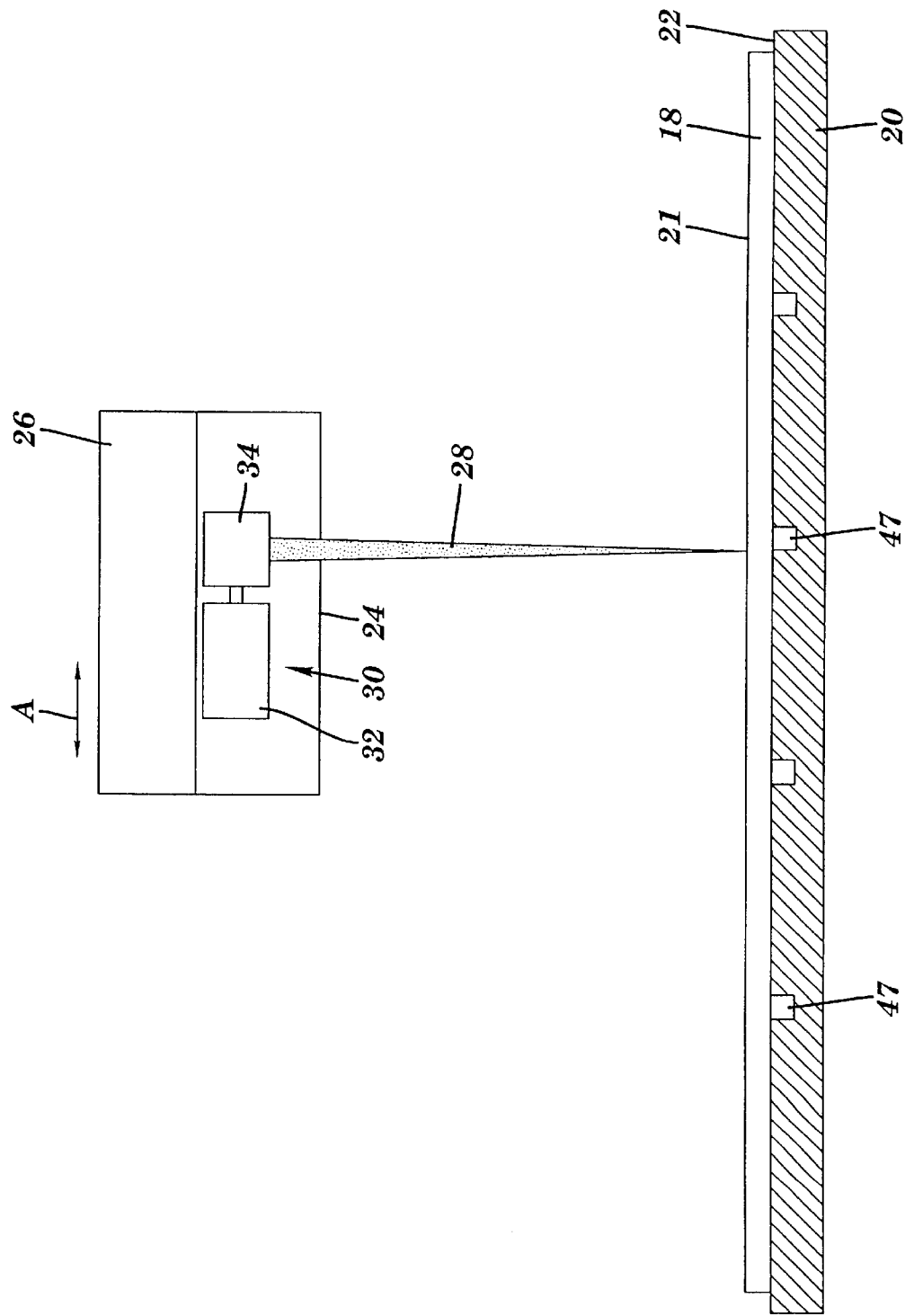
FIG. 2 illustrates an example of an imaging system including a movable optical carriage and scanning system, usable in the external drum imaging system of FIG. 1.

The external drum platesetter 16 includes an external drum 20 having a cylindrical media support surface 22 for supporting the printing plate 18 during imaging. The external drum platesetter 16 further includes a scanning system 24, coupled to a movable carriage 26, for recording digital data onto the imaging surface 21 of the printing plate 18 using a single or multiple imaging beams 28. An example of a scanning system 24 is illustrated in FIG. 2. In particular, the scanning system 24 is displaced by the movable carriage 26 in a slow scan axial direction (directional arrow A) along the length of the rotating external drum 20 to expose the printing plate 18 in a line-wise manner when a single beam is used or in a section-wise manner for multiple beams. Other types of imaging systems may also be used in the present invention.

The external drum 20 is rotated by a drive system 36 in a clockwise or counterclockwise direction as indicated by directional arrow B in FIG. 1. Typically, the drive system 36 rotates the external drum 20 at a rate of about 100–1000 rpm. In the present invention, the printing plate 18 is loaded onto the external drum 20 while rotating the drum in a first direction. The printing plate 18 is then imaged while the drum is rotated in the first, or in a second, opposite direction. Finally, the printing plate 18 is unloaded from the external drum 20 while rotating the drum in the second direction. The details of the loading, imaging, and unloading operations are discussed in further detail below.

As further illustrated in FIG. 2, the scanning system 24 typically includes a system 30 for generating the imaging beam or beams 28. The system 30 comprises a light or radiation source 32 for producing the imaging beam or beams 28 (illustrated for simplicity as a single beam), and an optical system 34 positioned between the radiation source 32 and the media support surface 22 for focusing the imaging beam or beams 28 onto the printing plate 18. It should be noted, however, that the system 30 described above is only one of many possible different types of scanning systems that may be used to record image data on the printing plate 18. In the present invention, the system 30 comprises a multiple address grating light valve (GLV) or functionally similar modulator based system, or a multiple beam fiber optic coupled laser system.

In the external drum imaging system 10 shown in FIG. 1, the leading edge 38 of the printing plate 18 is held in position against the media support surface 22 by a leading edge clamping mechanism 40. Similarly, the trailing edge 42 of the printing plate 18 is held in position against the media support surface 22 by a trailing edge clamping mechanism 44. Both the trailing edge clamping mechanism 44 and the leading edge clamping mechanism 40 provide a tangential friction force between the printing plate 18 and the external drum 20 sufficient to resist the tendency of the edges of the printing plate 18 to pull out of the clamping mechanisms 40, 44, at a high drum rotational speed. In accordance with the present invention, only a small section (e.g., 6mm) of the leading and trailing edges 38, 42, is held against the external drum 20 by the leading and trailing edge clamping mechanisms 40, 44, thereby increasing the available imaging area of the printing plate 18.

A stationary ironing roller system 46 flattens the printing plate 18 against the media support surface 22 of the external drum 20 as the external drum 20 rotates past the ironing roller 46 during the loading of the printing plate 18. Alternately, or in addition, a vacuum source 45 may be used to draw a vacuum through an arrangement of ports and vacuum grooves 47 (see, e.g., FIG. 2) formed in the media support surface 22 to hold the printing plate 18 against the media support surface 22. A registration system, comprising, for example, a set of registration pins or stops on the external drum 20, and a plate edge detection system, may be used to accurately and repeatably position and locate the printing plate 18 on the external drum 20. The plate edge detection system, as described infra, may comprise, for example, a plurality of sensors and/or the scanning system 24.

Figure 3:
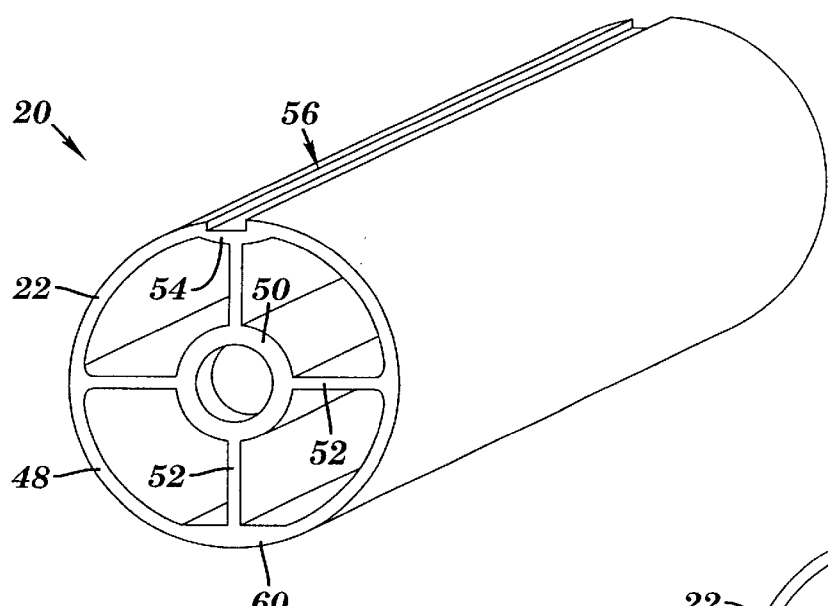
FIG. 3 is a perspective view of the external drum of the imaging system of FIG. 1, in accordance with an embodiment of the present invention
Figure 4:
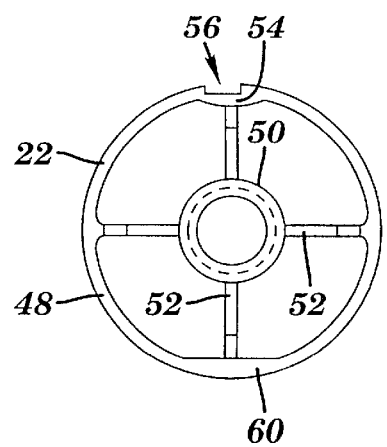
FIG. 4 is an end view of the external drum of FIG. 3.
Figure 5:
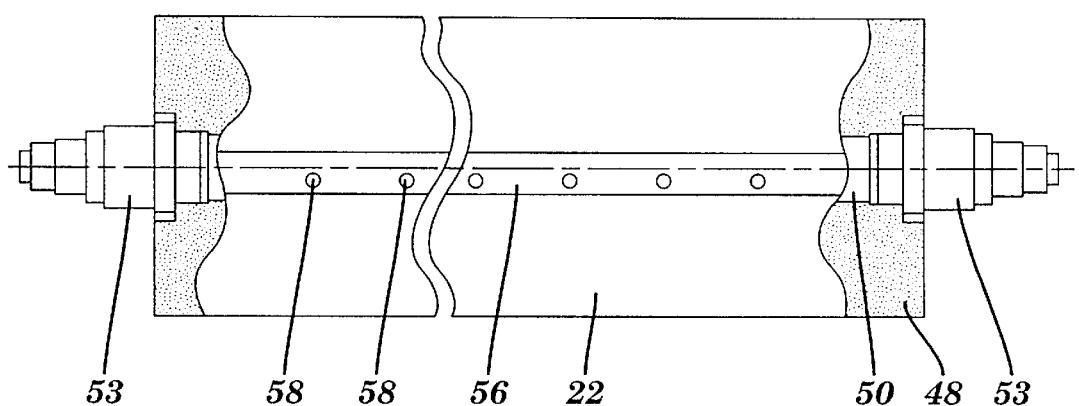
FIG. 5 is a plan view of the external drum of FIG. 3.

A perspective view of the external drum 20 in accordance with the present invention is illustrated in FIG. 3. An end view and a plan view of the external drum 20 are illustrated in FIGS. 4 and 5, respectively. As shown, the external drum 20 comprises an outer wall 48 that includes the media support surface 22, a hollow cylindrical hub 50, and a plurality of radial spokes 52 extending between the cylindrical hub 50 and the outer wall 48. The external drum 20 is rotated by the drive system 36 (FIG. 1) via shafts 53 coupled to the ends of the hub 50.

The external drum 20 is formed in a single piece using an extrusion process from a lightweight and strong material such as an aluminum alloy. Suitable aluminum alloys may include, for example, aluminum alloy 6063-T5. Other aluminum alloys, or alloys formed of metals other than aluminum, that can be suitably extruded, may also be used to form the external drum 20. In other embodiments of the present invention, however, the external drum 20 may be formed of a material such as steel or other ferromagnetic alloy using other processes. Such a material may be required if the leading edge clamping mechanism 40 and/or trailing edge clamping mechanism 44 utilize magnetic or electromagnetic clamping components.

The present invention provides a stiff external drum 20 having low rotational inertia. This allows the external drum 20 to be accelerated and decelerated more rapidly than other currently available drums, using smaller and less expensive motors, power supplies, etc., thereby further increasing the throughput of the imaging system 10 of the present invention.

The outer wall 48 of the external drum 20 further includes a section 54 containing a groove 56 that provides an interface for the leading edge clamping mechanism 40. The leading edge clamping mechanism 40 is attached within the groove 56 by inserting and securing suitable mounting hardware (e.g., bolts, etc.) through the leading edge clamping mechanism 40 and corresponding apertures 58 formed in the bottom of the groove 56. In the present invention, the groove 56 is disposed above one of the radial spokes 52. The relative thickness of the outer wall 48 is increased below the groove 56 to maintain minimum wall thickness requirements, and to offset any change in drum balance as a result of removing material to form the groove 56. By forming the groove 56 in this location, the stiffness and strength of the external drum 20 are not compromised. The groove 56 may be formed as part of the extrusion process, and/or may be machined into the external drum 20 after extrusion.

To compensate for the weight of leading edge clamping mechanism 40, and other adjacent system components, thereby balancing the external drum 20 during rotation, the section 60 of the external drum 20 opposite the groove 56 is provided with extra material (i.e., extra mass). This is achieved by increasing the extruded thickness of the outer wall 48 opposite the groove 56. Thus, the present invention nominally and inexpensively balances the external drum 20 and leading edge clamping mechanism 40 by adding extruded material opposite the clamping mechanism. Proper balancing of the external drum 20 helps to prevent the introduction of vibration-induced artifacts into the images recorded on the printing plate 18 by the imaging system 10.

Figure 7:
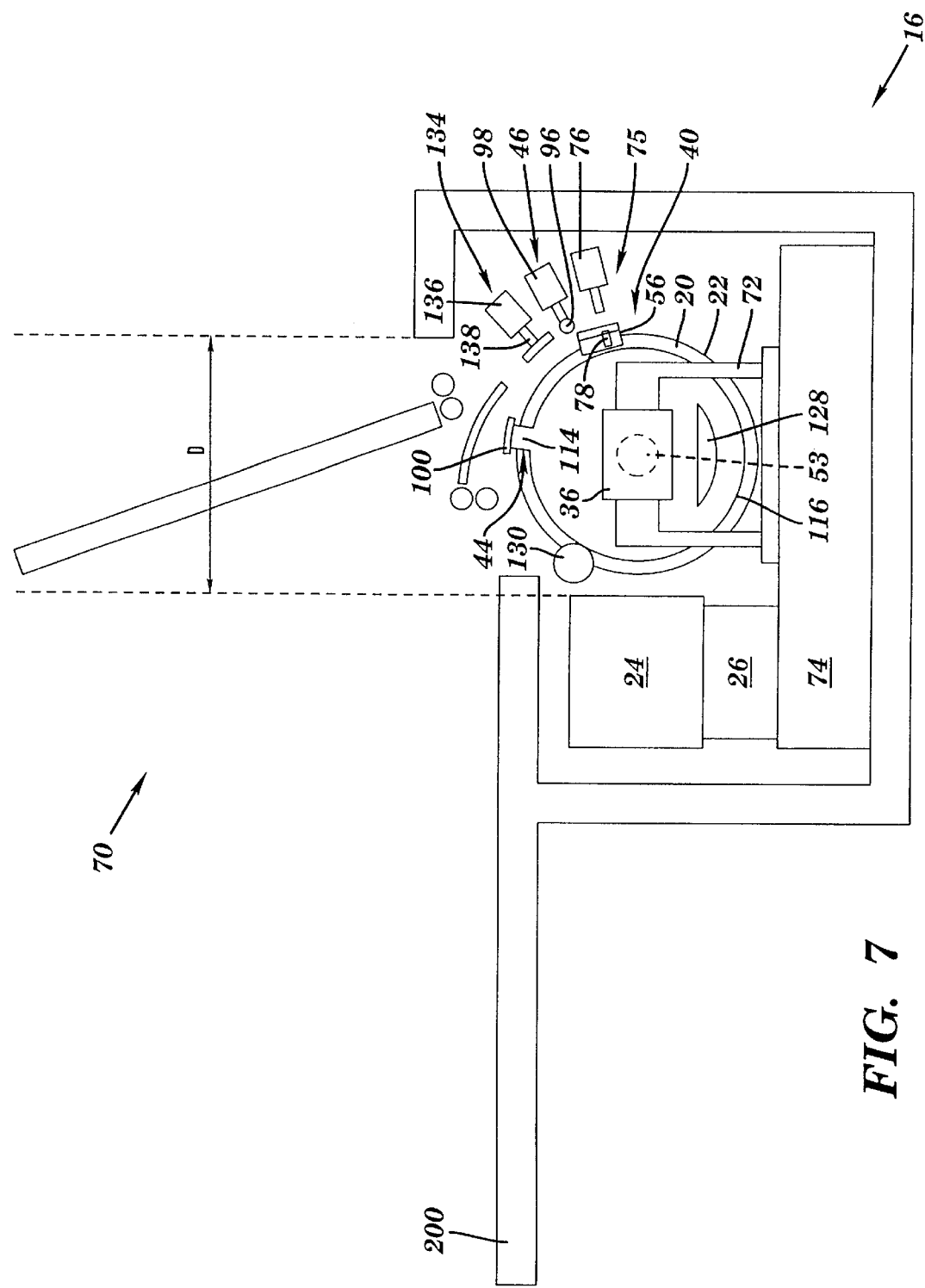
FIG. 7 illustrates the media handling system of an external drum platesetter in accordance with the present invention.

The basic structure of the media handling system 70 of an external drum platesetter 16 in accordance with the present invention is illustrated in FIG. 7. The external drum platesetter 16 includes an external drum 20 (see, e.g., FIGS. 3–5) having a cylindrical media support surface 22 for supporting a printing plate 18 during imaging. The external drum 20 is supported by a frame 72. A drive system 36 rotates the external drum 20 during imaging. A scanning system 24, carried by a movable carriage 26, travels axially along the rotating external drum 20 to record digital data onto the imaging surface of the printing plate (see, e.g., FIG. 2). The external drum 20 and scanning system 24 are positioned on a base 74. The base 74 is formed of heavy material, such as a polymer-concrete mixture, granite, or the like, to vibrationally isolate the external drum 20 and scanning system 24 from external vibrations, thereby reducing artifacts in the recorded image.

In order to load and hold the printing plate 18 in intimate contact with the cylindrical media support surface 22 of the external drum 20 while the external drum 20 is rotated and an image is recorded onto the printing plate 18, a leading edge clamping mechanism 40 is provided to hold a leading edge of a printing plate 18 in position against the media support surface 22. The clamping system of the present invention, comprising the leading edge clamping mechanism 40 and the trailing edge clamping mechanism 44, is capable of holding a variety of different printing plate widths either left, right, or center justified on the external drum 20. An actuating system 75, including an actuator 76 (e.g., a pneumatic actuator, solenoid, etc.), selectively opens and closes the leading edge clamping mechanism 40 to receive, capture, and release the leading edge 38 of the printing plate 18. The actuating system 75 of the leading edge clamping mechanism 40 is mounted to a frame member (not shown) of the external drum platesetter 16 such that the actuating system 75 is positioned above the media support surface 22 of the external drum 20.

The leading edge clamping mechanism 40 is fixed in position on the external drum 20. The leading edge clamping mechanism 40 is positioned within a groove 56 (see, e.g., FIGS. 3–5) formed in the external drum 20. A set of registration pins or stops 78 (hereafter referred to as "registration pins") are incorporated into the leading edge clamping mechanism 40 to accurately and repeatably position, or "register," the leading edge 38 of a printing plate 18 at a predetermined location on the external drum 20, and to align the leading edge 38 of the printing plate 18 along an axis which is substantially parallel to the longitudinal axis of the external drum 20. The registration pins 78 may also be incorporated into an electrical or other mechanical structure for other purposes, such as to electronically or mechanically detect the presence of the leading edge 38 of the printing plate 18 within the leading edge clamping mechanism 40.

Figure 8:
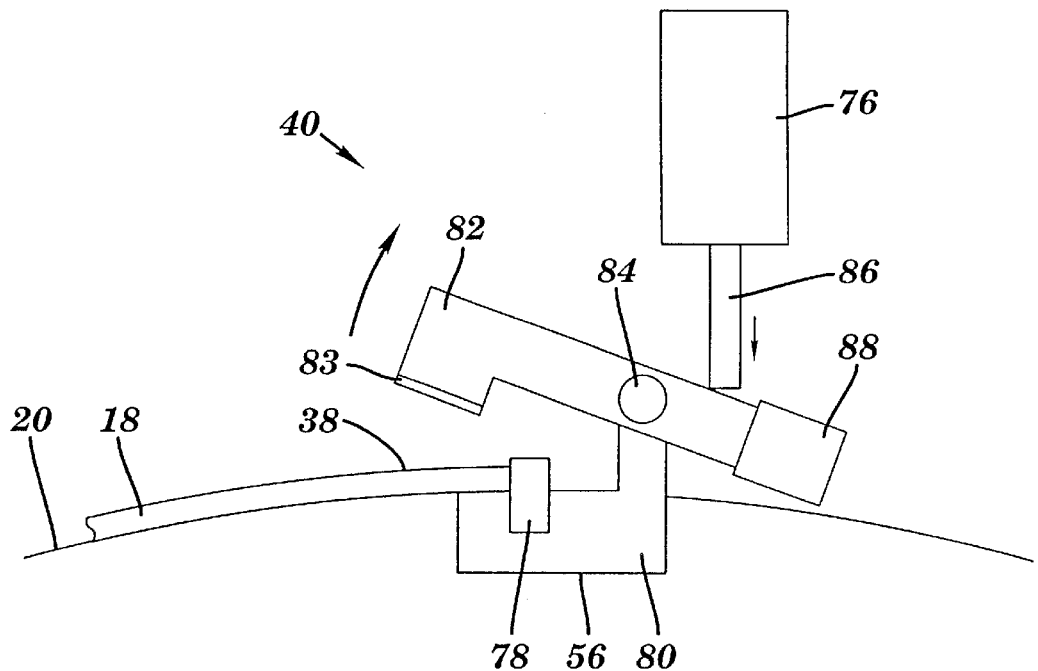
FIG. 8 provides an end view of a leading edge clamping mechanism in an open orientation.
Figure 9:
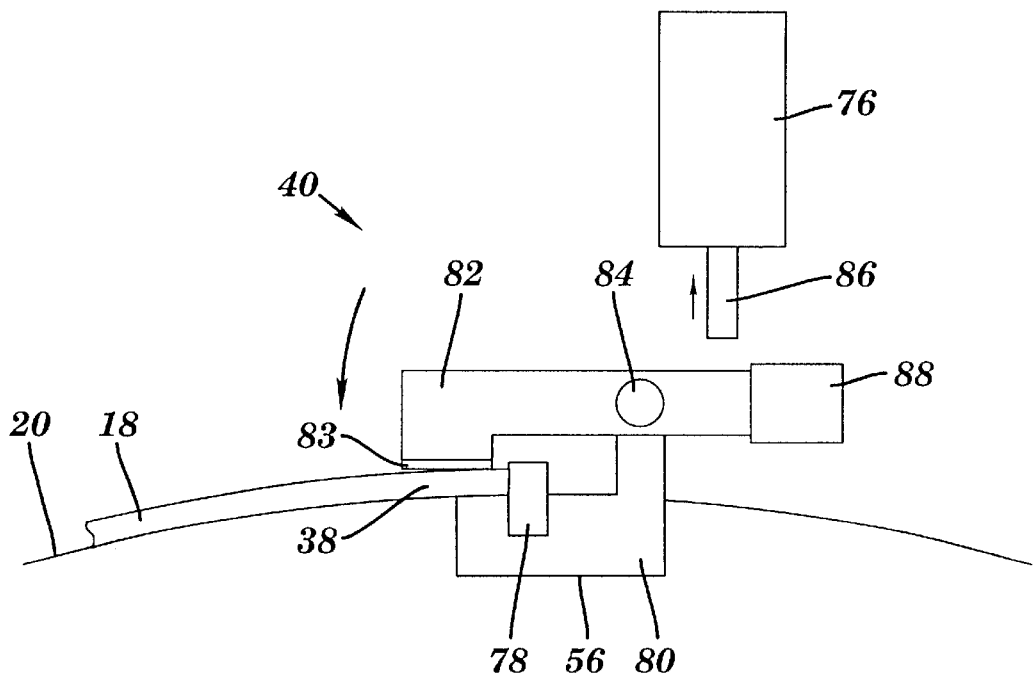
FIG. 9 provides an end view of the leading edge clamping mechanism of FIG. 8 in a closed orientation.
Figure 10:
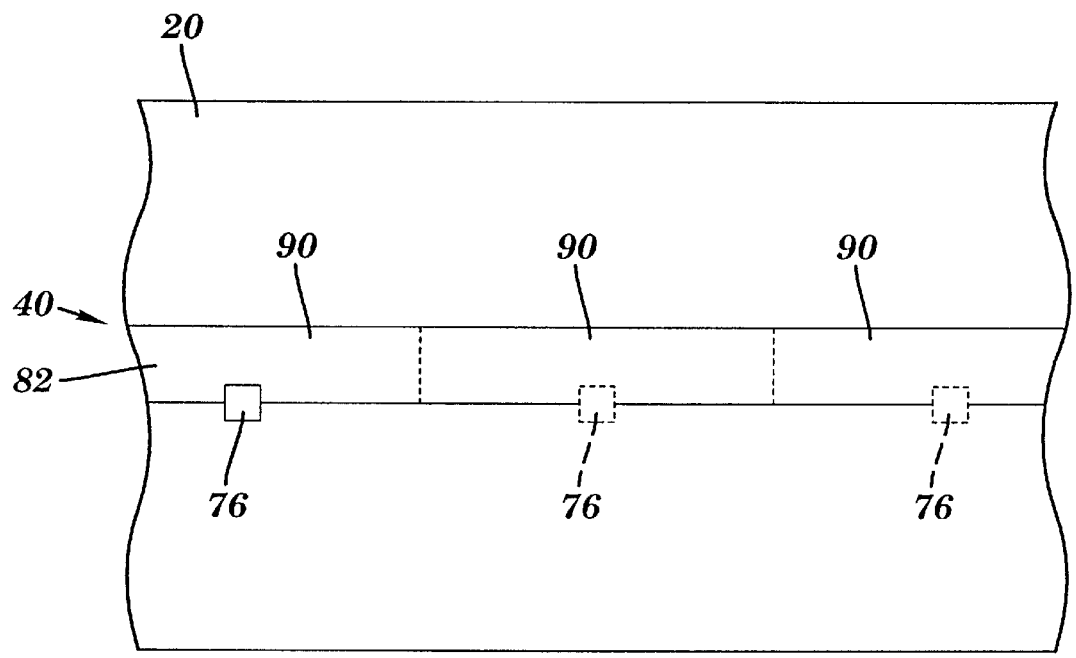
FIG. 10 is a plan view of the leading edge clamping mechanism of FIG. 8.
Figure 11:
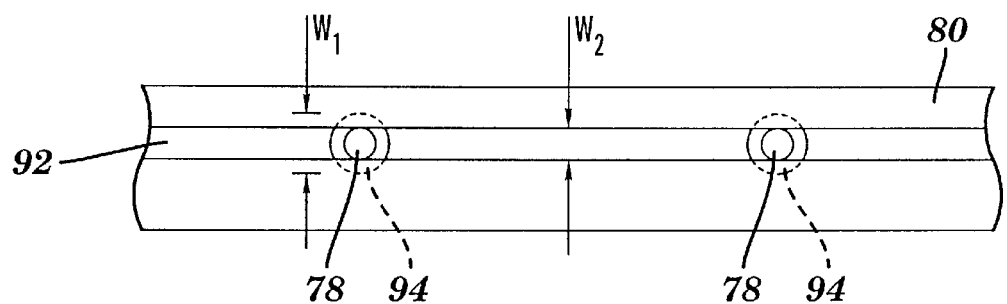
FIG. 11 illustrates the location of the registration pins within the leading edge clamping mechanism of FIG. 8.

An embodiment of the leading edge clamping mechanism 40 is illustrated in greater detail in FIGS. 8–11. FIGS. 8 and 9 provide end views of the leading edge clamping mechanism 40 in open and closed positions, respectively. FIGS. 8 and 9 additionally illustrate the operation of the actuator 76 and the function of the registration pins 78. FIG. 10 provides a plan view of the leading edge clamping mechanism 40. FIG. 11 illustrates the set of registration pins 78 and the mounting portion 80 of the leading edge clamping mechanism 40.

As shown in FIGS. 8 and 9, the leading edge clamping mechanism 40 includes a mounting portion 80 and a clamping portion 82. The mounting portion 80 is used to secure the leading edge clamping mechanism 40 within the groove 56 of the external drum 20. As described with reference to FIG. 5, the leading edge clamping mechanism 40 may be attached within the groove 56 by inserting and securing suitable mounting hardware (e.g., bolts, etc.) through the mounting portion 80 and corresponding apertures 58 formed in the bottom of the groove 56.

The clamping portion 82 of the leading edge clamping mechanism 40 is attached to the mounting portion 80 by a biasing system 84. The biasing system 84, which may comprise a spring system including one or more springs, biases the clamping portion 82 of the leading edge clamping mechanism 40 closed against the mounting portion 80 with sufficient force to prevent the printing plate 18 from moving during rotation of the external drum 20. The actuator 76 is used to selectively open the leading edge clamping mechanism 40 to receive or release the leading edge 38 of the printing plate 18. In particular, as shown in FIG. 8, the actuator 76 includes an extendable member 86 that is configured to selectively engage and press against the clamping portion 82, thereby counteracting the biasing force of the biasing system 84 and opening the leading edge clamping mechanism 40. When the clamping portion 82 of the leading edge clamping mechanism 40 is in an open position as illustrated in FIG. 8, a printing plate 18 may be loaded against the registration pins 78 until two points of the leading edge 38 of the printing plate 18 are in contact with two registration pins 78.

As further illustrated in FIG. 8, during the loading of a printing plate 18 onto the external drum 20, the leading edge 38 of the printing plate 18 is accurately and repeatably positioned and aligned on the external drum 20 using the registration pins 78. As will be further illustrated below, only two axially spaced registration pins 78 contact the leading edge 38 of the printing plate 18 to ensure that the leading edge 38 is correctly positioned along an axis which is substantially parallel to the longitudinal axis of the external drum 20. A plate edge detection system (not shown), comprising, for example, an optical sensor, a mechanical sensor, etc., is used to electronically and/or mechanically sense or detect a perpendicular edge of the printing plate 18 (i.e., an edge perpendicular to the axis of the leading edge 38) to determine the axial position of the printing plate 18 on the external drum 20. Once the exact position of the printing plate 18 is determined on the external drum 20, the scanning system 24 (see, e.g., FIGS. 1, 2, and 7) can be accurately positioned by the movable carriage 26 to record image data in predetermined locations on the printing plate 18 with respect to the leading and perpendicular edges thereof.

As illustrated in FIG. 9, the leading edge 38 of the printing plate 18 is secured in position on the external drum 20 by closing the leading edge clamping mechanism 40. In particular, to close the leading edge clamping mechanism 40, the actuator 76 retracts the member 86 away from the clamping portion 82. This removes the force that previously counteracted the biasing force applied against the clamping portion 82 by the biasing system 84. Accordingly, the clamping portion 82 is now forced toward the external drum 20 by the biasing system 84, thereby securing the leading edge 38 of the printing plate 18 against the external drum 20.

After the leading edge 38 of the printing plate 18 has been properly positioned against the registration pins 78 and secured to the external drum 20 by the leading edge clamping mechanism 40, subsequent media handling operations may then be performed to completely load the printing plate 18 onto the external drum 20. Thereafter, image data may be recorded on the printing plate 18 by the scanning system 24 as the printing plate 18 is rotated on the external drum 20. Upon completion of the imaging process, the printing plate 18 is unloaded from the external drum 20 as will be described supra with reference to FIGS. 22–25. A layer of rubber or other nonabrasive material 83 may be applied to the clamping portion 82 to prevent damage to the imaging surface of the printing plate 18, to take-up the tolerances of the location of the clamping surface of the clamping portion 82, and to increase friction between the clamping portion 82 and the printing plate 18.

A distal end 88 of the clamping portion 82 of the leading edge clamping mechanism 40 is weighted such that the center of gravity of the clamping portion 82 is located between the biasing system 84 and the distal end 88. In FIGS. 8 and 9, for example, the center of gravity is to the "right" of the biasing system 84. By forming the clamping portion 82 in this manner, the clamping force applied by the clamping portion 82 against the external drum 20 and printing plate 18 increases as the rotational speed of the external drum 20 increases. This helps to prevent the clamping portion 82 from inadvertently releasing the leading edge 38 of the printing plate 18 during high speed rotation (e.g., 1000 rpm) of the external drum 20 during imaging.

A plan view of the leading edge clamping mechanism 40 is illustrated in FIG. 10. As shown, the leading edge clamping mechanism 40 may include a single clamping portion 82 that extends the length of the external drum 20, which may be opened and closed by an actuating system comprising a single actuator 76. Alternately, an actuating system comprising a plurality of actuators 76 (shown in phantom) may be positioned (e.g., distributed along) the external drum 20 to open and close the single clamping portion 82. The clamping portion 82 may also comprise a plurality of discrete sections 90 (shown in phantom), collectively operated by an actuating system including a single actuator 76, or a plurality of actuators 76.

A plan view of the mounting portion 80 of the leading edge clamping mechanism 40 is illustrated in FIG. 11. The mounting portion 80 includes a channel 92 through which the registration pins 78 extend away from the external drum 20, and along which the registration pins 78 may be selectively positioned and secured according the size or sizes of the printing plates 18 to be imaged. The channel 92 extends along the entire length of the external drum 20 to allow the registration pins 78 to be positioned at any axial location along the external drum 20. Generally, the registration pins 78 are positioned on the external drum 20 such that the leading edge 38 of a printing plate 18 contacts two of the registration pins 78. The registration pins 78 may be fixed in position along the channel 92 in any suitable manner. Each registration pin 78 includes a base 94 having a width W1 larger than the width W2 of the channel 92.

Referring again to FIG. 7, a stationary ironing roller system 46 is used to flatten the printing plate 18 against the media support surface 22 of the external drum 20 as the external drum 20 rotates past the ironing roller system 46 during the loading of the printing plate 18. In particular, the stationary ironing roller system 46 applies a force that keeps the printing plate 18 in contact against the media support surface 22 of the external drum 20 as the external drum 20 is rotated and the printing plate 18 is applied. The stationary ironing roller system 46 comprises an ironing roller assembly 96, including one or more rollers, and an actuating system 98 for extending or retracting the ironing roller assembly 96 toward or away from the media support surface 22 of the external drum 20.

The ironing roller assembly 96 is retracted away from the external drum 20 prior to the imaging of the printing plate 18. The stationary ironing roller system 46 is mounted to a frame member (not shown) of the external drum platesetter 16 such that the stationary ironing roller system 46 is positioned above the media support surface 22 of the external drum 20.

A trailing edge clamping mechanism 44 is provided to hold the trailing edge 42 (see, e.g., FIG. 1) of the printing plate 18 in place against the media support surface 22 of the external drum 20 during rotation of the external drum 20 and imaging of the printing plate 18. operationally, the trailing edge clamping mechanism 44 is held against the external drum 20 with enough force to resist the forces resulting from wrapping the normally flat printing plate 18 around the cylindrical external drum 20 and to counteract the centrifugal forces which act to lift the printing plate 18 and the trailing edge clamping mechanism 44 off the external drum 20 during rotation of the external drum 20. The same functionality is also provided by the leading edge clamping mechanism 40.

If a single length printing plate 18 is to be imaged by the external drum platesetter 16, the trailing edge clamping mechanism 44 may be located at a fixed position on the external drum 20 corresponding to the location of the trailing edge 42 of the single length printing plate 18. The external drum platesetter 16 of the present invention, however, is intended to be used to image printing plates 18 having different lengths. As such, the position of the trailing edge clamping mechanism 44 is configured to be movable around the outer diameter of the external drum 20 with respect to the leading edge clamping mechanism 40 to accommodate different plate lengths.

In the present invention, the trailing edge clamping mechanism 44 employs a vacuum to hold the trailing edge 42 of the printing plate 18 against the external drum 20. Other configurations that utilize a magnetic force, an electromagnetic force, a mechanical force, etc., to hold the trailing edge 42 of the printing plate 18 against the external drum 20, may also be used.

Figure 12:
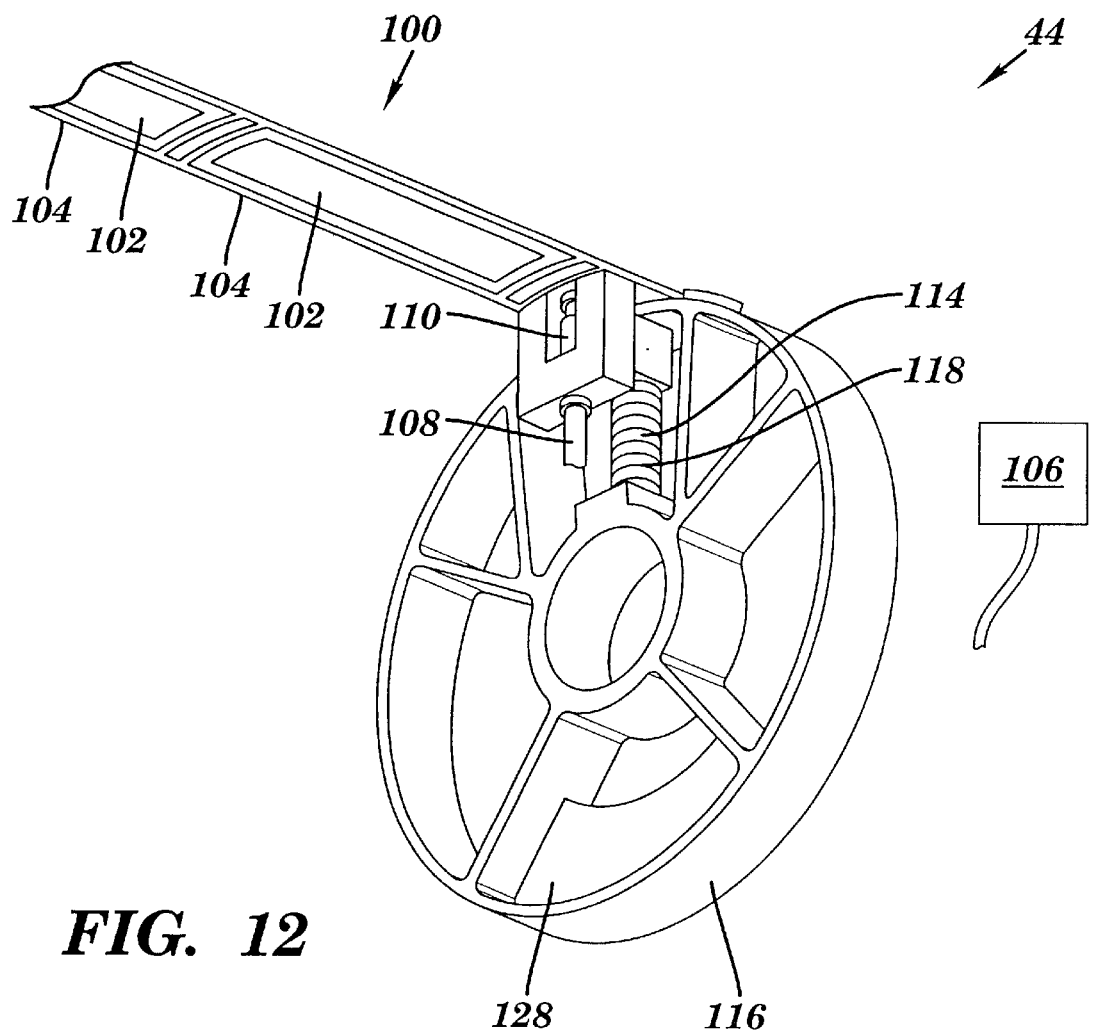
FIG. 12 is a partial perspective view of the trailing edge clamping mechanism.
Figure 13A:
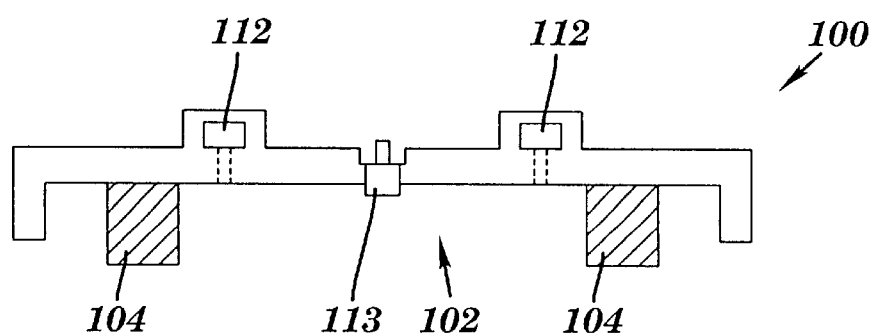
FIG. 13A is a cross-sectional view of the clamping bar of the trailing edge clamping mechanism.
Figure 13B:
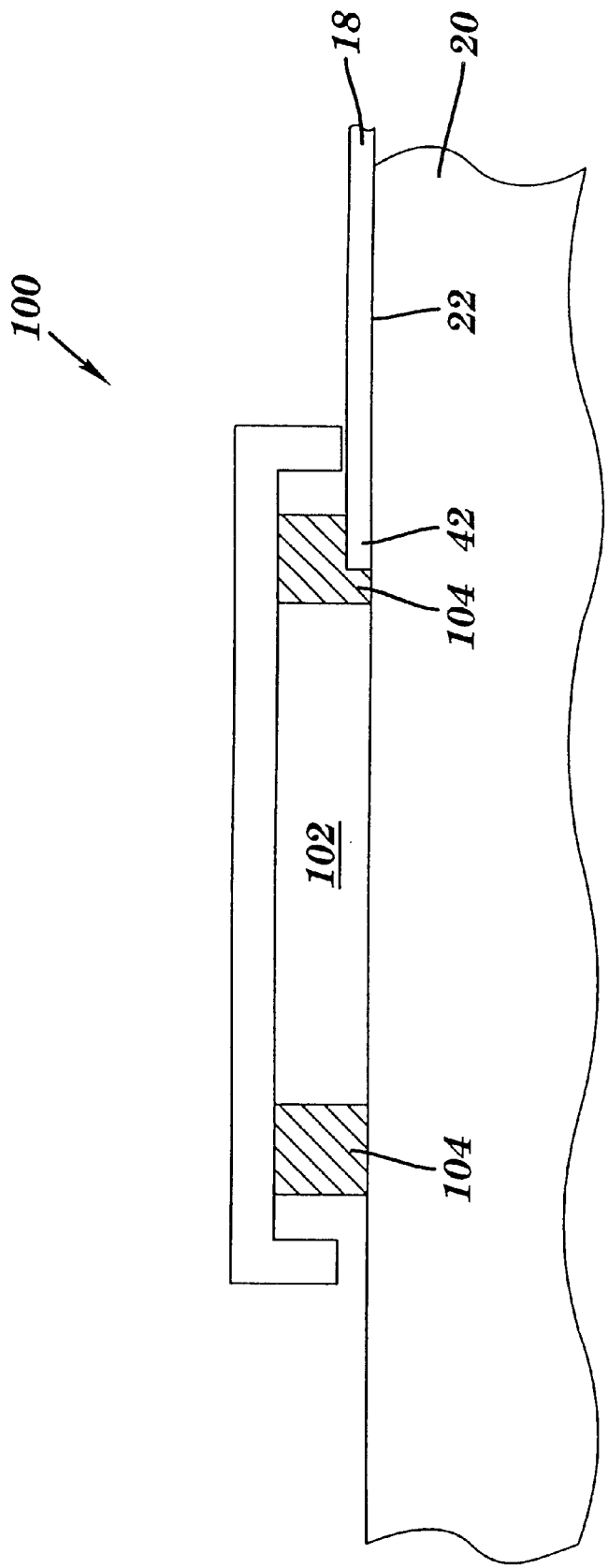
FIG. 13B is a cross-sectional view illustrating the operation of the clamping bar of FIG. 13A.
Figure 14:
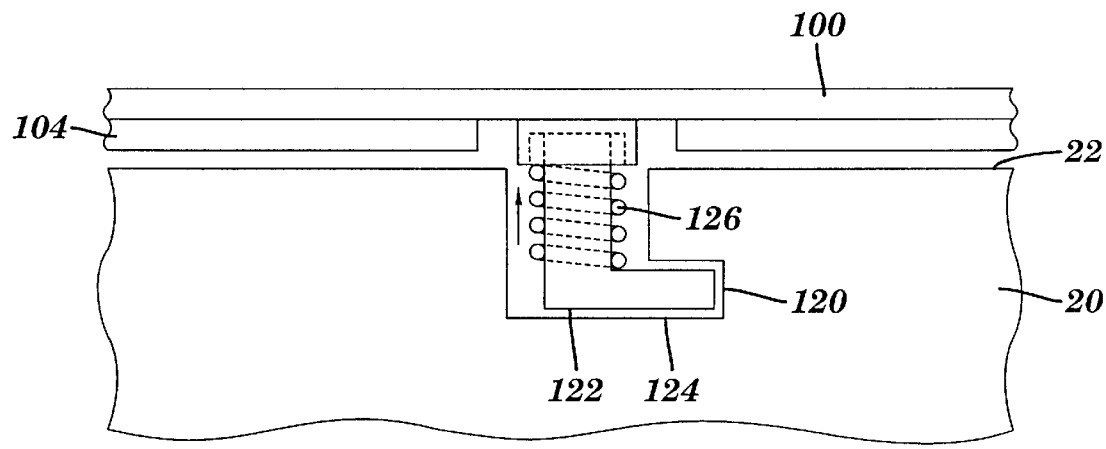
FIG. 14 is a cross-sectional view of a slidable support post and biasing system for supporting the clamping bar above the surface of the external drum.

As illustrated very generally in FIG. 7, and in greater detail in FIGS. 12–14, the trailing edge clamping mechanism 44 includes a clamping bar 100 that extends past both ends of the external drum 20. The clamping bar 100 includes a plurality of chambers 102 (FIG. 12) each formed by a continuous flexible peripheral gasket 104. A single chamber formed by a single continuous peripheral gasket extending across the external drum may also be used. A vacuum source 106 is connected to the clamping bar 100 via a rotary union (not shown) and tubing 108. A check valve 110 is provided to prevent a sudden loss of clamping force should the vacuum source 106 become disconnected or otherwise inoperative. This allows the external drum 20 to be safely brought to a stop automatically or by an operator before the vacuum clamping force is lost. The vacuum is distributed to each of the plurality of chambers 102 through one or more hollow sections 112 (FIG. 13A) of the clamping bar 100. The hollow sections 112 extend along the length of the clamping bar 100 and into each of the chambers 102, thereby acting as a manifold. A pressure relief valve 113 is located between the hollow sections 112. Alternately, the pressure relief valve 113 may be disposed at any suitable location within the pneumatic circuit of the clamping bar 100. In operation, as shown in FIG. 13B, the trailing edge 42 of the printing plate 18 extends beneath the clamping bar 100 and is forced against the media support surface 22 of the external drum 20 by the gasket 104 when a vacuum is supplied to the chamber(s) 102 by the vacuum source 106.

As further illustrated in FIG. 12, the clamping bar 100 is supported at each end by a guided support post 114 that provides the clamping bar 100 with a radial degree of translational freedom with respect to the media support surface 22 of the external drum 20. This allows the clamping bar 100 to be radially displaced away from or toward the media support surface 22 of the external drum 20 during the loading and unloading of the printing plate 18.

Each support post 114 is coupled to a disc 116 that is mounted coaxially to an end of the external drum 20 (one such disc 116 is shown in FIG. 7). Thus, one disc 116 is mounted coaxially to a first end of the external drum 20 and a second disc 116 is mounted coaxially to a second, opposing end of the external drum 20. A biasing system 118 (e.g., a compression spring), biases each end of the clamping bar 100 radially away from the media support surface 22 of the external drum 20, allowing the clamping bar 100 to be freely rotated over and around the external drum 20. In another embodiment of the present invention, the clamping bar 100 may further be supported at a plurality of locations along the external drum 20 using retainers 120 and attached to the support posts 122 that slide within undercut slots 124 formed in the external drum 20 (FIG. 14). The slots 124 extend at least partially about the circumference of the external drum 20. A biasing system 126 (e.g., a compression spring) is provided at each support post 122 to bias the clamping bar 100 radially away from the media support surface 22 of the external drum 20. The small allowable motion of the clamping bar 100 combined with the plurality of support posts 114, 122, prevent any part of the clamping bar 100 from deflecting into an area occupied by imaging optics, system electronics, media transport mechanisms, etc., even if the vacuum force is lost while the external drum 20 is rotating.

A counterweight 128 (FIGS. 7 and 12) may be attached to, or integrally formed with, each of the discs 116 to counterbalance the overall mass of the trailing edge clamping mechanism 44 with respect to the axis of the external drum 20. This helps to properly balance the external drum 20 to prevent the introduction of vibration-induced artifacts into the images recorded on the printing plate 18.

Figure 15:
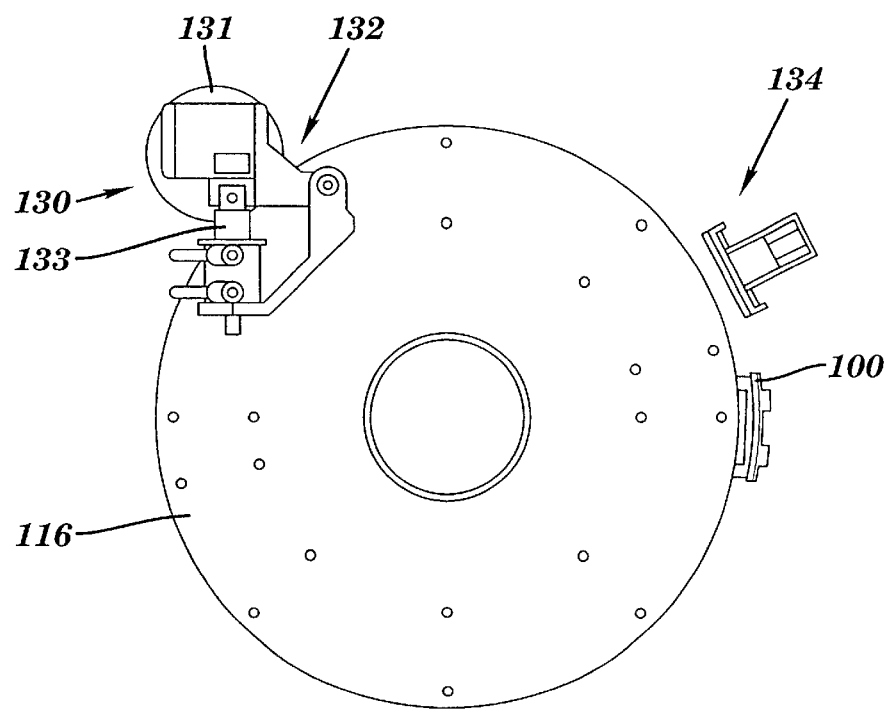
FIG. 15 illustrates a friction wheel system for rotating the discs that carry the clamping bar of the trailing edge clamping mechanism.

As illustrated in FIG. 15, a drive system 130, including, for example, a motor driven friction wheel 131, is selectively actuated into a drive position against at least one (typically both) of the discs 116 using a pneumatic actuator 132 or other actuating system (e.g., solenoid, etc.). The pneumatic actuator 132 causes a normal force between the drive system 130 and the disc 116. The discs 116 and attached clamping bar 100 may be rotated to any position around the external drum 20 by a rotation of the drive system 130. A spring 133 is provided to bias the drive system 130 away from the disc 116 to a non-drive position in the event of a failure of the pneumatic actuator 132.

The trailing edge clamping mechanism 44 further includes an actuation system 134 for selectively forcing the clamping bar 100 against the external drum 20 and over the trailing edge 42 of the printing plate 18. The actuation system 134 is used to counteract the forces of the biasing systems 118, 126, to push the clamping bar 100 against the external drum 20 creating a seal between the gaskets 104, the trailing edge 42 of the printing plate 18, and the external drum 20 (see also FIG. 13B).

As shown in FIG. 7, the actuation system 134 includes an actuator 136 (e.g., a pneumatic actuator, solenoid, etc.) and an extendible arm 138. After the clamping bar 100 is forced against the trailing edge 42 of the printing plate 18 by the actuation system 134, the air within the chambers 102 is evacuated by vacuum source 106 (see, e.g., FIG. 12), thereby holding the clamping bar 100 against the external drum 20 and the trailing edge 42 of the printing plate 18. The actuation system 134 of the trailing edge clamping mechanism 44 is mounted to a frame member (not shown) of the external drum platesetter 16 such that the actuation system 134 is positioned above the media support surface 22 of the external drum 20.

The operation and media input flow of the media handling system 70 of the external drum platesetter 16 is illustrated in FIGS. 16–21. It should be noted that although the following steps are described in a specific order, many of the steps (or sets thereof) may be performed in a different order (or omitted) without departing from the scope of the present invention.

Figure 16:
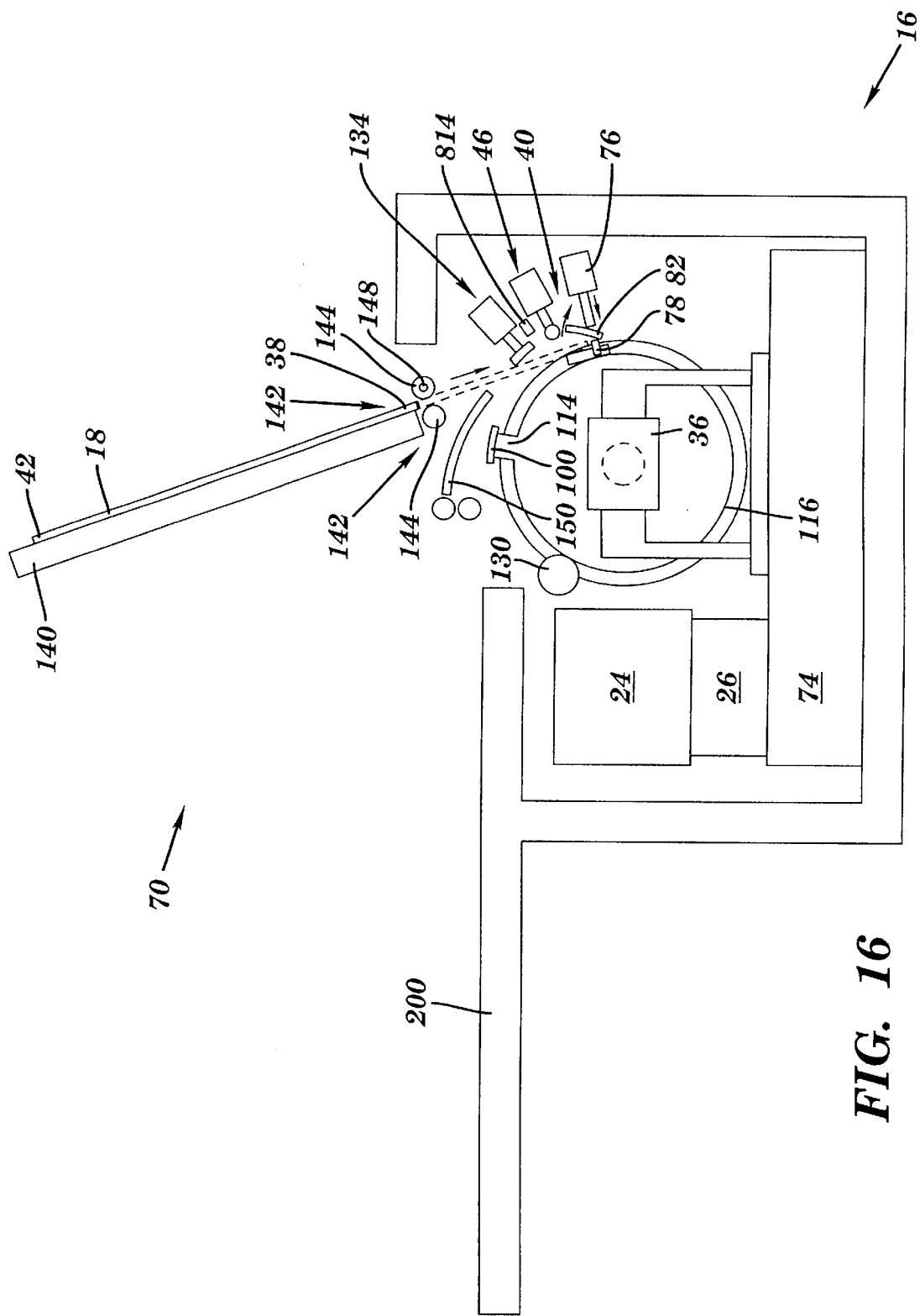
FIGS. 16–21 illustrate the operation and media input flow of the media handling system of the external drum platesetter of FIG. 7.

In FIG. 16, a single printing plate 18 is positioned, or "staged," on an input tray 140 above a pair of input nip roller assemblies 142, wherein each input nip roller assembly 142 includes at least one resilient input nip roller 144. The input tray 140 is positioned adjacent a front area of the external drum platesetter 16 such that the printing plate 18 is loaded on the input tray 140 from a front of the external drum platesetter 16. At least a portion of the input tray 140 is positioned directly over the external drum 20. In FIG. 7, for example, the input tray 140 is positioned directly over, and completely within a space defined by the diameter D of (see FIG. 7), the external drum 20. By positioning the input tray 140 in this manner, the overall floor space (i.e., "footprint") of the external drum platesetter 16 is reduced.

The leading edge 38 of the printing plate 18 is positioned by the input tray 140 to rest substantially between the input nip roller assemblies 142. The input nip roller assemblies 142 are positioned above the external drum 20 and are oriented such that the common tangent of the rollers 144 is tangent to the media support surface 22 of the external drum 20. The input tray 140 is oriented such that the loading path of the printing plate 18 supported thereon extends along a line that is tangent to the external drum 20 at the leading edge clamping mechanism 40.

A curved input/output guide platen 150, mounted to a frame member (not shown) of the external drum platesetter 16 may be provided to direct the leading edge 38 of the printing plate 18 toward the leading edge clamping mechanism 40 during the loading of the printing plate 18 onto the external drum 20. In addition, the curved input/output guide platen 150 is configured to direct the printing plate 18 off of the external drum 20 toward a plate output area, such as an output tray 200, after imaging is complete. Depending upon the specific arrangement of the various components of the external drum platesetter 16, the input/output guide platen 150 may be fixed in position relative to the external drum 20, or may be selectively displaced between a plate loading and unloading location by a drive system (not shown). Other guide means may be used in lieu of, or in conjunction with, the input/output guide platen 150, to guide the printing plate 18 onto and off of the external drum 20 during the loading and unloading of the printing plate 18.

Prior to loading the printing plate 18 on the external drum 20, several steps are performed. First, the external drum 20 is rotated, if necessary, by the drive system 36, until the leading edge clamping mechanism 40 is in position to receive the leading edge 38 of the printing plate 18. The clamping portion 82 of the leading edge mounting mechanism 40 is held in an open position by the actuator 76, thereby exposing the registration pins 78 (see, e.g., FIG. 8). The trailing edge clamping mechanism 44 is rotated by the drive system 130, if necessary, to position the clamping bar 100 out of the way of the loading path of the printing plate 18. The actuation system 134 for the trailing edge clamping mechanism 44, and the ironing roller system 46, are also retracted away from the media support surface 22 of the external drum 20, if necessary, out of the way of the loading path of the printing plate 18.

The input nip rollers 144 of one of the input nip roller assemblies 142 are mounted on a rotatable transport drive shaft 148. A drive system (not shown) is provided to selectively rotate the transport drive shaft 148 and the input nip rollers 144 mounted thereon to propel the leading edge 38 of the printing plate 18 toward and into the leading edge clamping mechanism 40, until the leading edge 38 of the printing plate 18 comes to rest against two of the registration pins 78 (shown in phantom in FIG. 16). The input nip roller assemblies 142 are configured to automatically deskew the printing plate 18, if necessary, to ensure that two of the registration pins 78 are contacted by the leading edge 38 of the printing plate 18.

Figure 17:
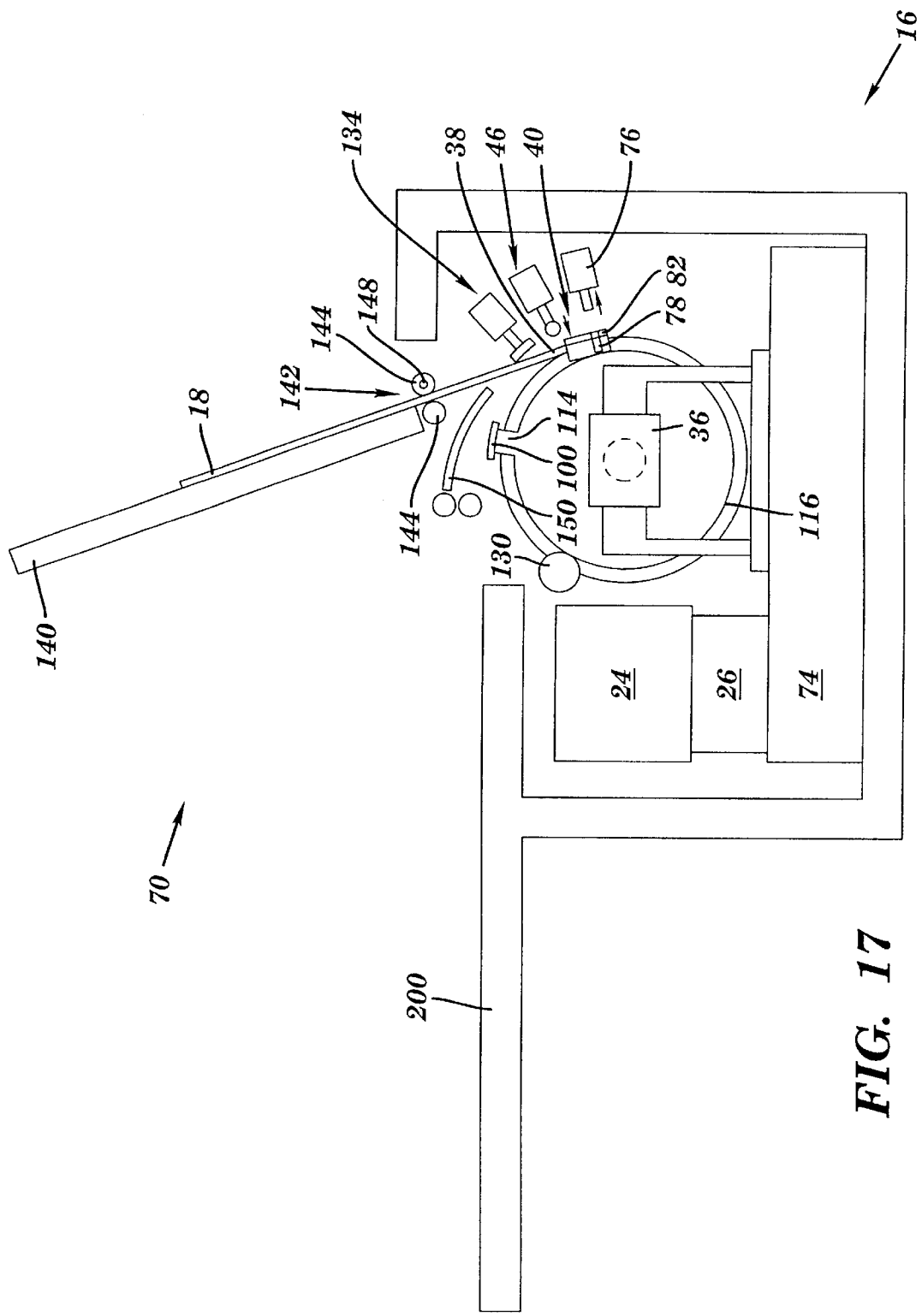

As shown in FIG. 17, after the leading edge 38 of the printing plate 18 is properly positioned against two of the registration pins 78, the leading edge clamping mechanism 40 is closed, thereby pinching the printing plate 18 against the external drum 20 while the leading edge 38 of the printing plate 18 remains in contact with the registration pins 78. In particular, as previously described in detail in reference to FIG. 9, as the actuator 76 retracts the member 86 away from the clamping portion 82 of the leading edge mounting mechanism 40, the biasing system 84 biases the clamping portion 82 closed against the external drum 20. This traps the leading edge 38 of the printing plate 18 in a registered position between the clamping and mounting portions 80, 82, of the leading edge clamping mechanism 40.

Figure 18:
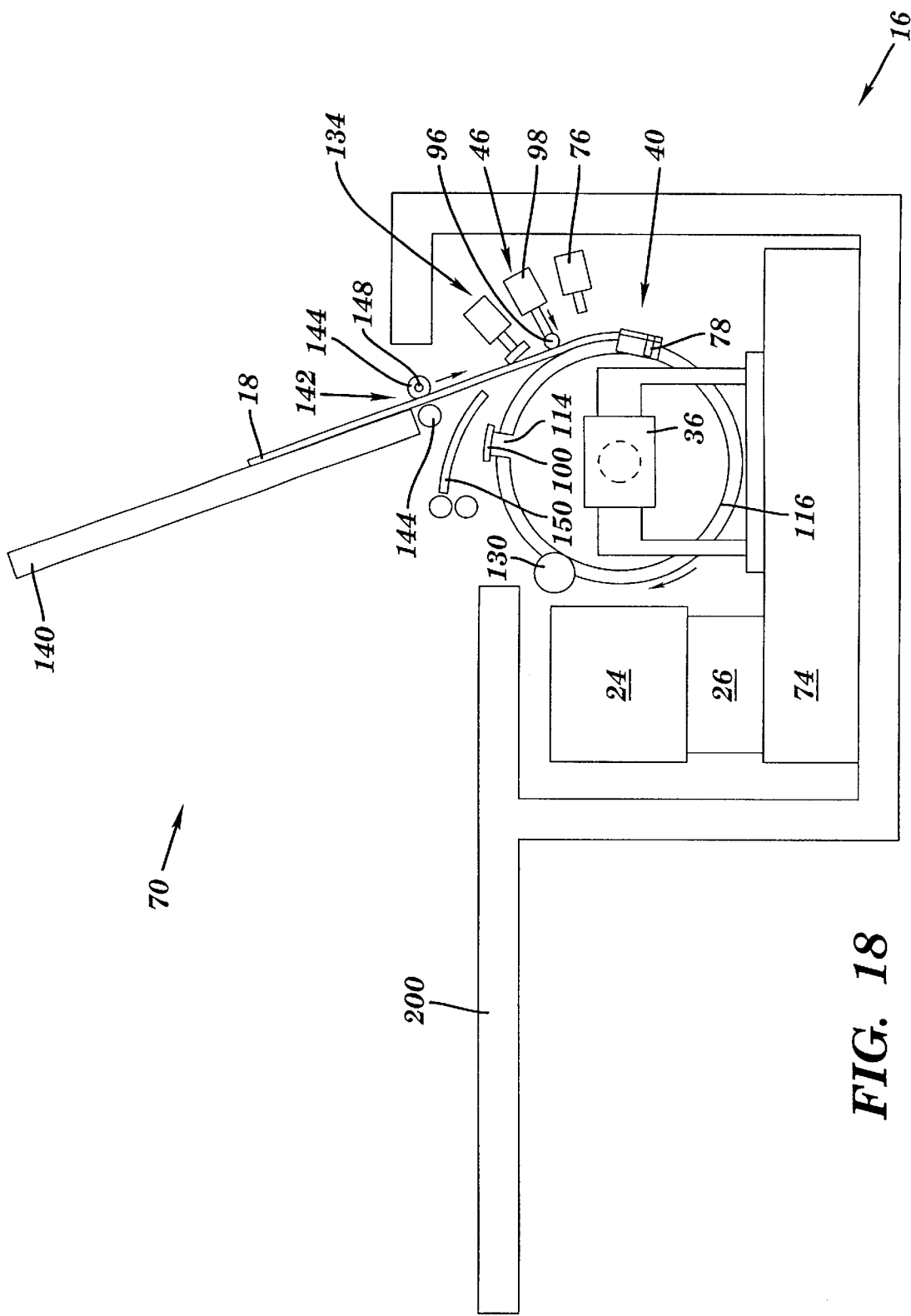
Figure 19:
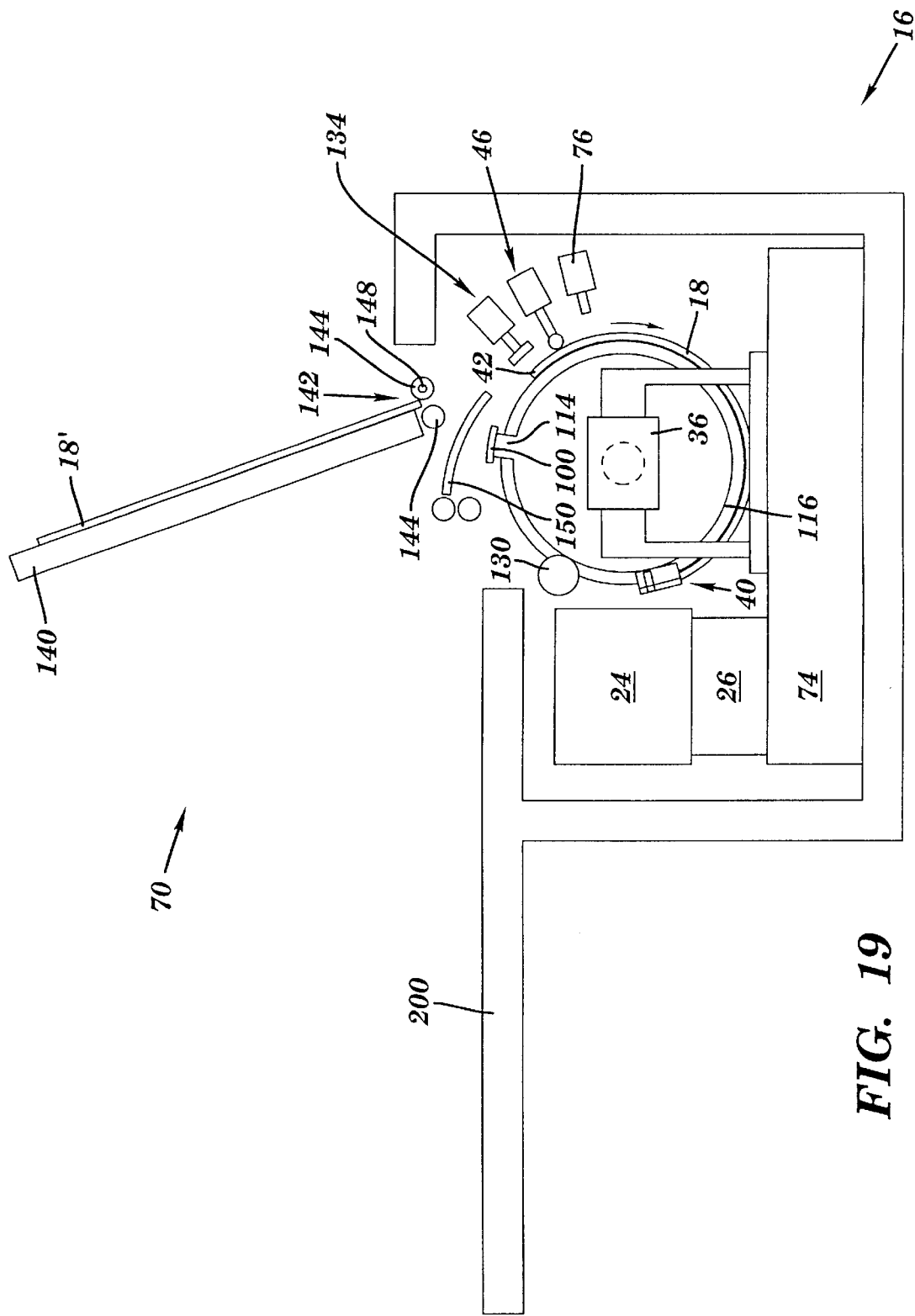

As illustrated in FIG. 18, after the leading edge clamping operation, the external drum 20 is rotated a few degrees by the drive system 36. Next, the ironing roller assembly 96 of the stationary ironing roller system 46 is extended and positioned against the printing plate 18 by the actuating system 98. The force applied by the ironing roller assembly 96 keeps the printing plate 18 in contact against the media support surface 22 of the external drum 20. The external drum 20 continues to rotate, while the printing plate 18 is forced against the external drum 20 by the ironing roller assembly 96, thereby further drawing the printing plate 18 from the input tray 140 and wrapping the printing plate 18 around the media support surface 22 of the external drum 20, until the trailing edge 42 of the printing plate 18 is positioned adjacent the actuation system 134 of the trailing edge clamping mechanism 44. This configuration is shown in FIG. 19. As the external drum 20 is rotated, the discs 116, and the trailing edge clamping mechanism 44 and clamping bar 100 mounted thereon, remain stationary.

The transport drive shaft 148 is deactivated after the trailing edge 42 of the printing plate 18 passes completely through the input nip roller assemblies 142. At this point in the media input/output flow, as shown in FIG. 19, an operator may place another printing plate 18' in a staged position on the input tray 140 above the pair of resilient input nip roller assemblies 142. In accordance with the present invention, the printing plate 18' may be positioned on the input tray 140 even as the pre-imaging loading and clamping steps described below for the printing plate 18 are being performed. This increases the throughput of the external drum platesetter 16, when compared to existing external drum imaging systems, since an operator no longer has to wait to load the next printing plate 18' to be imaged until the previous printing plate 18 has been completely loaded, imaged and removed from a single, common input/output location.

Figure 20:
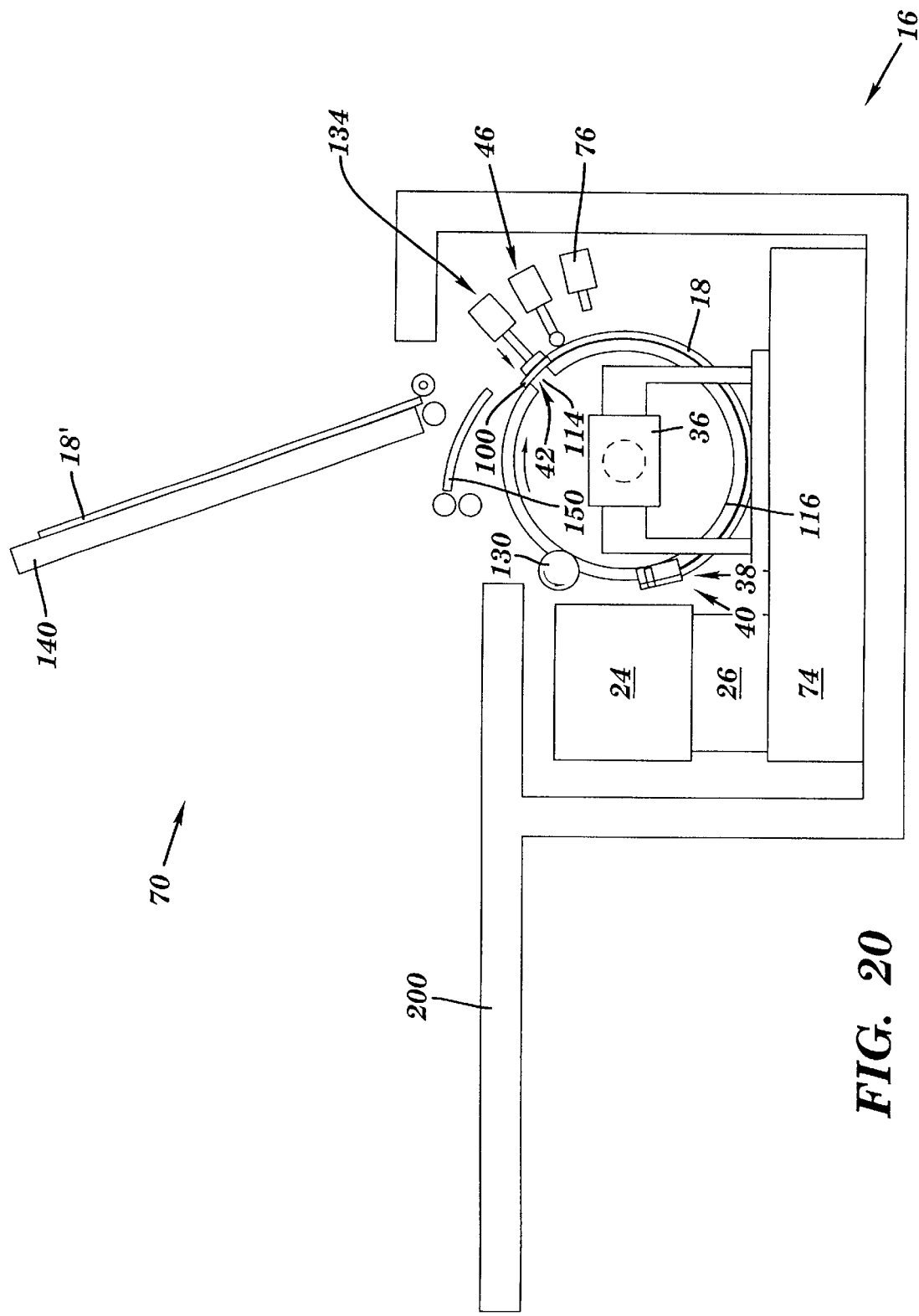

When the trailing edge 42 of the printing plate 18 is positioned adjacent the actuation system 134 of the trailing edge clamping mechanism 44, the discs 116 are rotated by the drive system 130 to position the clamping bar 100 over the trailing edge 42 of the printing plate 18. This configuration is illustrated in FIG. 20. The location of the trailing edge 42 of the printing plate 18 is determined based on the dimensions of the printing plate 18, which are typically input into a control system of the external drum imagesetter 16 via an operator control terminal (OCT) (not shown), the workstation 12 (FIG. 1), or other input system. Alternately, or in addition, a plate edge sensing system (not shown) may be used to automatically detect the trailing edge 42 of the printing plate 18.

Figure 21:
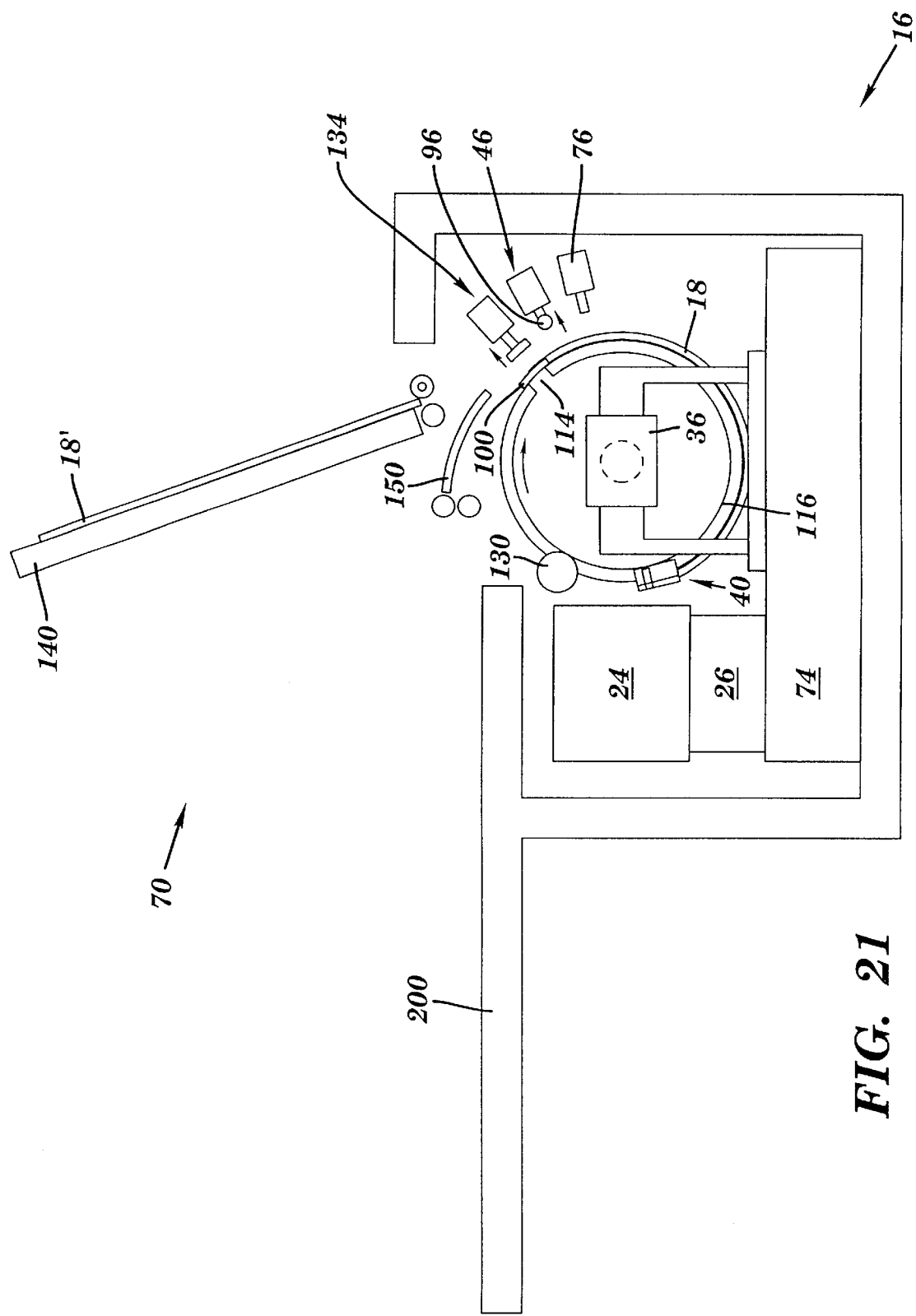

The clamping bar 100, which is normally biased away from the external drum 20, is then forced against the external drum 20 by the actuation system 134. A vacuum is subsequently introduced in each of the plurality of chambers 102 underneath the clamping bar 100 by the vacuum source 106 (FIG. 12), causing the clamping bar 100 to be firmly attached to the external drum 20 and over the trailing edge 42 of the printing plate 18. Next, as illustrated in FIG. 21, the actuation system 134 of the trailing edge clamping mechanism 44 and the ironing roller assembly 96 of the stationary ironing roller system 46 are retracted away from the external drum 20. The drive system 130 is also retracted away from the discs 116. The printing plate 18 is now held in place for subsequent imaging by the leading and trailing edge clamping mechanisms 40, 44. A vacuum may then be introduced between the printing plate 18 and the external drum 20 (e.g., in vacuum grooves 47 (FIG. 2)) by vacuum source 45 (FIG. 1) to hold the body of the printing plate 18 firmly against the external drum 20. Alternately, the vacuum may be applied during the loading of the printing plate 18 to reduce the time required to evacuate the air between the printing plate 18 and the external drum 20. The printing plate 18 is now fully applied to the external drum 20 and ready for side edge registration and subsequent imaging by the scanning system 24.

The external drum 20 is then rotated up to speed. The scanning system 24 is linearly advanced by the movable carriage 26 to record an image onto the printing plate 18. After imaging, the scanning system 24 is "parked" in a home position (e.g., adjacent an end of the external drum 20), and the external drum 20 is braked to a stop.

The operation and media output flow of the media handling system 70 of the external drum platesetter 16 is illustrated in FIGS. 22–25. Again, it should be noted that although the following steps are described in a specific order, many of the steps (or sets thereof) may be performed in a different order (or omitted) without departing from the scope of the present invention.

Figure 22:
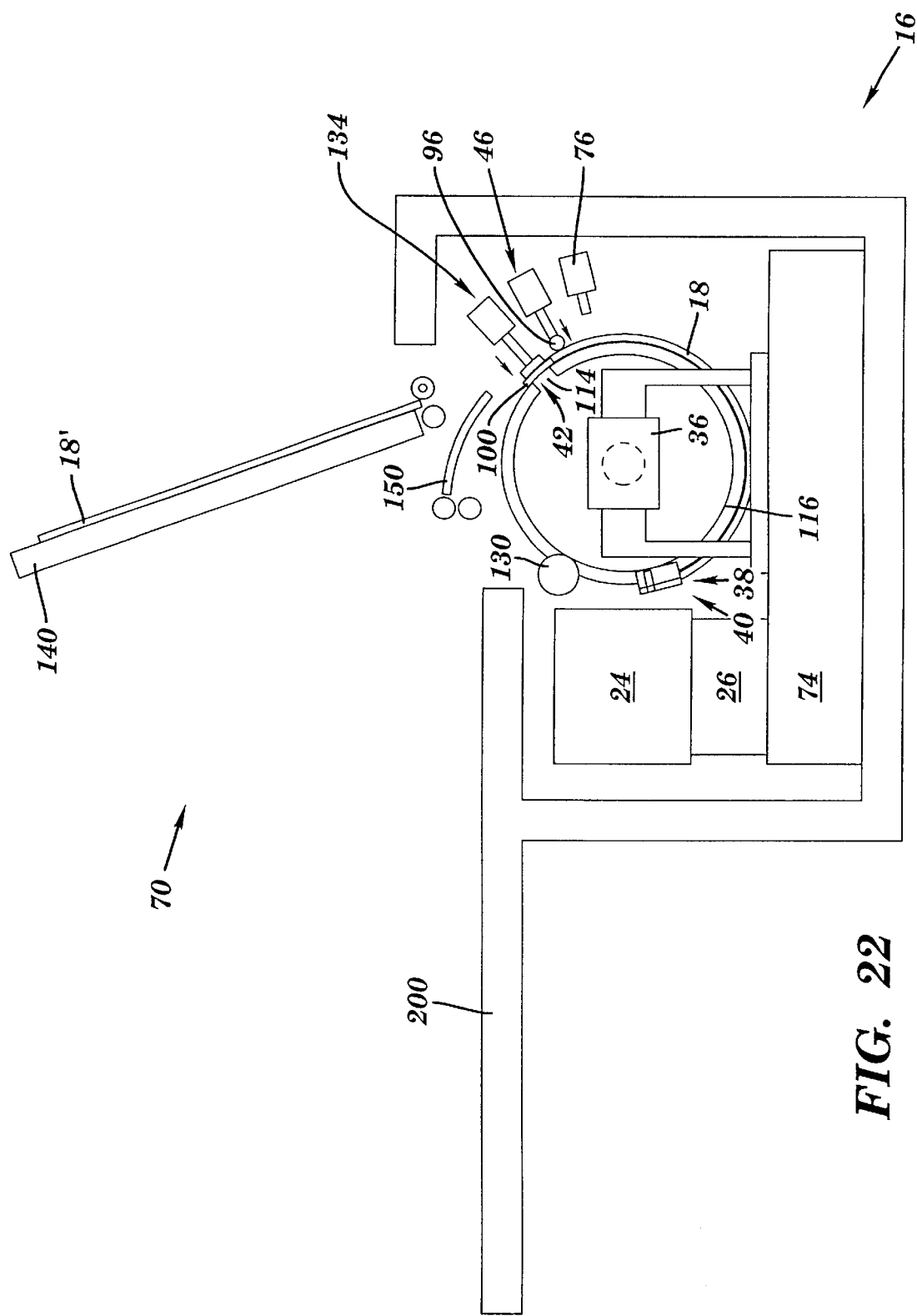
FIGS. 22–25 illustrate the operation and media output flow of the media handling system of the external drum platesetter of FIG. 7.

As illustrated in FIG. 22, upon completion of imaging, the external drum 20 is brought to a stop with the clamping bar 100 positioned beneath the retracted actuation system 134. The ironing roller assembly 96 is lowered onto the printing plate 18 to prevent the printing plate 18 from releasing or dropping off the external drum 20 upon the subsequent release of clamping bar 100. Next, the vacuum applied to the clamping bar 100 and the external drum 20 is turned off. Residual vacuum is released from under the clamping bar 100 by an actuator (not shown) that selectively actuates the pressure relief valve 113 located between the hollow section 112 of the clamping bar 100. The actuator of the pressure relief valve 113 may be disposed on the actuation system 134 of the trailing edge clamping mechanism 44, or may be formed separately therefrom.

Figure 23:
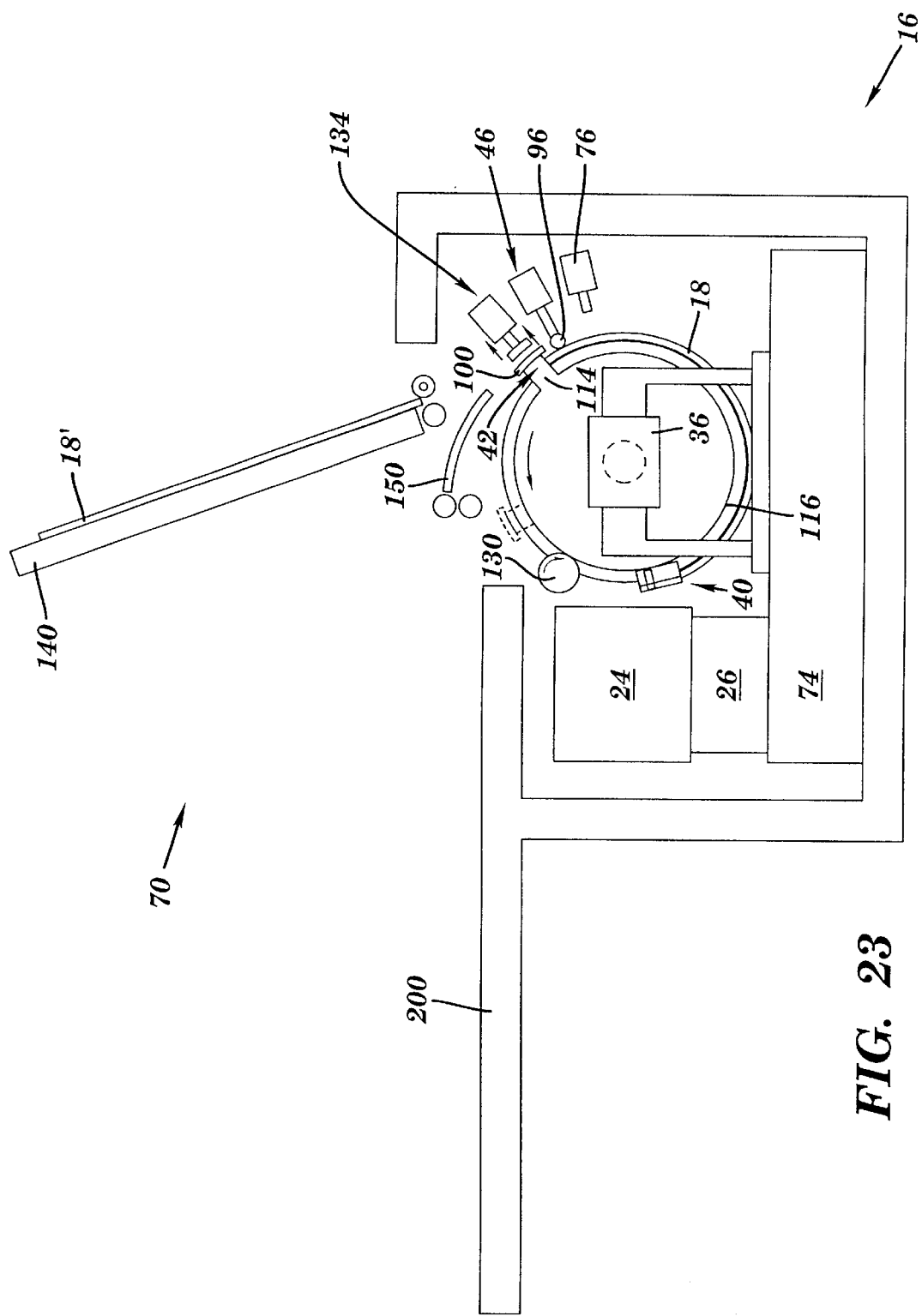
Figure 24:
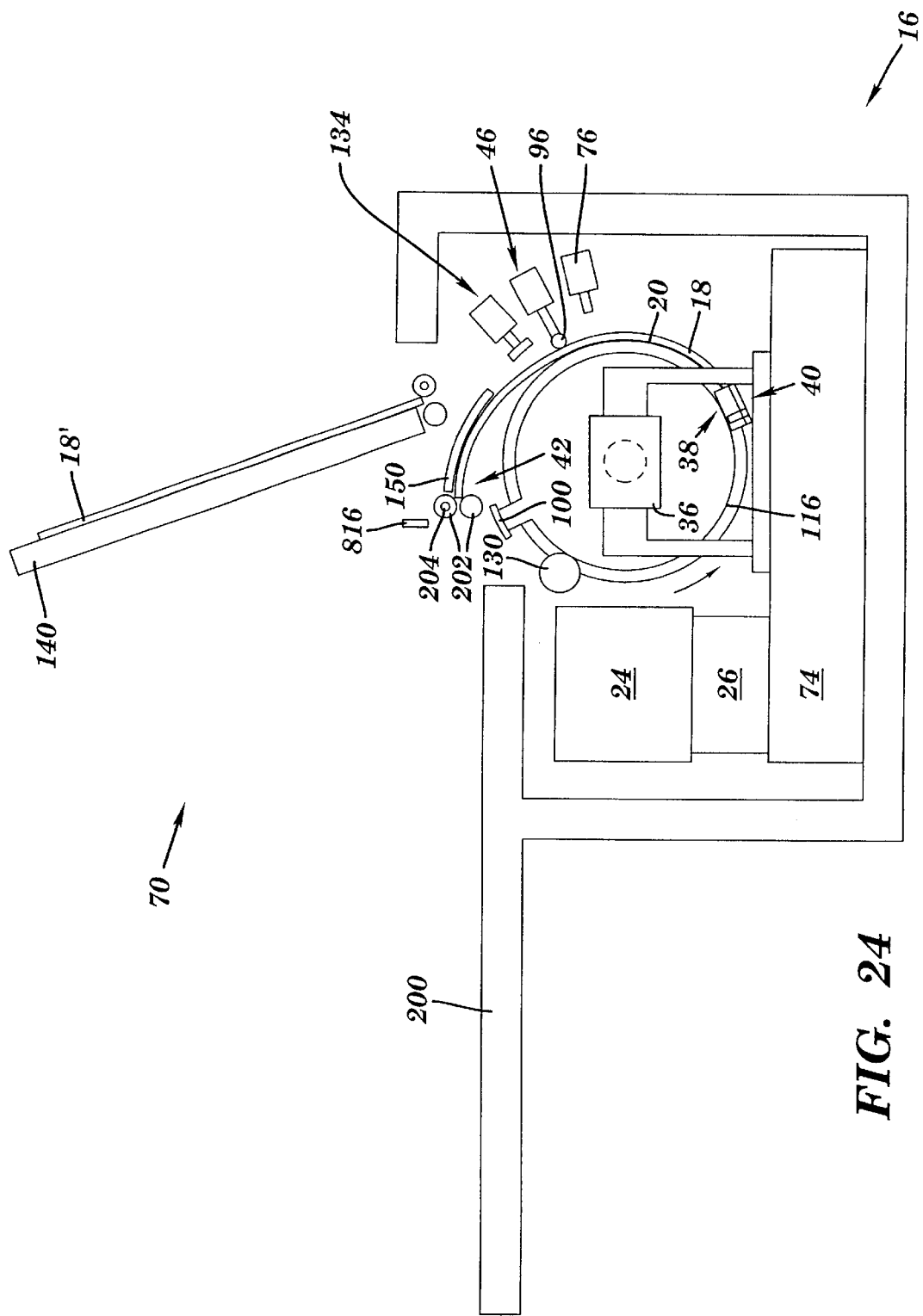

As shown in FIG. 23, when the biasing force applied by the biasing system 118 (FIG. 12) exceeds the vacuum force holding the clamping bar 100 against the external drum 20, the clamping bar 100 is displaced radially away from the external drum 20. At this point, the actuation system 134 of the trailing edge clamping mechanism 44 is retracted, and the clamping bar 100 is rotated away (shown in phantom in FIG. 23) from the output path of the printing plate 18 in response to a rotation of the discs 116 by the drive system 130 (FIG. 15). With the printing plate 18 still held against the external drum 20 by the ironing roller assembly 96, and the leading edge 38 of the printing plate 18 still clamped within the leading edge clamping mechanism 40, the external drum 20 is rotated in an opposite direction (the input/output guide platen 150 may also be displaced), to advance the trailing edge 42 of the printing plate 18 toward an output area such as output tray 200. The trailing edge 42 of the printing plate 18 is guided by the input/output guide platen 150 between a pair of output nip roller assemblies 202 (FIG. 24) each including at least one resilient nip roller. The support shafts of the output nip roller assemblies 202 are mounted to a frame member (not shown) of the external drum platesetter 16. At least one of the output nip roller assemblies 202 is mounted on a rotatable drive shaft 204. The driven output nip rollers force the printing plate 18 between the output nip roller assemblies 202 toward the output tray 200. The printing plate 18 is also forced toward the output tray 200 by the rotation of the external drum 20.

Figure 25:
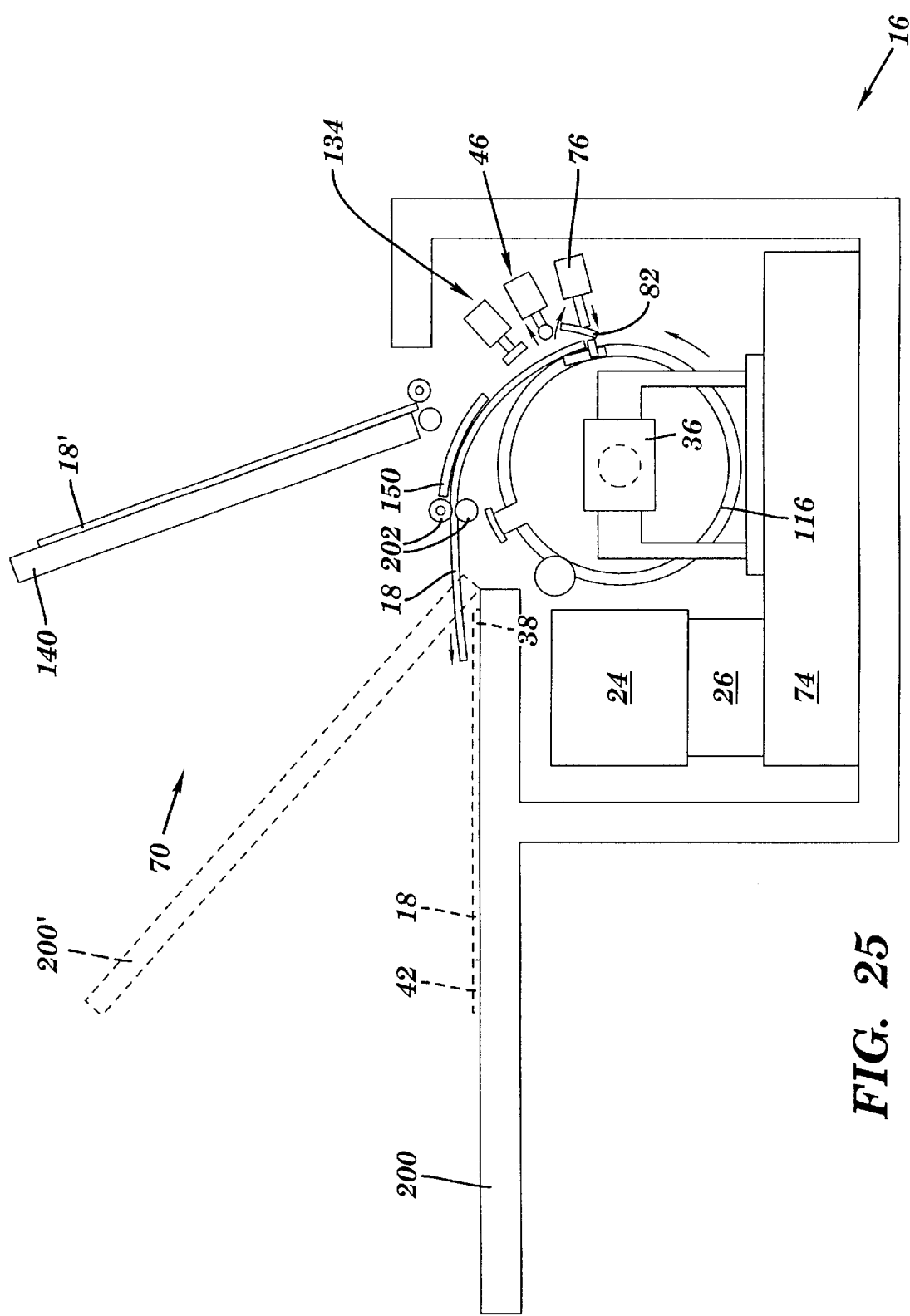

The rotation of the external drum 20 and the output nip roller assemblies 202 is temporarily halted when the leading edge clamping mechanism 40 is located adjacent the ironing roller assembly 96. The ironing roller assembly 96 is then retracted, and the external drum is further rotated, if necessary, until the leading edge clamping mechanism 40 is located at its home position (i.e., under the actuator 76). The clamping portion 82 of the leading edge clamping mechanism 40 is then opened by the actuator 76, as shown in FIG. 25, thereby completely freeing the printing plate 18 from the external drum 20. The output nip roller assemblies 202 are subsequently rotated until the printing plate 18 is expelled onto the output tray 200, trailing edge 42 first (shown in phantom in FIG. 25). The actuator 76 of the leading edge clamping mechanism 40 is then retracted. As soon as the printing plate 18 is out of the loading path, the next printing plate 18', previously staged on the input tray 140, may be loaded onto the external drum 20 for imaging.

Figure 6:
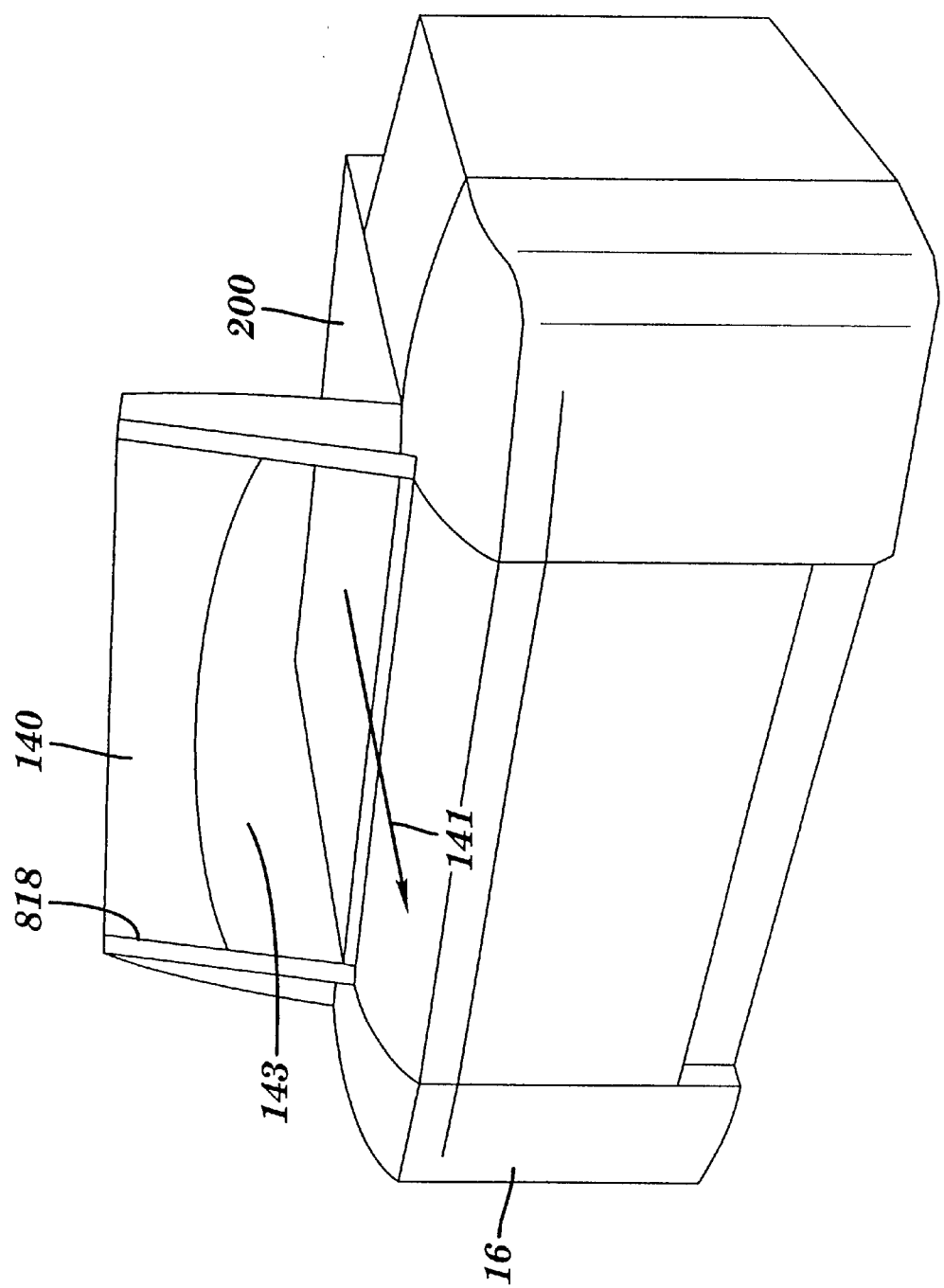
FIG. 6 illustrates an external drum platesetter of the present invention.

The output tray 200 is located at the rear of the external drum platesetter 16. Thus, a printing plate 18 is loaded onto the input tray 140 at the front of the external drum platesetter 16, while an imaged printing plate 18 is removed from the output tray 200 from a rear area (i.e., behind the input tray 140) of the external drum platesetter 16. As shown in FIG. 25, the input tray 140 is formed separately from the output tray 200. In particular, the input tray 140 is positioned in front of (looking from right to left in FIG. 25 (i.e., from the front to the rear of the external drum platesetter 16)). In addition, at least a portion of the input tray 140 is located above the output tray 200. Further, at least a portion of the input tray 140 may extend over the output tray 200 toward the rear of the external drum platesetter 16. In FIG. 25, for example, the input tray 140 is positioned such that it is completely above the level of the output tray 200. As shown in FIG. 6, however, a portion of the input tray 140 may extend to, or below, the level of the output tray 200. By positioning the input tray 140 in this manner relative to the output tray 200 the overall footprint of the external drum platesetter 16 is reduced further.

The output tray 200 is illustrated in FIG. 25 as having a horizontal orientation (i.e., substantially parallel to a floor surface on which the external drum platesetter 16 is supported). The output tray 200, however, may also be angled relative to the floor such that the printing plate 18 is directed upward along the output tray 200 during the unloading process. This configuration of such an output tray 200' is shown in phantom in FIG. 25. This further reduces the overall footprint of the external drum platesetter 16.

The relative positions and/or orientations of the input tray 140 and output tray 200 also may apply to the input tray 440 and output tray 510 of the external drum platesetter 300 described infra with regard to FIGS. 27–44.

The imaged printing plate 18 may be manually removed by an operator from the output tray 200 from the sides or rear of the output tray 200. Alternately, the output tray 200 may include a conveying apparatus to automatically unload the imaged printing plate 18 from the sides or rear of the output tray 200 into, for example, a plate storage area, or an online processor. As shown in FIG. 6, the imaged printing plate 18 may also be removed from the output tray 200 from the front of the external drum platesetter 16 (directional arrow 141) through an opening 143 formed in the input tray 140. Removal of the printing plate 18 through the opening 143 may be more convenient, for example, if the external drum platesetter 16 is positioned in a corner of a room, or if the rear of the external drum platesetter 16 is positioned against a wall.

In the external drum platesetter 16 of the present invention, throughput is increased since a operator may load a printing plate 18' on the input tray 140 while a previously loaded printing plate 18 is being loaded on the external drum 20 (see, e.g., FIG. 19), while the printing plate 18 is being imaged (see, FIG. 21), and/or while the imaged printing plate 18 is being unloaded onto the output tray 200 (see, e.g., FIG. 25). Indeed, the printing plate 18' may be loaded on the input tray 140 as soon as, or anytime after, the trailing edge 42 of the printing plate 18 has passed through the input nip roller assemblies 142. Further, the actuating systems 75, 46, and 134, of the leading edge clamping mechanism 40, the ironing roller assembly 96, and the trailing edge clamping mechanism 44, respectively, are each located in the same position relative to the external drum 20 during the loading, imaging, and unloading of the printing plate 18; no additional displacements are required, thereby reducing the cost and complexity of the actuating systems. Also, the clamping bar 100 and the leading edge clamping mechanism 40 never leave the vicinity of the external drum 20, and therefore cannot be lost.

Figure 48:
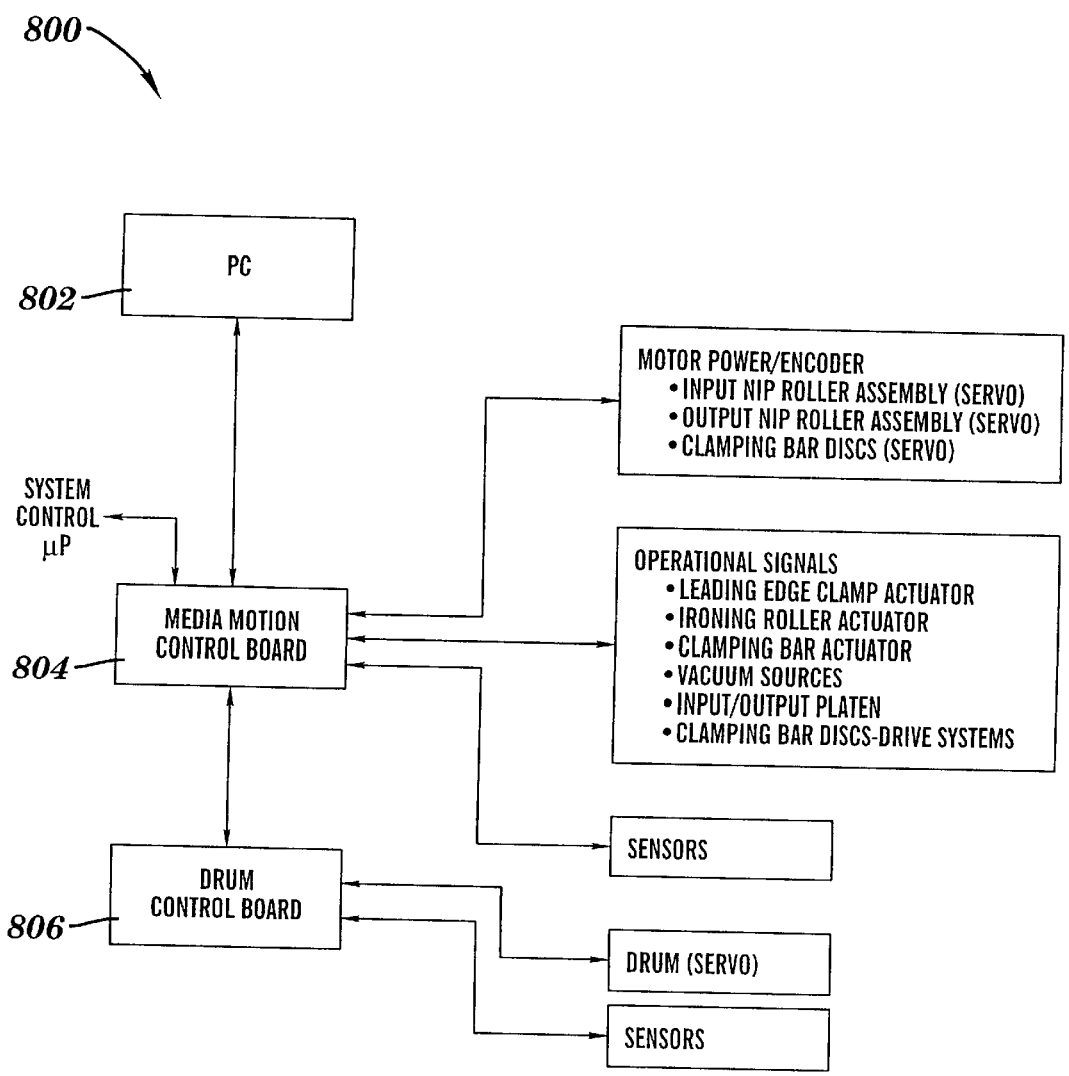
FIG. 48 illustrates a control system for controlling the media input/output operation.

A control system 800 for controlling the media input/output operation of the external drum platesetter 16 is illustrated in block form in FIG. 48. Although not described, a similar control system is utilized to control the media input/output operation of the (VLF) external drum platesetter 300.

As illustrated in FIG. 48, the control system 800 generally comprises a computer or workstation 802 used for system diagnostics, and a media motion control board 804, comprising, for example, a stand-alone PC board or similar system, for controlling all media input/output tasks (media motion) except for the motion (i.e., rotation) of the external drum 20. A separate drum motion control board 806, again comprising, for example, a stand-alone PC board, is provided to control the motion of the external drum 20. Alternately, a single PC board may be used to control all media input/output tasks including the motion of the external drum 20. In the following description of the control system 800, the term "servo" is defined as the combination of a drive motor, an encoder (e.g., position or velocity), and a feedback (e.g., position or velocity) control loop.

The media motion control board 804 sends and/or receives control information to/from the servos associated with the drive systems of the input nip roller assemblies 142, the output nip roller assemblies 202, and the discs 116 for selectively positioning the clamping bar 100 about the external drum 20. The media motion control board 804 also sends and/or receives power, control, actuation, and/or other operational signals to/from various components of the external drum platesetter 16, including, for example, the actuator 76 of the leading edge clamping mechanism 40, the actuating system 98 of the ironing roller system 46, the actuation system 134 of the trailing edge clamping mechanism 44, the vacuum sources 45 and 106 (i.e., the drum and clamping bar vacuum sources), the drive system (if present) of the input/output guide platen 150, the drive systems 130 of the discs 116, etc. The media motion control board 804 also receives information from various sensors (described infra) that are used, for example, to relate the position of the printing plate 18 within, and relative to various components of, the external drum platesetter 16.

The drum motion control board 806 sends and/or receives information (e.g., control, power, position, velocity, etc.) to/from the servo(s) associated with the drive system 36 of the external drum 20. The drum motion control board 806 also receives information from various sensors (described infra) that is used, for example, to control the rotation of the external drum 20 during media input/output and imaging.

The present invention employs several sensors to track the location of the printing plate 18 within the input/output path of the external drum platesetter 16. (Similar sensors may also be used where appropriate in external drum platesetter 300.) For example, a pair of sensors 810, 812 (see FIG. 49) are suitably located adjacent the input nip roller assemblies 142 to detect the presence (or absence) of a printing plate 18 loaded in the input tray 140. A sensor 814 (see FIG. 16) is also used to indicate when the clamping bar 100 of the trailing edge clamping mechanism 44 is positioned under the actuation system 134 of the trailing edge clamping mechanism 44. There is also a sensor 816 to detect when the trailing edge 42 of the printing plate 18 has passed through the output nip roller assemblies 202 (see FIG. 24) during the unloading of the imaged printing plate 18. Each of the sensors 810, 812, 814, and 816, may be an optical, electrical, or mechanical switch or other device capable of detecting the presence of the printing plate 18.

Figure 49:
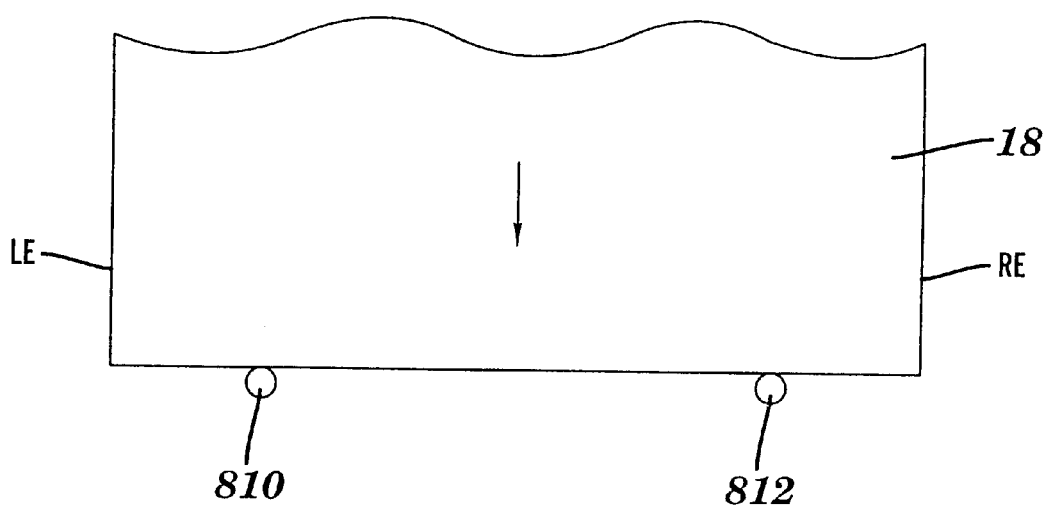
FIGS. 49 and 50 illustrate the operation of the edge sensors.

The operation of the sensors 810, 812, is illustrated in FIG. 49. In particular, sensor 810 provides an indication that the left edge (LE) of the printing plate 18 is at least to the left of the sensor 810 to ensure that the printing plate 18 is located in a proper zone for imaging. Indicia, and/or a mechanical stop 818 (see FIG. 6) may be provided on the input tray 140 to assist the operator in loading the printing plate 18 on the input tray 140 such that the left edge LE will be located to the left of the sensor 810. If the sensor 810 does not sense the printing plate 18, while the sensor 812 located to the right of sensor 810 does, an error message will result and the input and subsequent imaging of the improperly positioned printing plate 18 will not occur.

The sensors 810, 812, may also be used in cooperation with the servo (encoder) associated with the driven input nip roller assembly 142, and/or the servo (encoder) associated with the drive system 36 of the external drum 20, to measure the plate wrap dimension (i.e., the distance between the leading edge 38 and trailing edge 42) of the printing plate 18. For example, the plate wrap dimension may be determined by measuring the rotational travel of either or both of the driven input nip roller assembly 142 and/or external drum 20 between the detection of the leading edge 38 of the printing plate 18 and the detection of the trailing edge 42 of the printing plate 18 by the sensors 810, 812. The sensor based determination of the plate wrap dimension serves as a double-check of the plate wrap dimension input value provided by an operator of the external drum platesetter 16. An error message will result, for example, if the plate wrap dimension value provided by the operator does not match the plate wrap dimension detected by the sensors. This may occur, for example, if the wrong size printing plate is inadvertently loaded into the input tray 140. The value of the plate wrap dimension is used to advance the trailing edge 42 of the printing plate 18 adjacent the actuation system 134 of the trailing edge clamping mechanism 44.

Figure 50:
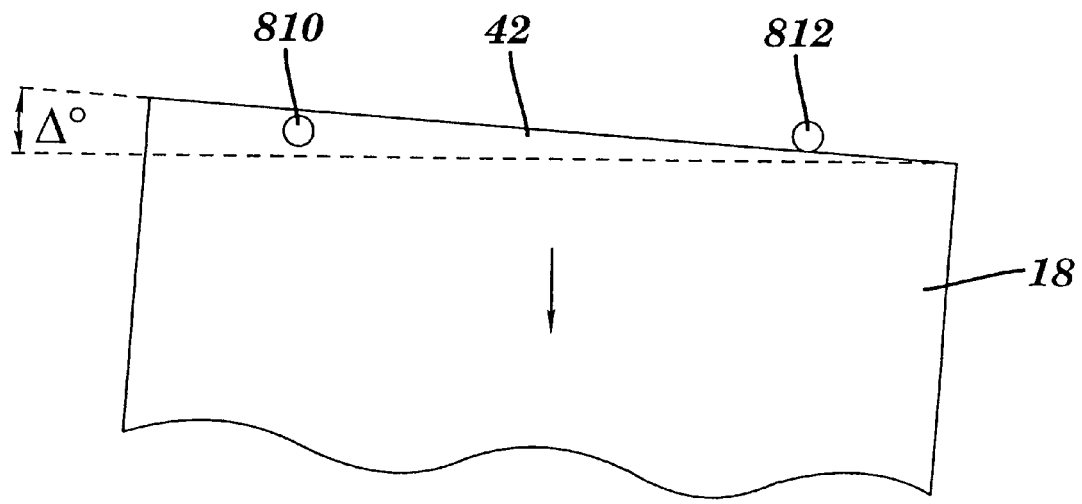

The sensors 810, 812, may be used for other purposes. For example, as illustrated in FIG. 50, the sensors 810, 812, may be used to determine the degree of skew ( )E) of the printing plate 18 as it passes through the input nip roller assemblies 142. In particular, skew may be determined by detecting the time between the detection of different portions of the trailing edge 38 of the printing plate 18 by the sensors 810, 812. Since the size of the printing plate 18 and the velocity of the printing plate 18 through the input nip roller assembly 142 are known, the skew can be easily calculated. Once determined, the skew can be compensated for by the scanning system 24 in a known manner. Alternately, if the skew exceeds a predetermined amount, an error message will be generated, and the loading process will be terminated.

Once the printing plate 18 is mounted on the external drum 20, the scanning system 24 can be advanced across the printing plate 18 to detect the left edge and right edge of the printing plate 18, thereby locating the printing plate 18 on the external drum 20 for subsequent imaging, and determining the longitudinal dimension of the printing plate 18 across the external drum 20. The longitudinal dimension of the printing plate 18 serves as a double-check of the plate width input value provided by an operator of the external drum platesetter 16. Also, given the position of the left edge of the printing plate 18, image data may be recorded at a predetermined distance from the left edge of the printing plate 18 using the servo/encoder of the movable carriage 26. The same is also true for placing the image data with respect to the leading edge 38 of the printing plate 18. Specifically, the servo of the drive system 36 of the external drum 20 can be used to position the edge of the image data at a predetermined distance from the leading edge 38 (from the registration pins 78) of the printing plate 18.

Figure 26A:
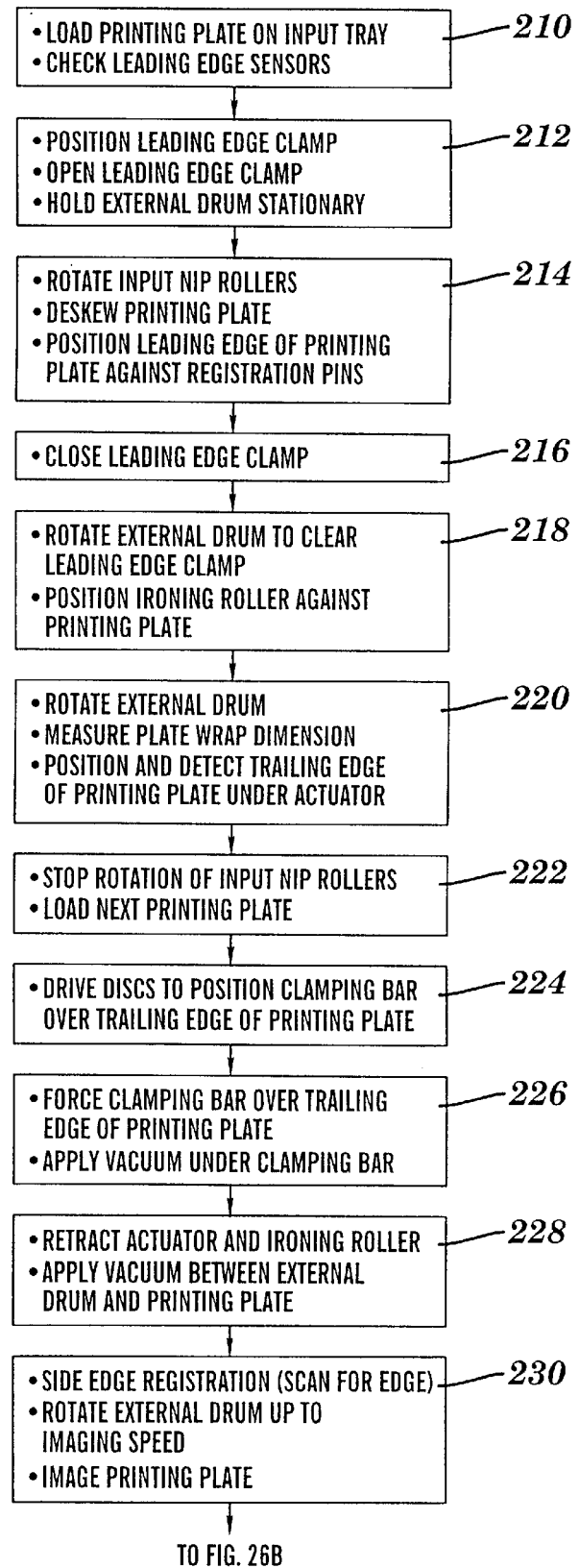
FIGS. 26A and 26B illustrate the general input/output flow of the external drum platesetter of FIG. 7.
Figure 26B:
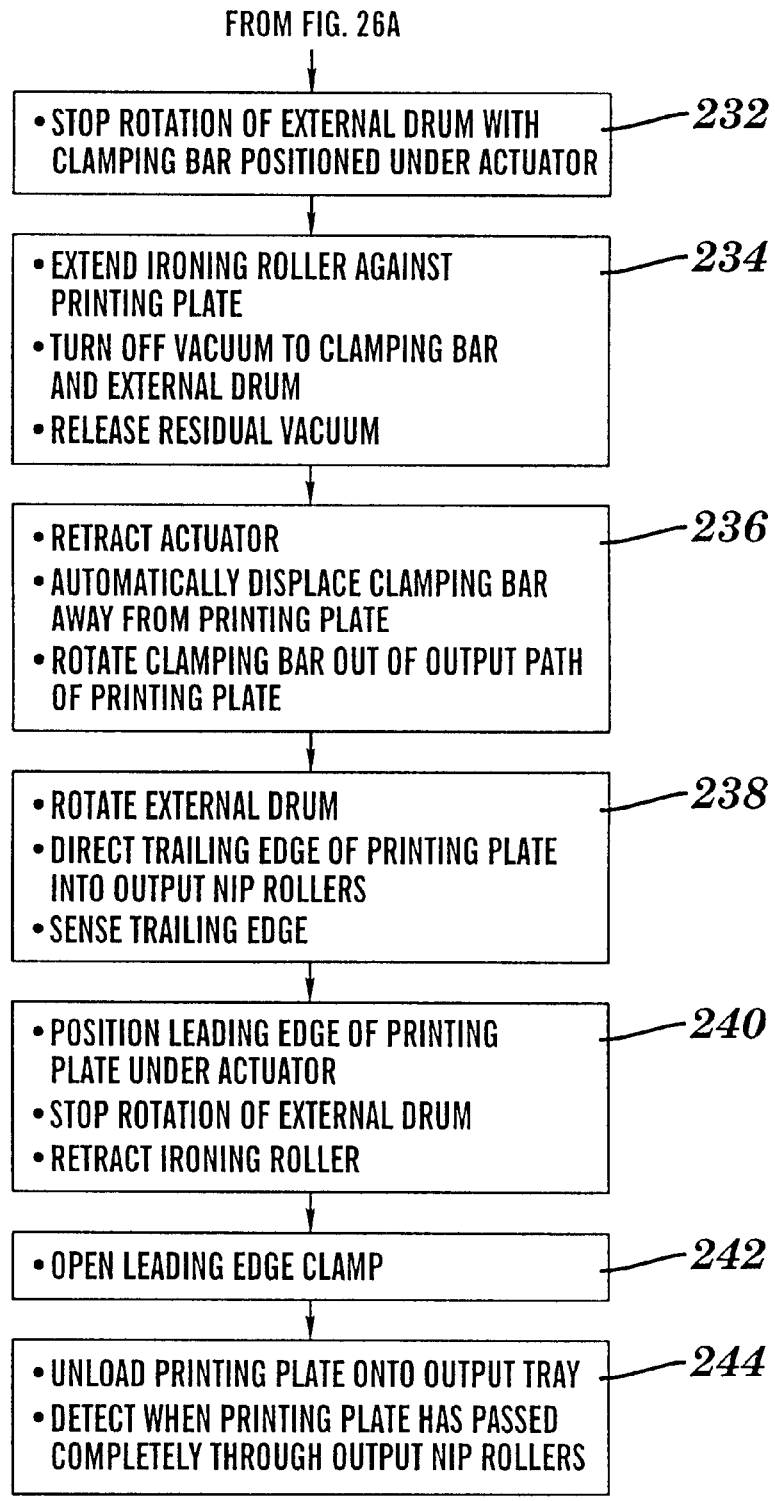

The general input/output flow of the external drum platesetter 16 is summarized in FIGS. 26A and 26B (refer to FIGS. 16–25 for the specific component reference numbers). In step 210, an operator places a printing plate 18 onto the input tray 140, with the leading edge 38 of the printing plate 18 positioned between the input nip roller assemblies 142. The sensors 810, 812, detect the presence of the printing plate 18 at the input nip roller assemblies 142. In step 212, the external drum 20 is rotated, if necessary, to position the leading edge clamping mechanism 40 for plate loading. The actuating system 75 opens the clamping portion 82 of the leading edge clamping mechanism 40, exposing the registration pins 78, and the external drum 20 is held stationary. In step 214, the input nip roller assemblies 142 deskew and propel the printing plate 18 into the external drum imagesetter 16 until the leading edge 38 of the printing plate 18 contacts the registration pins 78. In step 216, the actuating system 75 closes the clamping portion 82 of the leading edge clamping mechanism 40 against the leading edge 38 of the printing plate 18. In step 218, the external drum 20 is rotated a few degrees by the drive system 36 and the actuating system 98 forces the ironing roller assembly 96 against the printing plate 18. In step 220, the external drum 20 is rotated, with the ironing roller assembly 96 forcing the printing plate 18 against the external drum 20, until the trailing edge 42 of the printing plate 18 is positioned adjacent the actuation system 134 of the trailing edge clamping mechanism 44 (as determined by sensor 814). The input sensors 810, 812 measure the skew of the trailing edge 42. During the rotation of the external drum 20, the plate wrap dimension is determined. In step 222, which may be performed as soon as the trailing edge 42 of the printing plate 18 passes completely through the input nip roller assemblies 142, the rotation of the input nip roller assemblies 142 is stopped. At this point, or during or after any of the following steps 224–244, the operator may place another printing plate 18' onto the input tray 140. In step 224, the discs 116 are rotated to position the clamping bar 100 over the trailing edge 42 of the printing plate 18 and under the actuation system 134. In step 226, the clamping bar 100 is forced against and over the trailing edge 42 of the printing plate 18 by the actuation system 134, and a vacuum is introduced in each of the chambers formed underneath the clamping bar 100. This causes the clamping bar 100 to be firmly attached against the external drum 20, thereby pinching the trailing edge 42 of the printing plate 18 against the external drum 20. In step 228, the actuation system 134 and the ironing roller assembly 96 are moved away from the external drum 20, and a vacuum is introduced between the printing plate 18 and the external drum 20. The printing plate is now fully applied to the external drum 20. In step 230, after side edge registration of the printing plate 18, the external drum 20 is rotated and the printing plate 18 is imaged.

After imaging is complete, the external drum 20 is brought to a stop in step 232, with the clamping bar 100 positioned under the actuating system 134. In step 234, the ironing roller assembly 96 is extended against the printing plate 18, and the vacuum to the clamping bar 100 and the external drum 20 is turned off. Residual vacuum beneath the clamping bar 100 is released by opening the pressure relief valve 113 (e.g., using the actuating system 134). In the absence of the vacuum, the clamping bar 100 is automatically biased away from the trailing edge 42 of the printing plate 18 by the biasing system 118 (see, e.g., FIG. 12). In step 236, the clamping bar 100 is rotated out of the output path of the printing plate 18. In step 238, the external drum 20 is rotated to position and direct the trailing edge 42 of the printing plate 18 between and through the rotating output nip roller assemblies 202 toward the output tray 200. The trailing edge 42 of the printing plate 18 is guided into the output nip roller assemblies 202 by the input/output platen 150. The trailing edge 42 of the printing plate 18 is detected exiting the output nip roller assemblies 202 by the sensor 816. In step 240, rotation of the external drum 20 and the output nip roller assemblies 202 is temporarily halted when the leading edge clamping mechanism 40 is located beneath the actuating system 75. The ironing roller assembly 96 is then retracted. In step 242, the clamping portion 82 of the leading edge clamping mechanism 40 is opened by the actuator 76, completely freeing the printing plate 18 from against the external drum 20. Finally, in step 244, the output nip roller assemblies 202 are again rotated until the printing plate 18 is expelled onto the output tray 200. The sensor 816 provides a signal indicating that the printing plate 18 has passed completely through the output nip roller assemblies 202. The printing plate 18' previously loaded on the input tray 140, may now be mounted on the external drum 20 starting at step 212.

Figure 27:
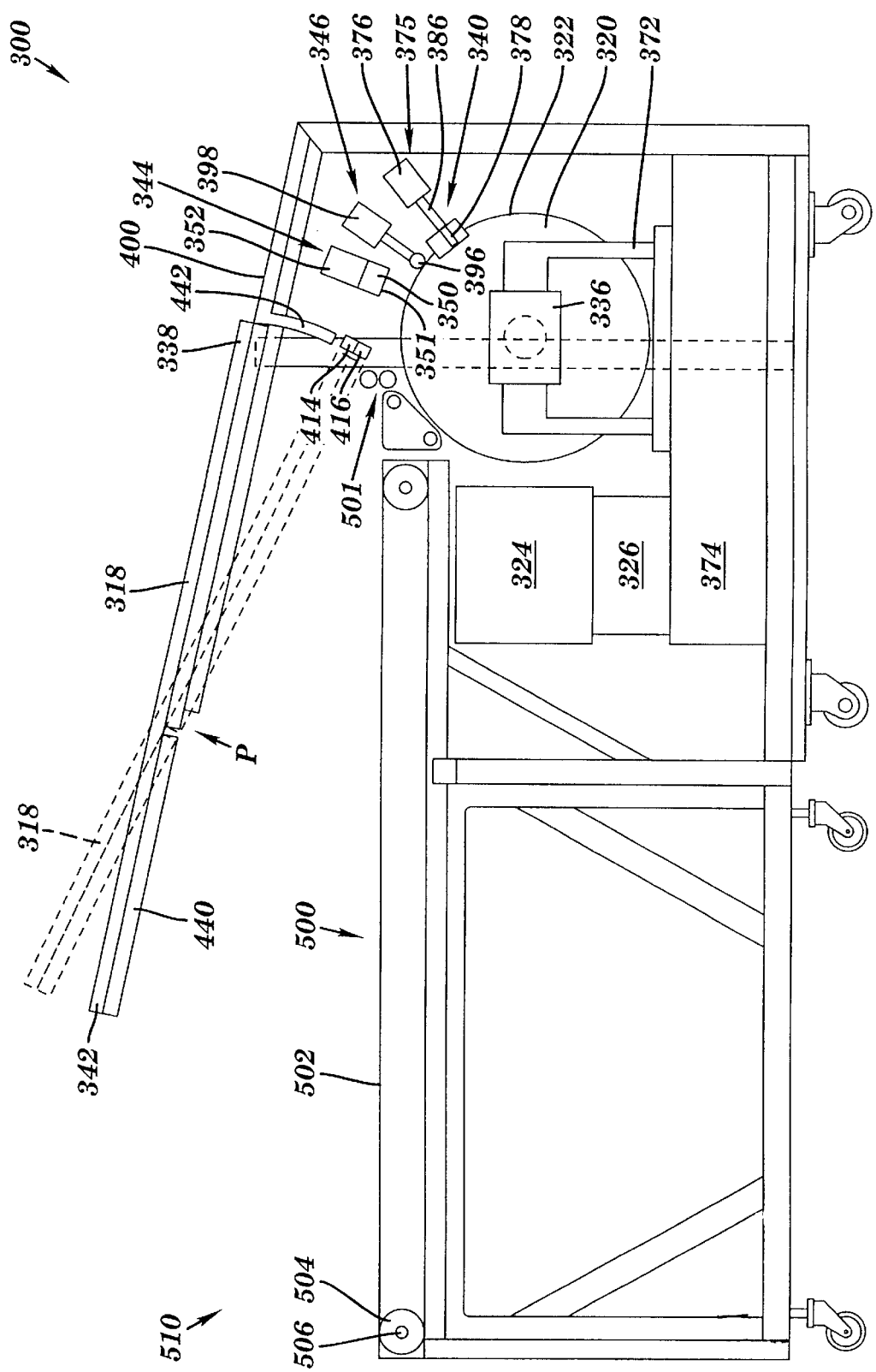
FIG. 27 illustrates an external drum platesetter in accordance with an alternate embodiment of the present invention.

A very large format (VLF) external drum platesetter 300 in accordance with an alternate embodiment of the present invention is illustrated in FIG. 27. Although this embodiment of the present invention provides a very large format (VLF) external drum platesetter 300 capable of handing and imaging printing plates having dimensions of up to 58"×80", or greater, the platesetter 300 may be used to record image data onto almost any size printing plate. Examples of plate sizes that may be imaged on the external drum platesetter 300 include, inter alia, 45"×50", 45"×57", 50"×60", 55"×70", and 58"×80". A range of possible plate sizes is from 20"×28", to 58"×80".

The external drum platesetter 300 is similar to the external drum platesetter 16 described above with reference to FIG. 7. In particular, the external drum platesetter 300 includes an external drum 320 having a cylindrical media support surface 322 for supporting a printing plate 318 during imaging. The external drum 320 is supported by a frame 372. A drive system 336 rotates the external drum 320 during imaging. A scanning system 324, carried by a movable carriage 326, travels axially along the rotating external drum 320 to record digital data onto the imaging surface of the printing plate 318. The external drum 320 and scanning system 324 are positioned on a heavy, stable base 374.

A leading edge clamping mechanism 340 is provided to hold and register a leading edge 338 of the printing plate 318 in position against the media support surface 322. The leading edge clamping mechanism 340 has a configuration similar to that of the leading edge clamping mechanism 40 employed in the external drum platesetter 16, and operates in a similar manner. In particular, the leading edge clamping mechanism 340 is selectively opened and closed by an actuating system 375, including an actuator 376 (e.g., a pneumatic actuator, solenoid, etc.) and extendible member 386. The leading edge clamping mechanism 340 is provided to selectively receive, capture, and release the leading edge 338 of the printing plate 318. The leading edge clamping mechanism 340 is fixed in position on the external drum 320, within a groove (see, e.g., FIGS. 3–5) formed in the external drum 320. A set of selectively positionable registration pins 378 are incorporated into the leading edge clamping mechanism 340 to register the leading edge 338 of the printing plate 318.

A stationary ironing roller system 346 is used to selectively force the printing plate 318 against the media support surface 322 of the external drum 320 as the external drum 320 rotates past the ironing roller system 346 during the loading of the printing plate 318. The stationary ironing roller system 346 includes an ironing roller assembly 396, including one or more rollers, and an actuating system 398 for selectively extending or retracting the ironing roller assembly 396 toward or away from the external drum 320. The ironing roller assembly 396 is retracted away from the external drum 320 prior to the imaging of the printing plate 318.

There are several differences between the external drum platesetter 16 and the external drum platesetter 300. These differences are primarily due to the fact that the printing plates 318 imaged by the external drum platesetter 300 are generally much larger, heavier, and more unwieldy, than the printing plates 18 imaged by the external drum platesetter 16. For example, the external drum platesetter 300 includes a landing zone 400 which provides a broad surface for an operator to initially rest a printing plate 318 as it is brought to the platesetter 300. Once the plate is "landed" on the landing zone 400, the operator can easily slide the printing plate 318 up onto an input tray 440 to a staged position.

The input tray 440 is pivotable about a pivot point P between a landing position (shown in solid lines), where the input tray 440 is aligned with the landing zone 400 (e.g., coplanar with, or parallel to, the landing zone 400), and a loading position (shown in phantom), where the input tray 440 and the printing plate 318 are angled more steeply down toward the external drum 320. The input tray 440 may be manually or automatically pivoted between the landing and loading positions. A guard 442 prevents the printing plate 318 from sliding off the input tray 440 as the input tray 440 is pivoted between the landing and loading positions.

When the input tray 440 is in the loading position, the weight of the printing plate 318 may cause the printing plate 318 to slide downward toward the external drum 320 (i.e., the printing plate 318 is fed by gravity toward the external drum 320). A door 414, or similar escapement mechanism, which is selectively activated (e.g., extended or retracted) by an actuator 416 (e.g., a pneumatic actuator, solenoid, etc.), may be provided to regulate the displacement of the printing plate 318. Alternately, the printing plate 318 may be allowed to slide toward the external drum 320 as soon as the leading edge 338 of the printing plate 318 clears the guard 442. A roller system, such as the input nip roller assembly 144 (FIG. 16), or other suitable system, may also be used to controllably direct the printing plate 318 toward and onto the external drum 320.

As soon as the trailing edge 342 of the printing plate 318 is pulled off the input tray 440 as the printing plate 318 is loaded onto the external drum 320, the input tray 440 may be manually or automatically pivoted back to its landing position. Once the loading tray 440 is returned to the landing position, an operator may place the next printing plate 318' (FIG. 39) to be imaged on the landing zone 400, and then slide the printing plate 318' up onto the input tray 440 to a staged position. The next printing plate 318' may be positioned on the input tray 440 even as the pre-imaging loading and clamping steps describe below for the printing plate 318 are being performed, thereby increasing the throughput of the external drum platesetter 300.

In the external drum platesetter 16 (see, e.g., FIG. 21), enough vacuum force is generated between the clamping bar 100 and the external drum 20 to securely clamp the trailing edge 42 of the printing plate 18 against the external drum 20 during imaging, even when the external drum 20 is rotating at a high rate of speed (e.g., 100–1000 rpm). In the VLF external drum platesetter 300, however, it is much more difficult (though not impossible) to produce a vacuum force sufficient to counteract the forces which act to lift the printing plate 318 off of the external drum 320 during imaging. These forces are due, for example, to the increased weight, greater thickness, and higher resultant resilience of the printing plates 318. To overcome these forces, the external drum platesetter 300 includes a trailing edge clamping mechanism 344 that employs a set of magnetic clamps 350 to securely clamp the trailing edge 342 of the printing plate 318 against the external drum 320.

The set of magnetic clamps 350 employed by the trailing edge clamping mechanism 344 may include a single, elongated magnetic clamp that extends across the length of the external drum 320, or may comprise a plurality of discrete magnetic clamps which are distributed across the external drum 320. The set of magnetic clamps 350 may be collectively or individually positioned against, and removed from, the external drum 320 by an actuating system 352 comprising at least one actuator. An underside of each of the magnetic clamps 350 is covered with a deformable layer of rubber 351 or other suitable nonabrasive material to prevent damage to the printing plate 318.

Figure 28:
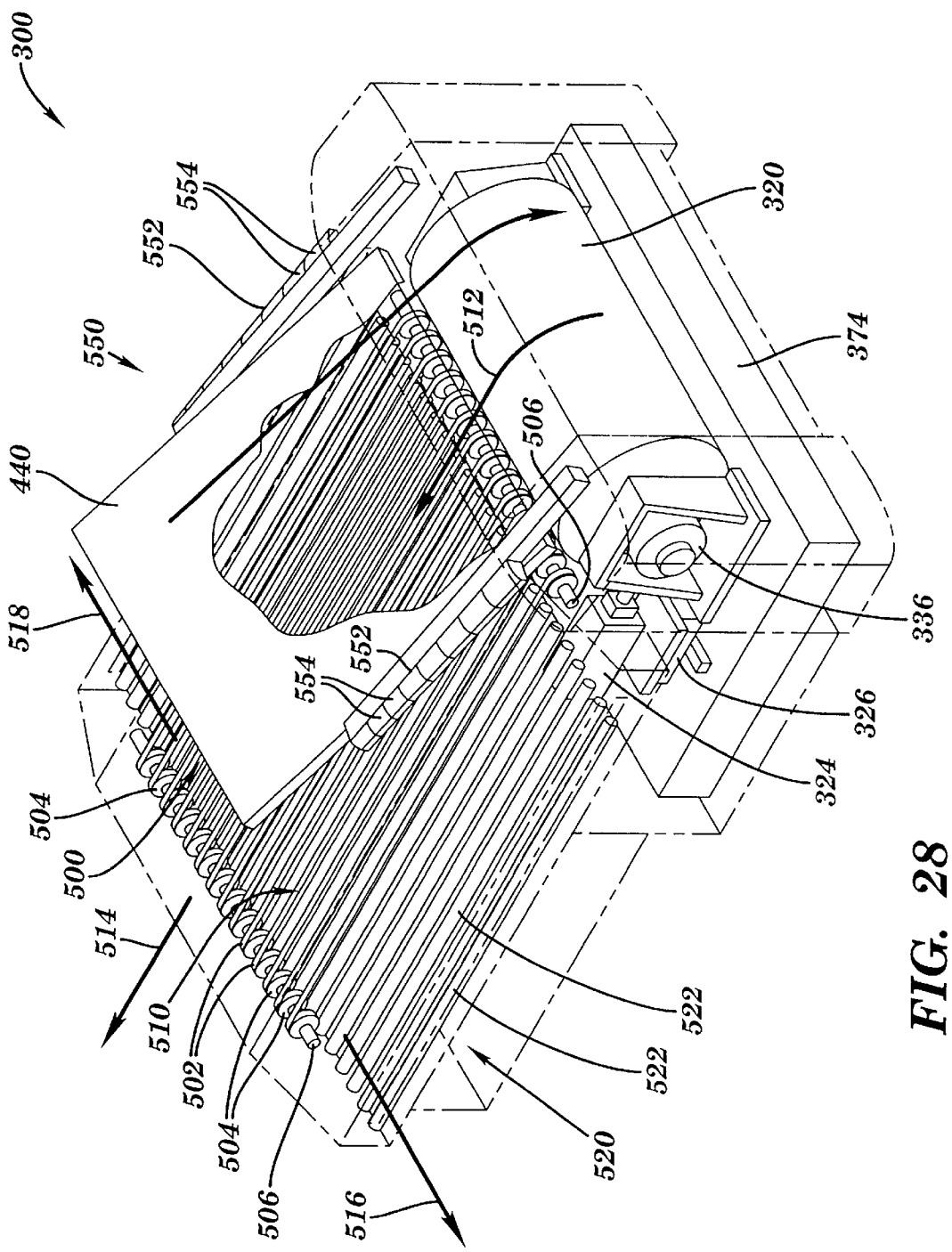
FIG. 28 is a cutaway perspective view of the external drum platesetter of FIG. 27.
Figure 29:
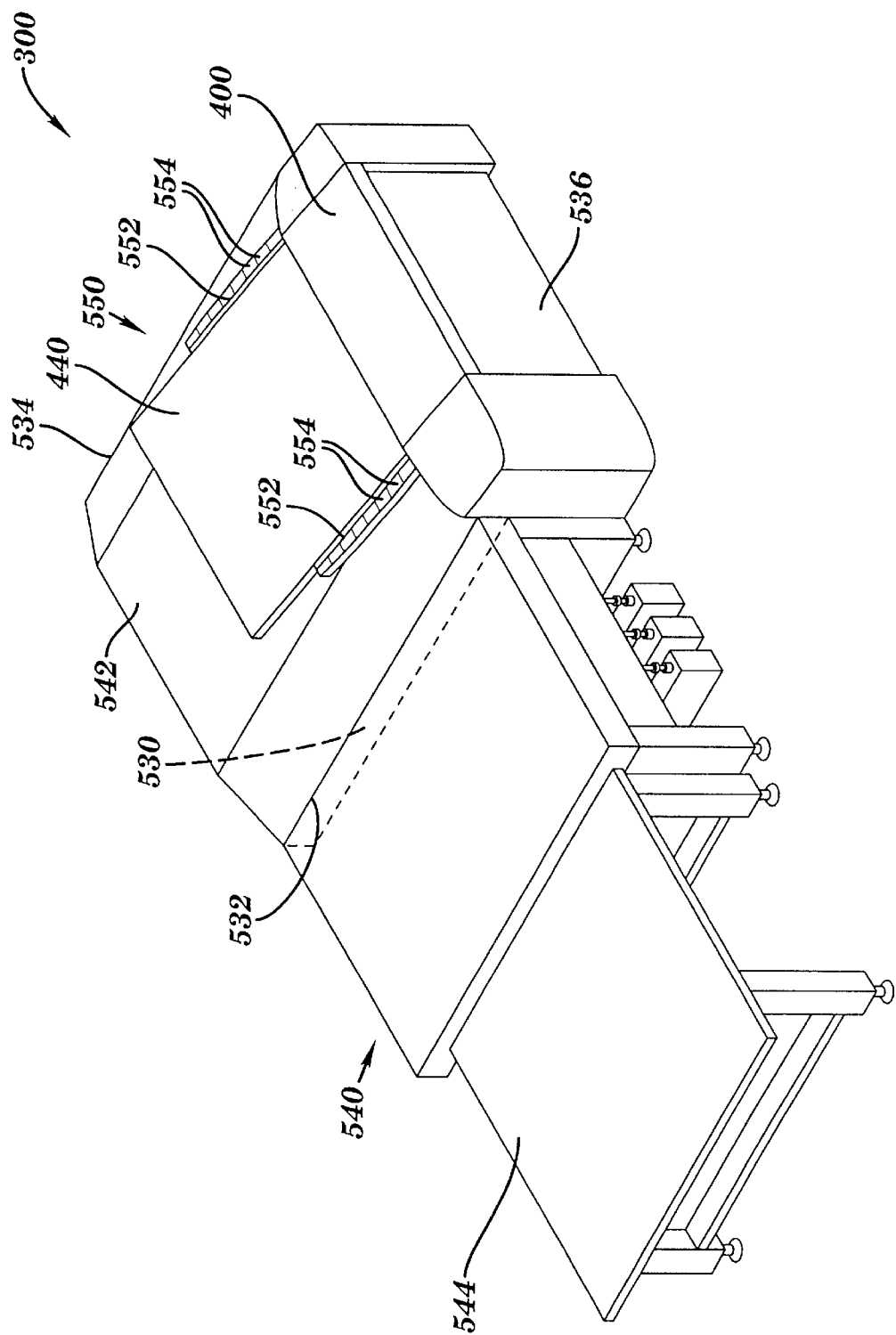
FIG. 29 is a perspective view of the external drum platesetter of FIG. 27, coupled to an on-line processor.

As illustrated in FIGS. 27–28, a conveying system 500 may be provided to help propel an imaged printing plate 318 toward and onto an output tray 510 of the external drum platesetter 300. In addition, or alternately, a roller system 501 (FIG. 27), such as the output nip roller assemblies 202 (FIG. 24), or other suitable system, may be used to controllably direct the printing plate 318 toward and onto the output tray 510. The conveying system 500 includes a plurality of belts 502 that extend around sets of pulleys 504 mounted on shafts 506. At least one of the shafts 506 is rotated by a drive system (not shown), which causes a rotation of the pulleys 504 and the belts 502 mounted thereon. The belts 502 comprise rubber or other suitable material. Other conveying systems may also be used. In FIGS. 27–28, the belts 502 are rotated in a counterclockwise direction to position an imaged printing plate 318 onto the output tray 510 (directional arrow 512). Once fully unloaded into the output tray 510, the rotation of the belts 502 is terminated, and the printing plate 318 may be manually or automatically removed from the rear (directional arrow 514) or from either side (directional arrows 516, 518) of the output tray 510 A roller arrangement 520, shown in FIG. 28, may be provided to displace the printing plate 318 off of the output tray 510. As illustrated, the roller arrangement 520 may comprise a plurality of rollers 522, some or all of which are rotated by suitable drive systems (not shown) to displace the printing plate 318 toward either side (directional arrows 516, 518) of the output tray 510. As illustrated in FIG. 29, the printing plate (not shown) is selectively directed through a slot 530, or other suitable opening, formed in either or both sides 532, 534 (FIG. 29), of the housing 536 of the external drum platesetter 300. Alternately, a slot or opening (not shown) may be formed in the rear of the housing 536. In this case, the printing plate 318 is directed through the rear slot by the conveying system 501 (FIG. 27). In FIG. 29, for example, a printing plate (not shown) may be directed through the slot 530 into an on-line processor 540 which chemically develops, fixes, and washes the printing plate 318. Also shown in FIG. 29 is a cover 542 for covering the output tray 510, and an output tray 544 for the on-line processor 540. The cover 542 may be a light-tight cover for preventing exposure of the printing plate 318 prior to developing the image recorded thereon.

Figure 30A:
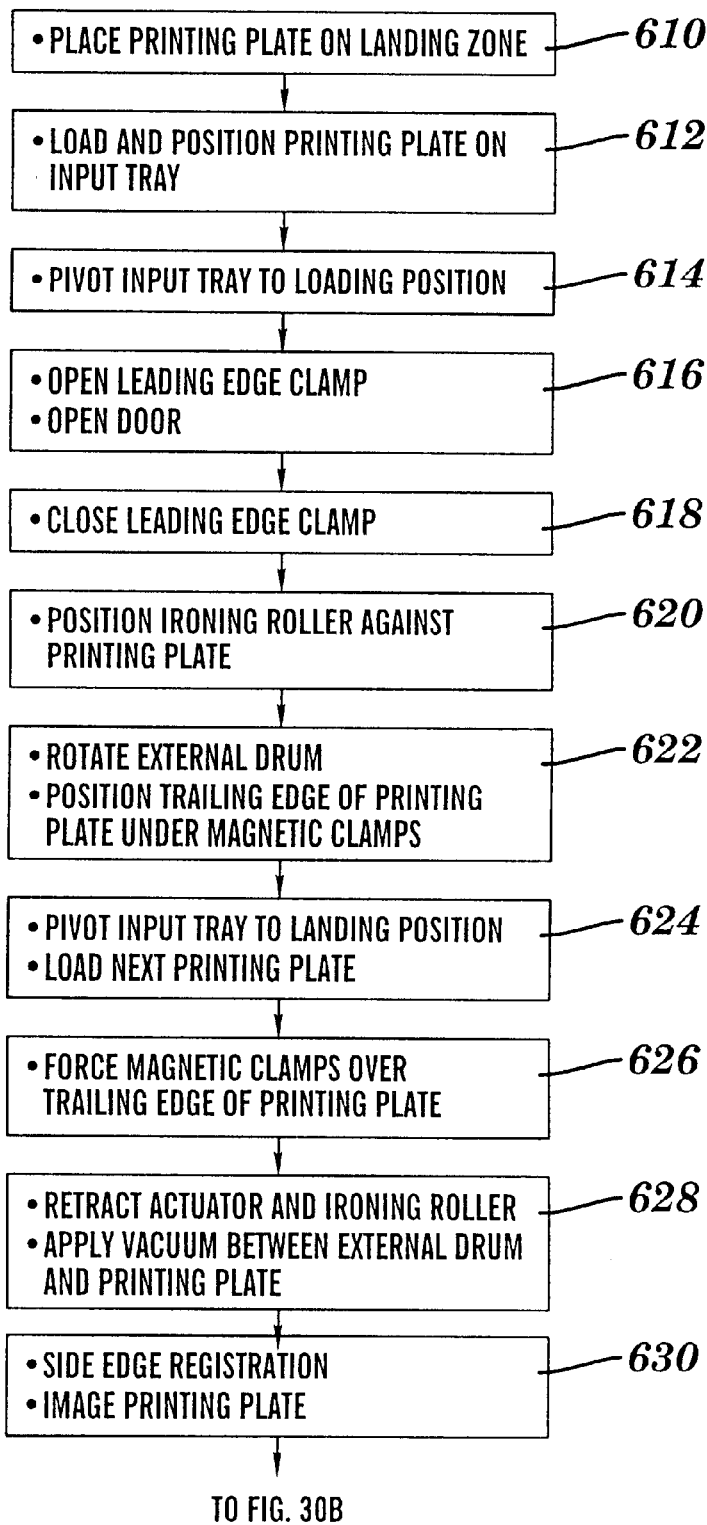
FIGS. 30A and 30B illustrate the general input/output flow of the external drum platesetter of FIG. 27.
Figure 30B:
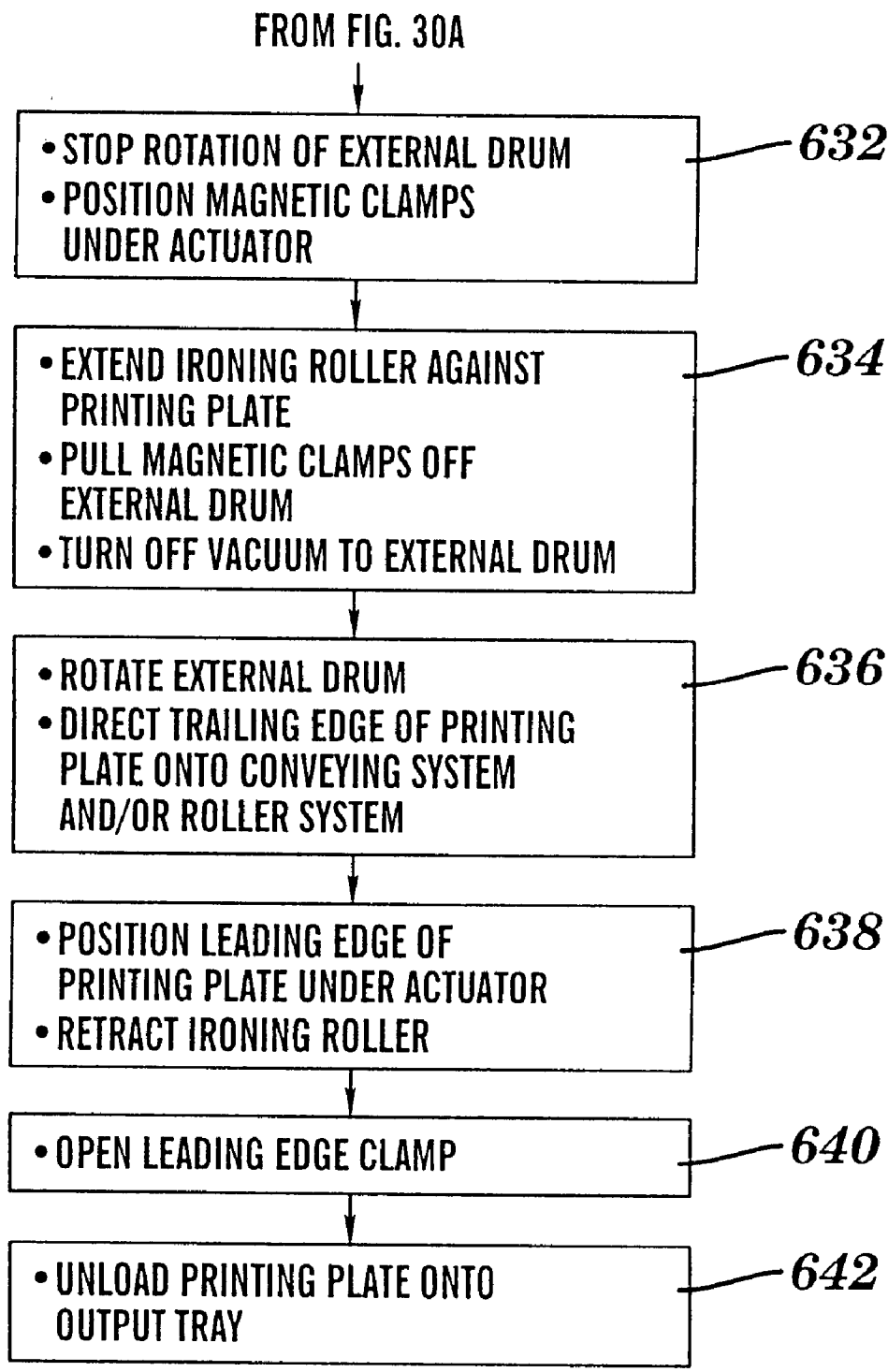

The general input/output flow of the external drum platesetter 300 is summarized in FIGS. 30A and 30B (refer to FIGS. 27–29 and 31–44 for the specific component reference numbers). It should be noted that although the following steps are described in a specific order, many of the steps (or sets thereof) may be performed in a different order (or omitted) without departing from the scope of the present invention. In step 610, an operator positions and rests a printing plate 318 on the landing zone 400. The landing zone 400 is provided to initially support the printing plate 318 as it is brought to the external drum platesetter 300. By providing the landing zone 400, the operator is not required to immediately maneuver the often large, heavy, and bulky printing plate 318 into position on the input tray 440. Instead, the operator may initially rest the printing plate 318 on the landing zone 400, and then easily and accurately slide the printing plate 318 up onto the input tray 440 to a staged position.

Figure 31:
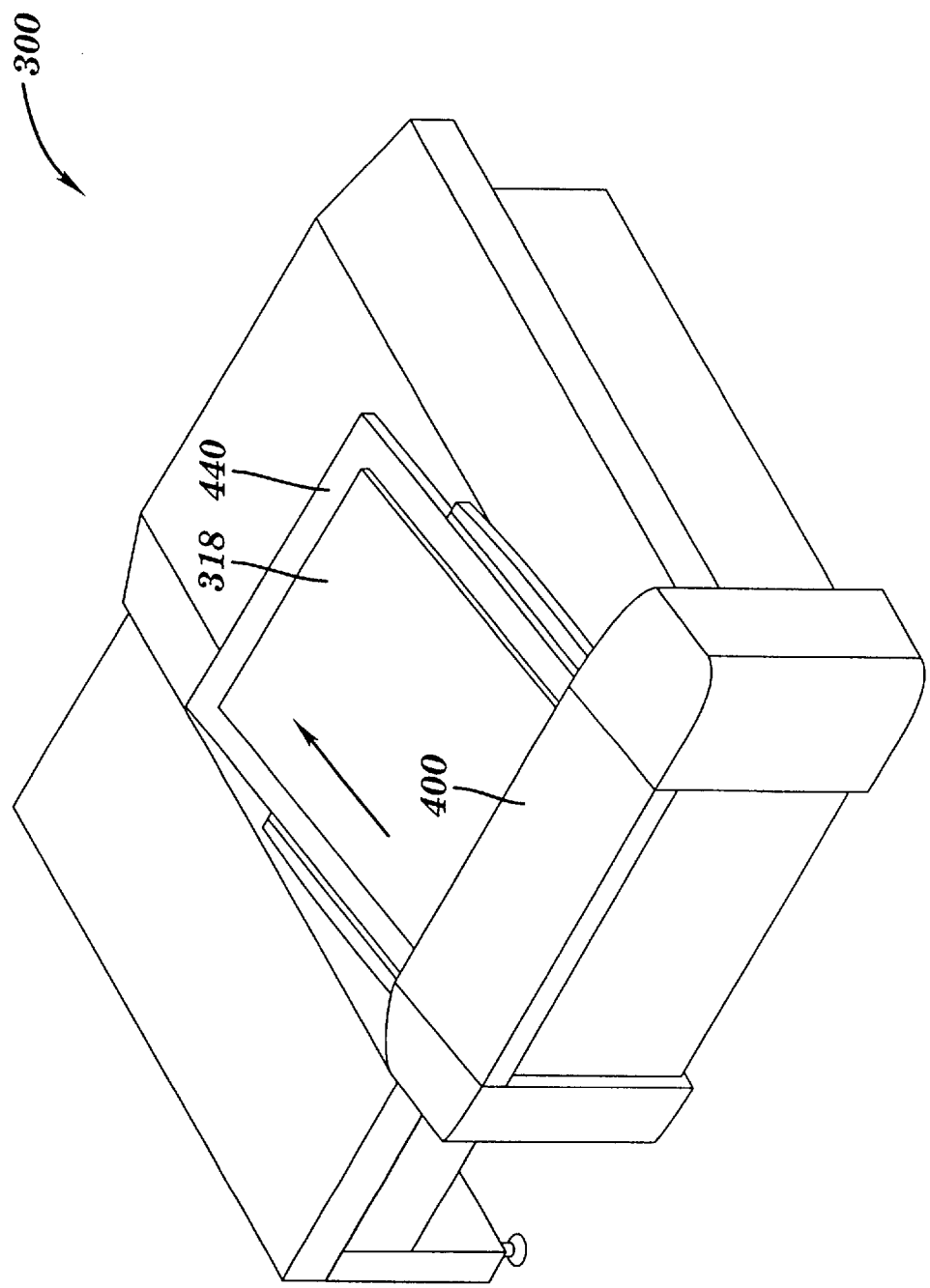
FIGS. 31–44 illustrate the operation and media input/output process of the media handling system of the external drum platesetter of FIG. 27.

In step 612, the printing plate 318 is slid onto the input tray 440 and positioned in a staged position (see also FIG. 31). During step 612, the printing plate 318 may also be center justified, left justified, right justified, or otherwise suitably oriented in a loading position within the input tray 440. The loading position of the printing plate 318 may be indicated by indicia or mechanical stops formed on or adjacent the input tray 440.

Figure 32:
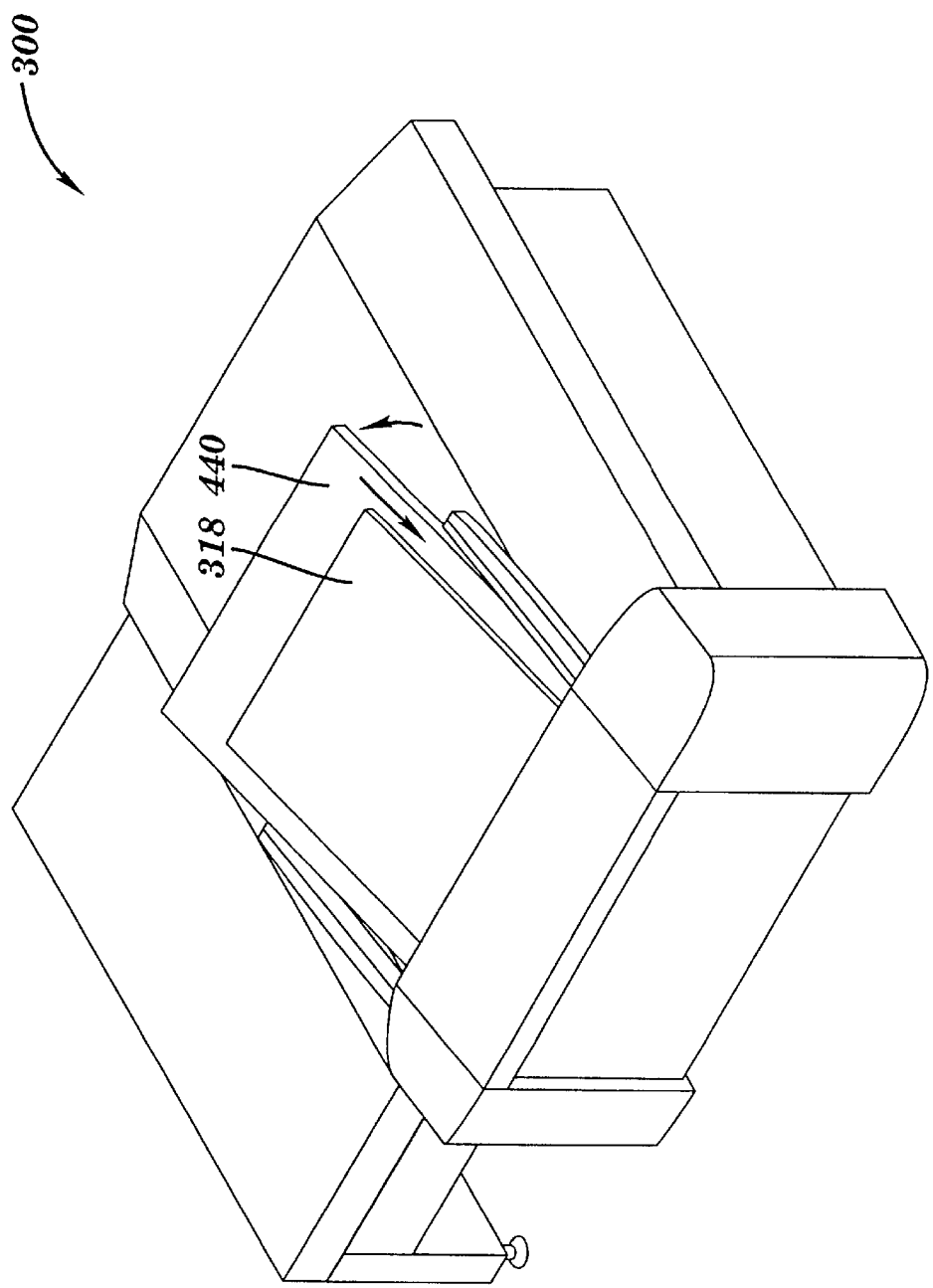
Figure 33:
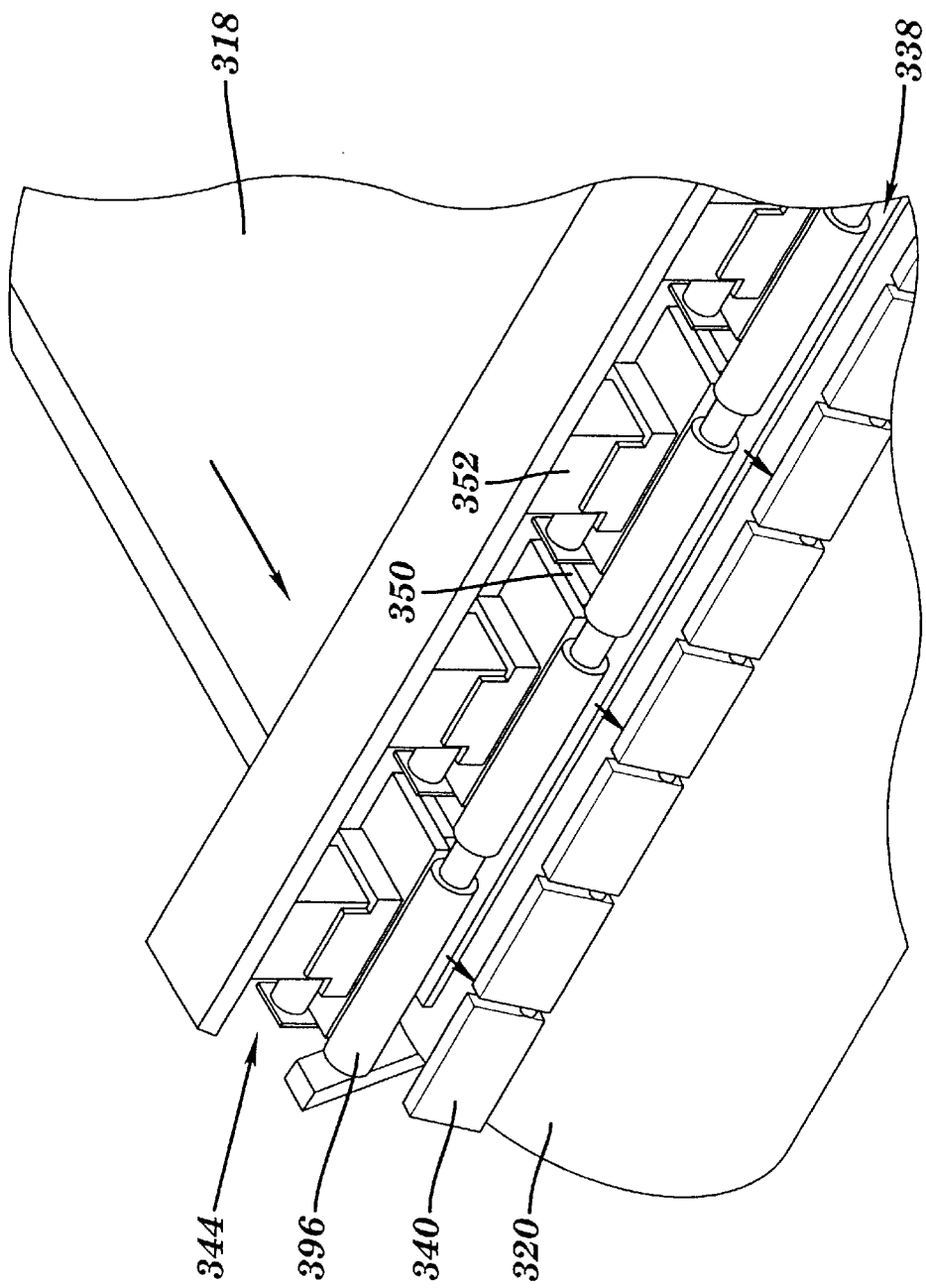
Figure 34:
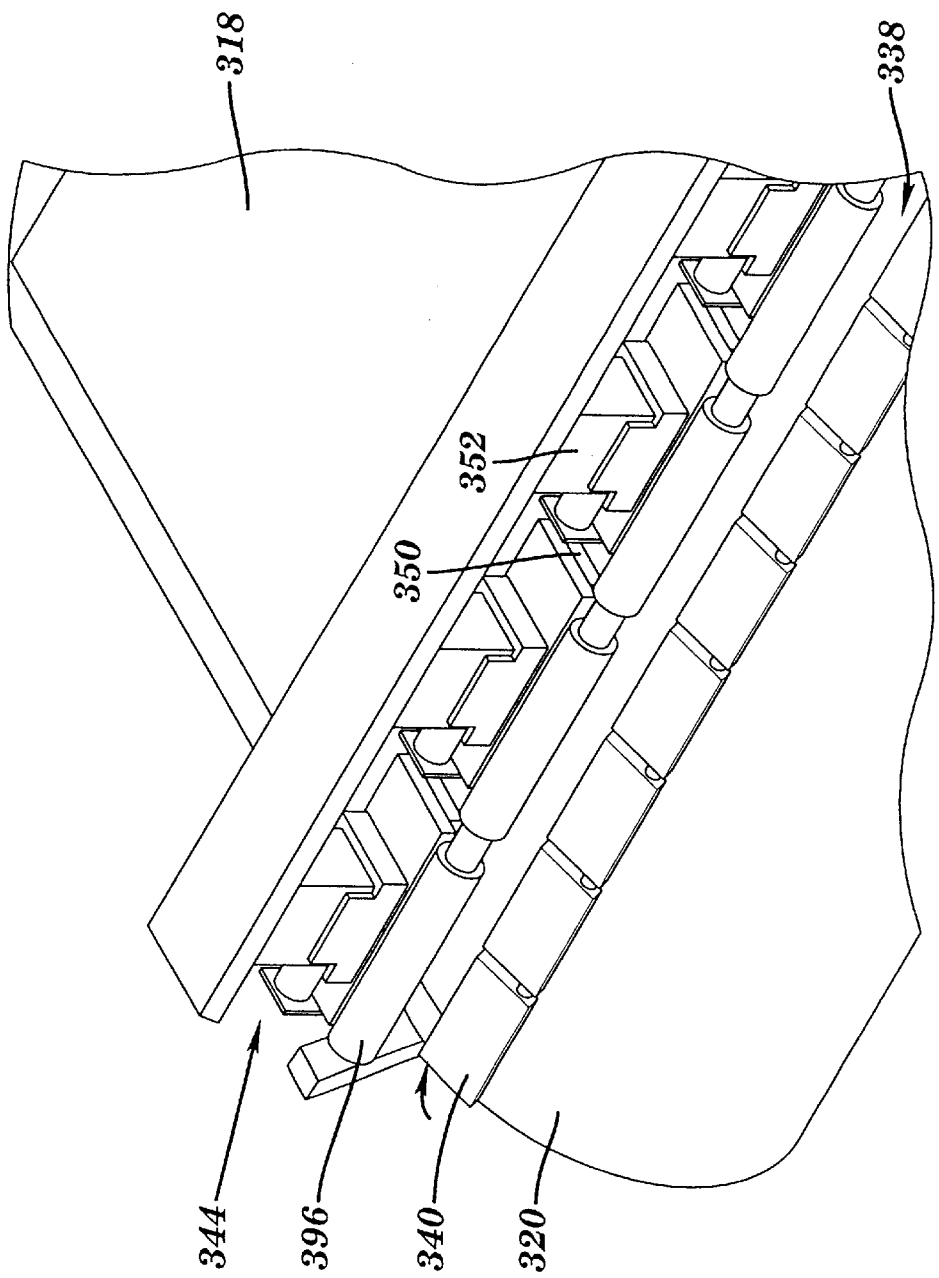
Figure 35:
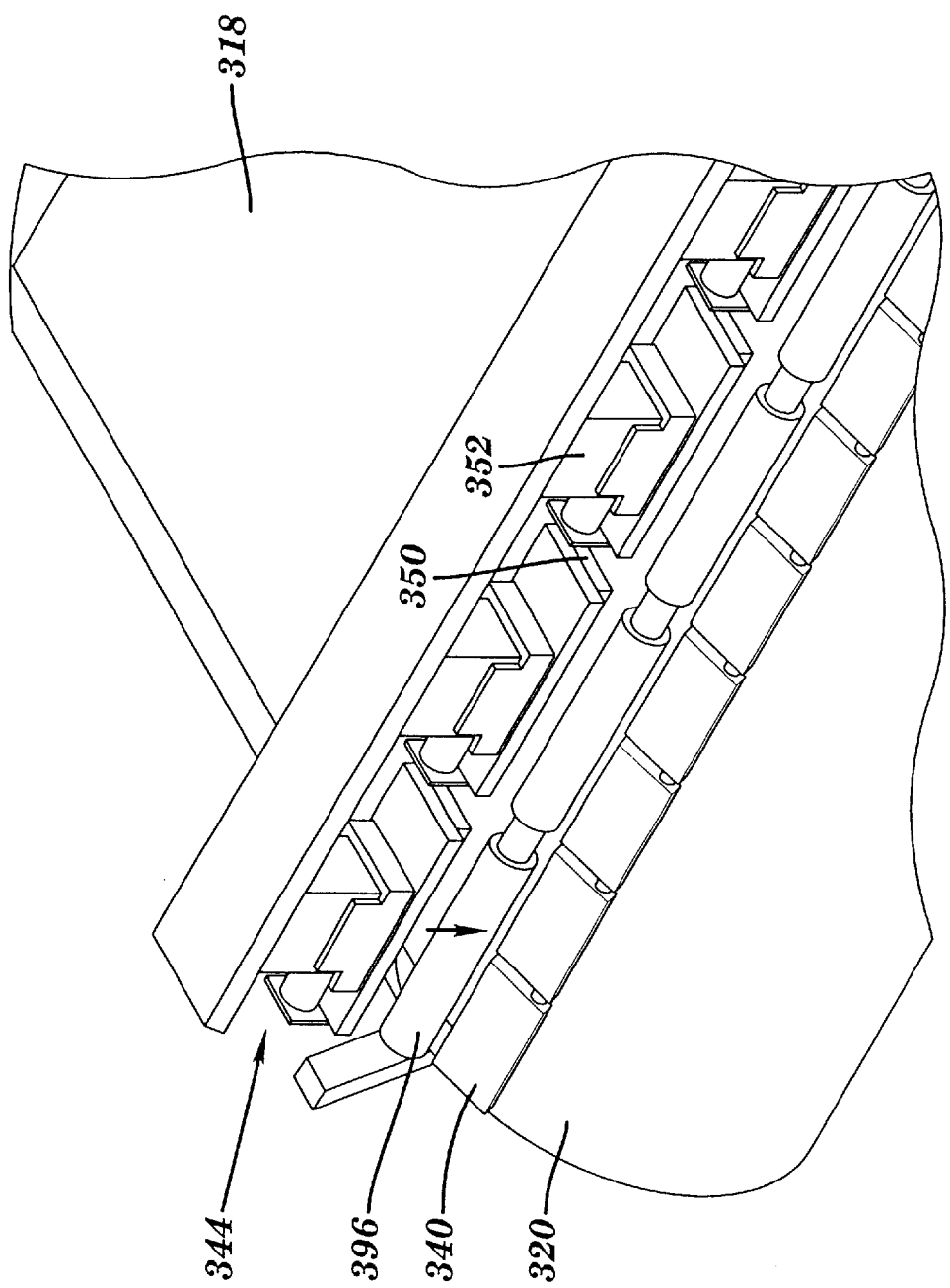
Figure 36:
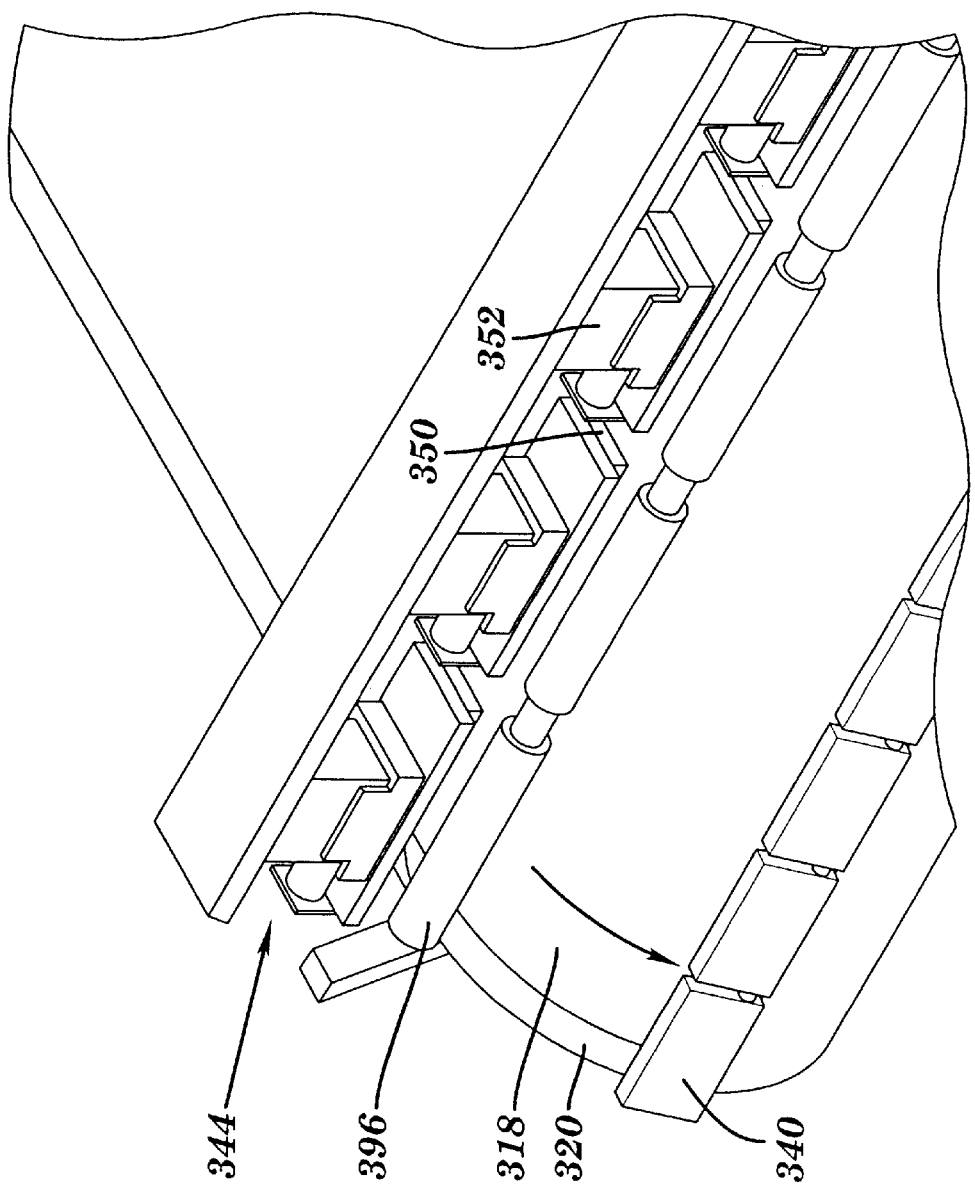
Figure 37:
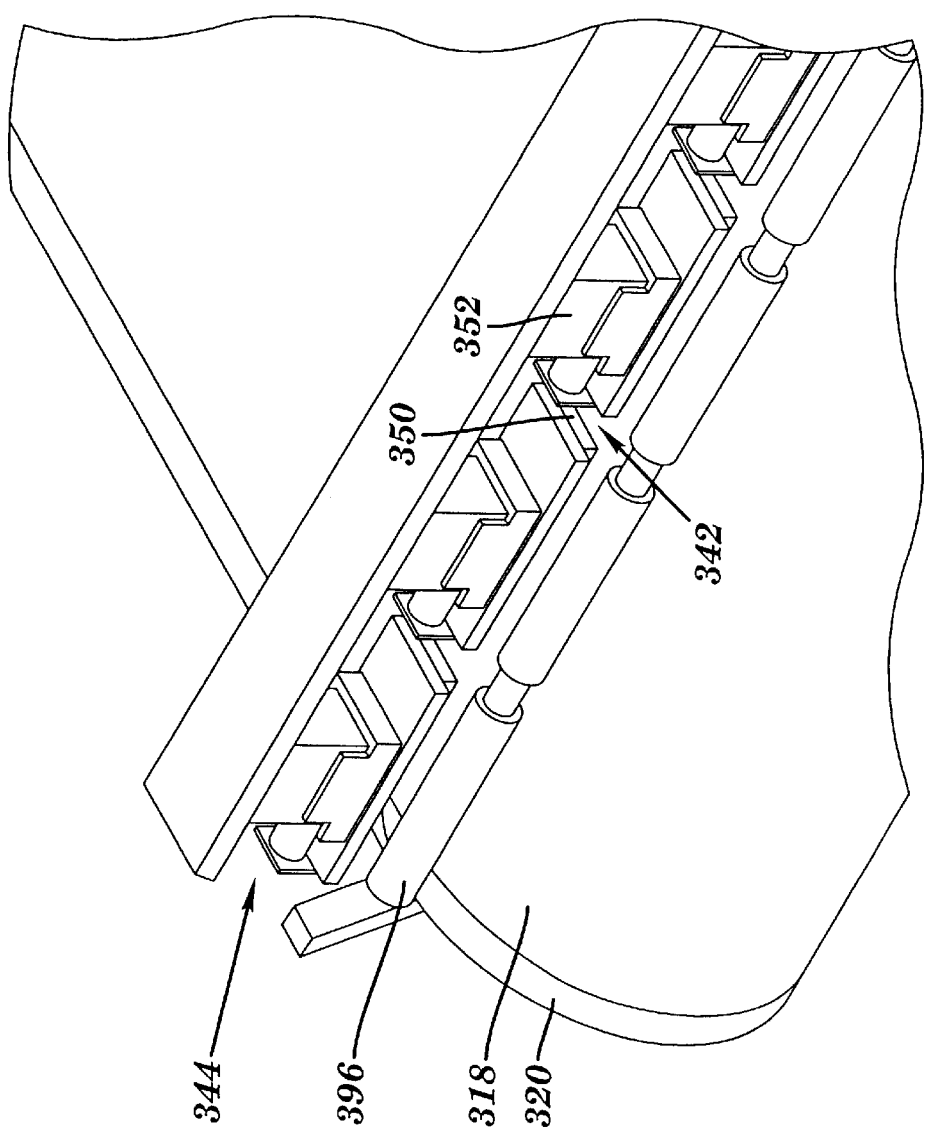

In step 614, the input tray 440 is pivoted from the landing to the loading position (see also FIG. 32). In step 616, the external drum 320 is rotated by the drive system 336, if necessary, to position the leading edge clamping mechanism 340 for plate loading. The actuating system 375 then opens the leading edge clamping mechanism 340, exposing the registration pins 378. This step may be performed before, during, or after step 614. The door 414, if present, is then opened by the actuator 416, thereby allowing the printing plate 318 to slide down the input tray 440 until the leading edge 338 of the printing plate 318 contacts two of the registration pins 378 (see also FIG. 33 (pins not visible)). In step 618, the actuating system 375 closes the leading edge clamping mechanism 340 against the leading edge 338 of the printing plate 318 (see also FIG. 34). In step 620, the actuating system 398 forces the ironing roller assembly 396 against the printing plate 318 (see also FIG. 35). In step 622, the external drum 320 is rotated by the drive system 336, with the ironing roller assembly 396 forcing the printing plate 318 against the external drum 320 (see also FIG. 36), until the trailing edge 342 of the printing plate 318 is positioned below the set of magnetic clamps 350 of the trailing edge clamping mechanism 344 (see also FIG. 37).

Figure 38:
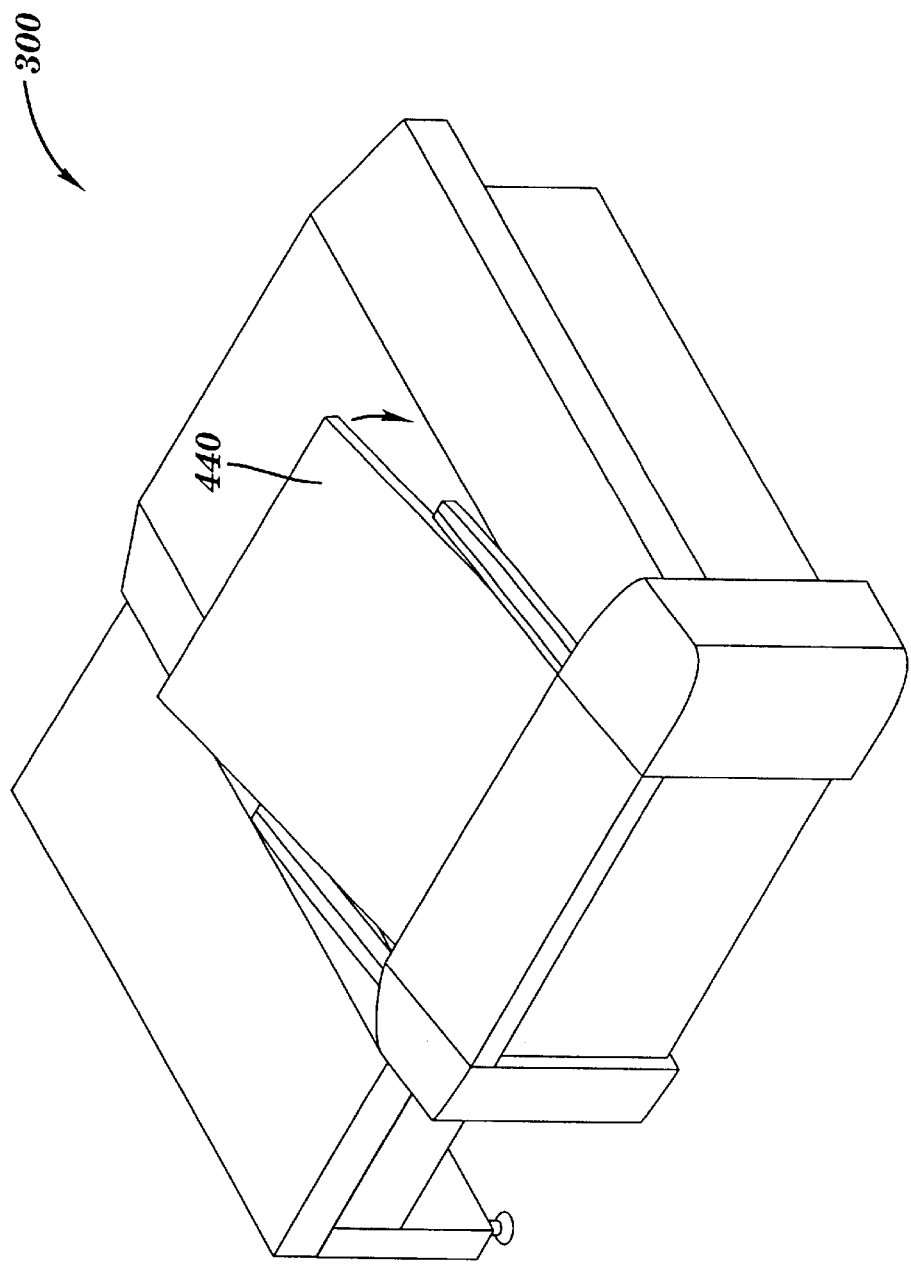
Figure 39:
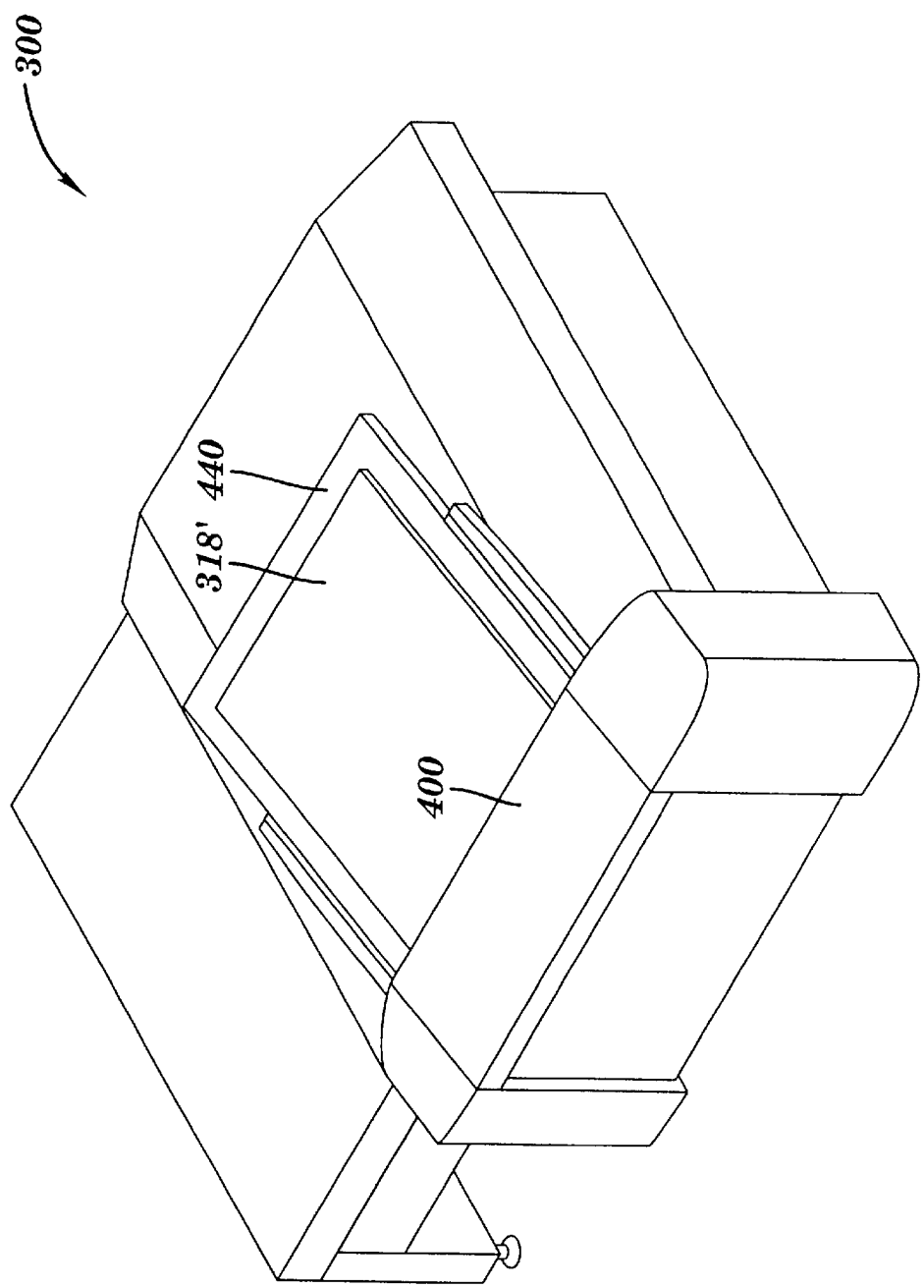

In step 624, which may be performed as soon as the trailing edge 342 of the printing plate 318 is pulled completely off of the input tray 440, or during or after any of the following steps 626–642, the input tray 440 may be manually or automatically pivoted back to the landing position (see also FIG. 38). The operator may now slide another printing plate 318' onto the input tray 440 from a landed position on the landing zone 400 to a staged position on the input tray 440 (see also FIG. 39).

Figure 40:
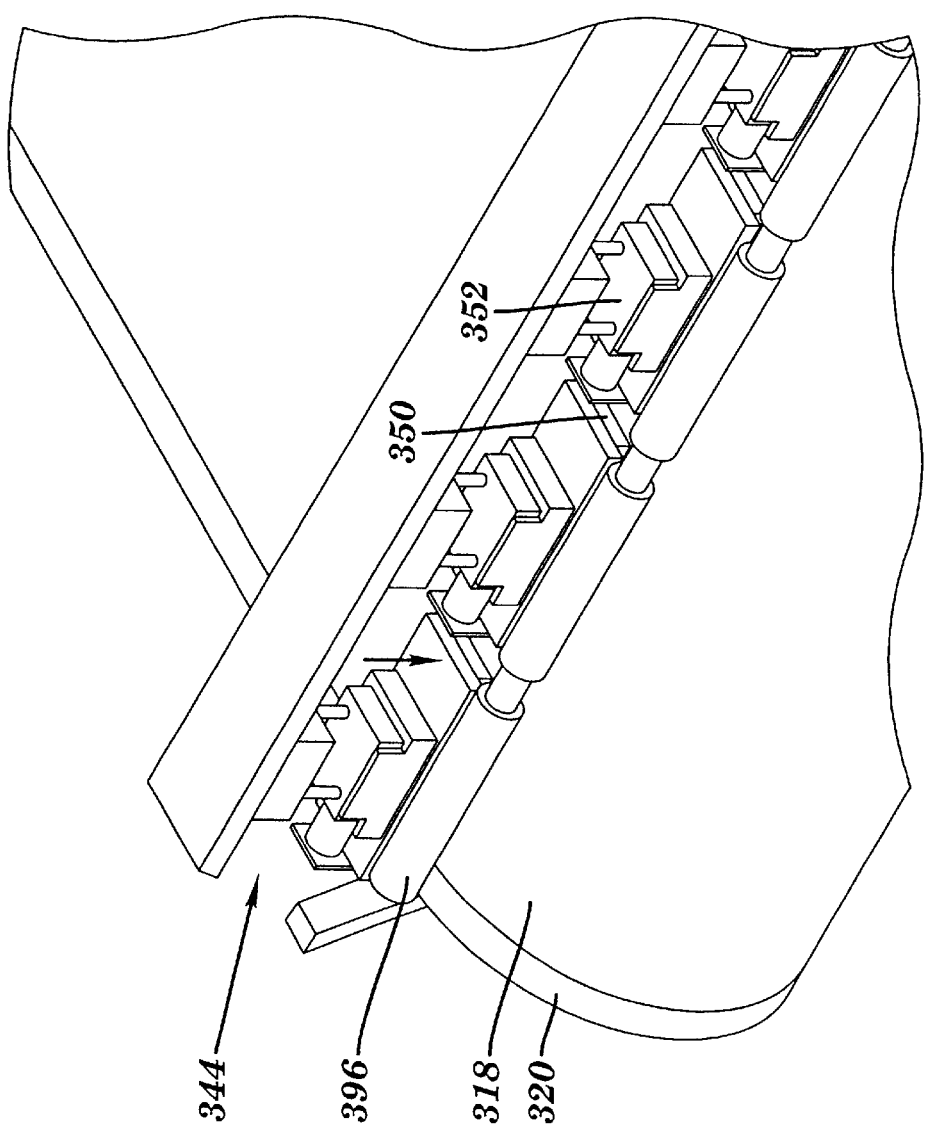
Figure 41:
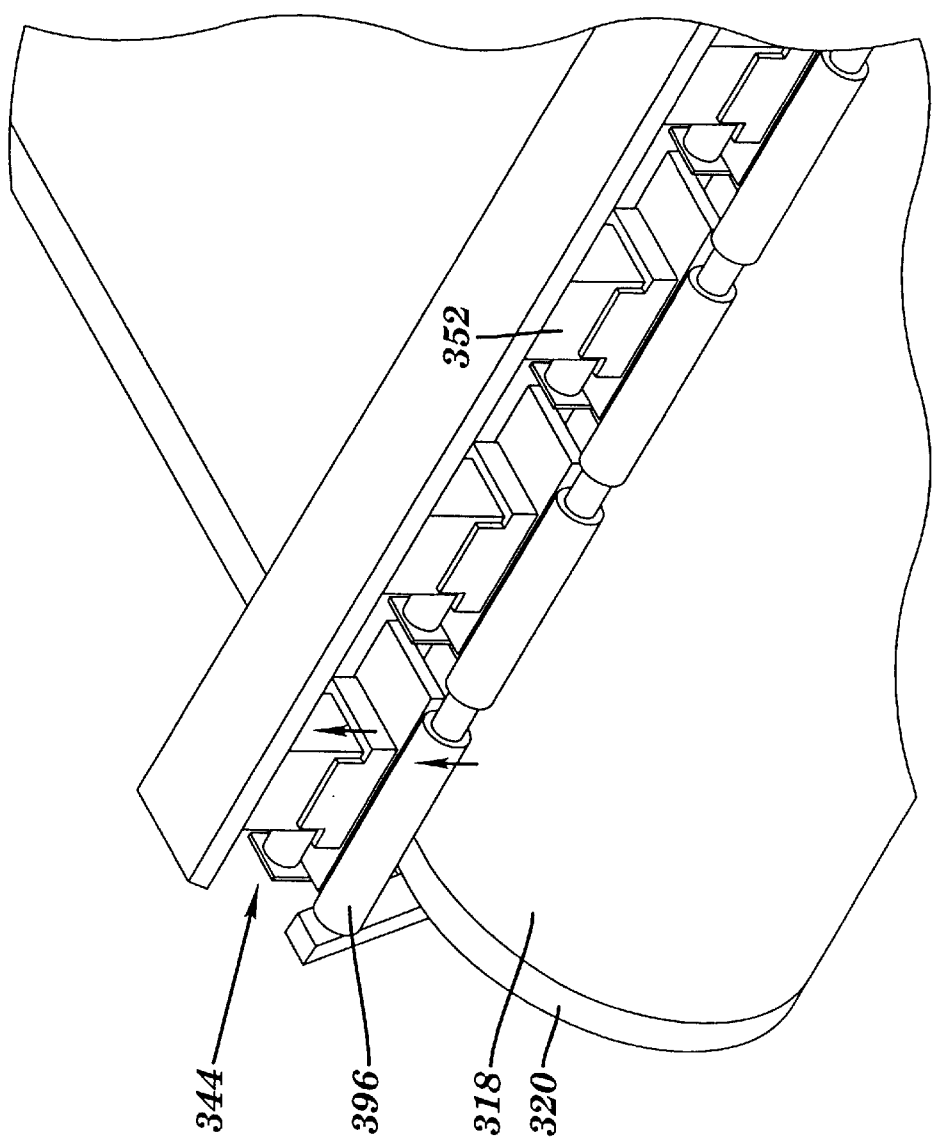
Figure 42:
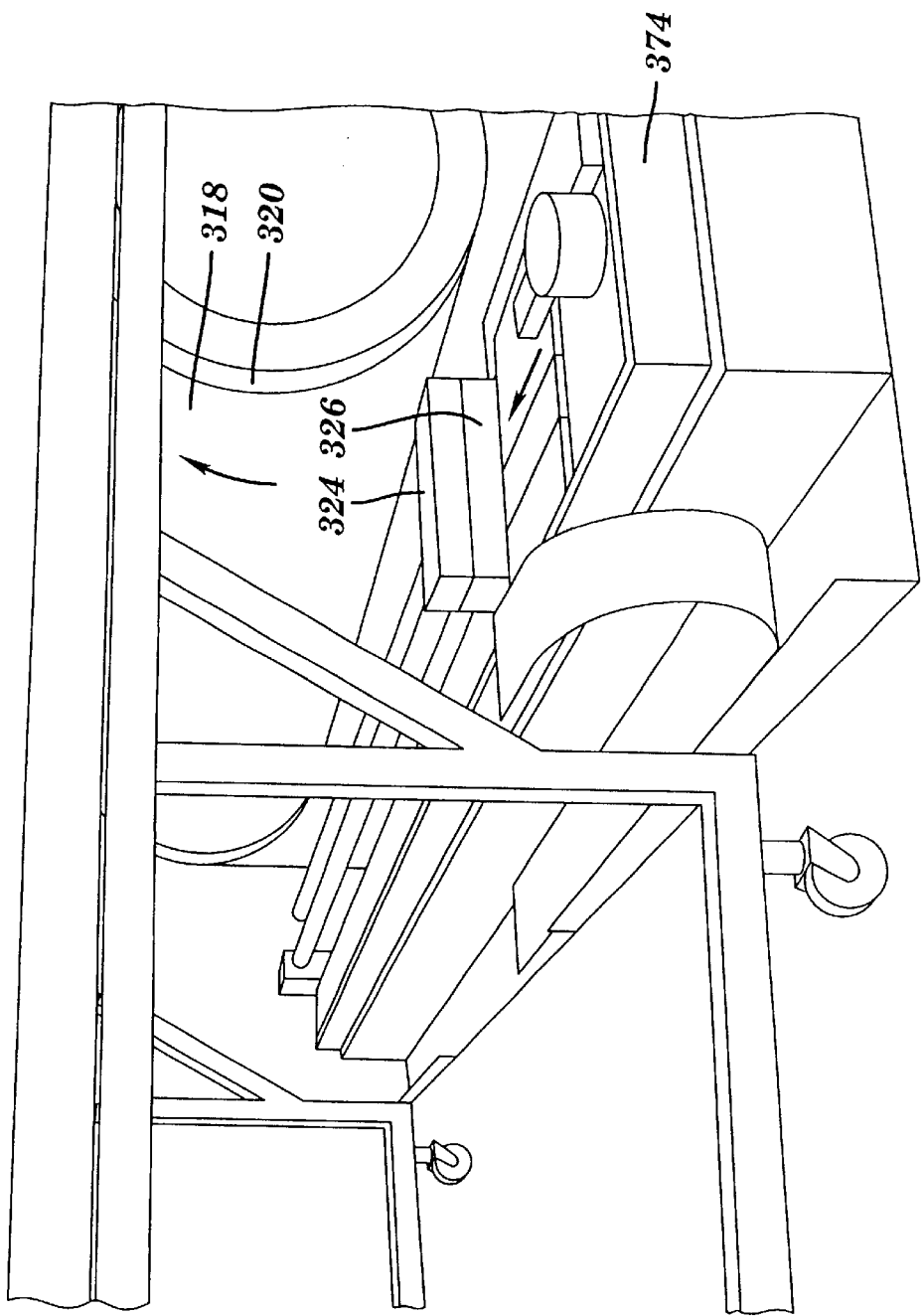
Figure 43:
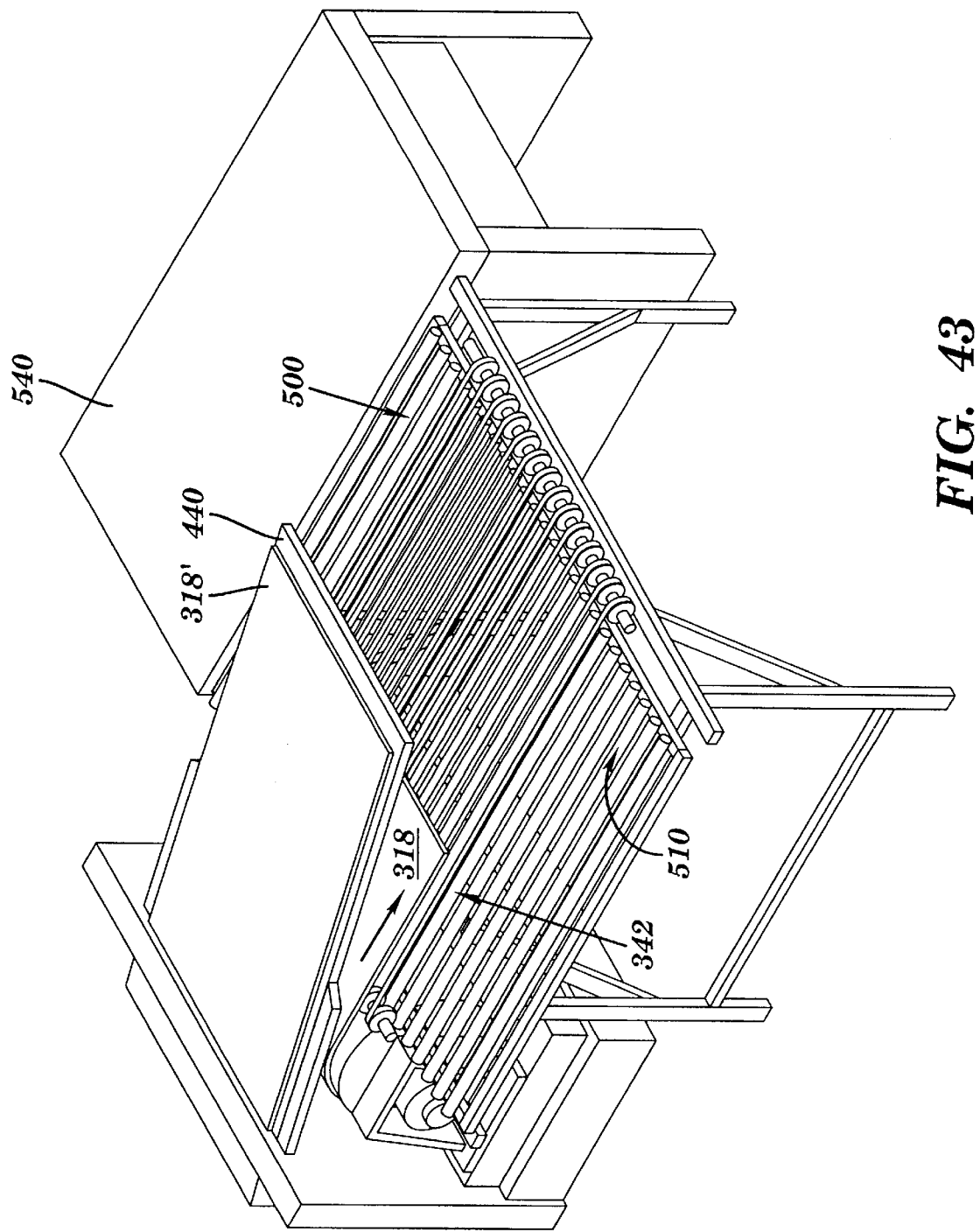
Figure 44:
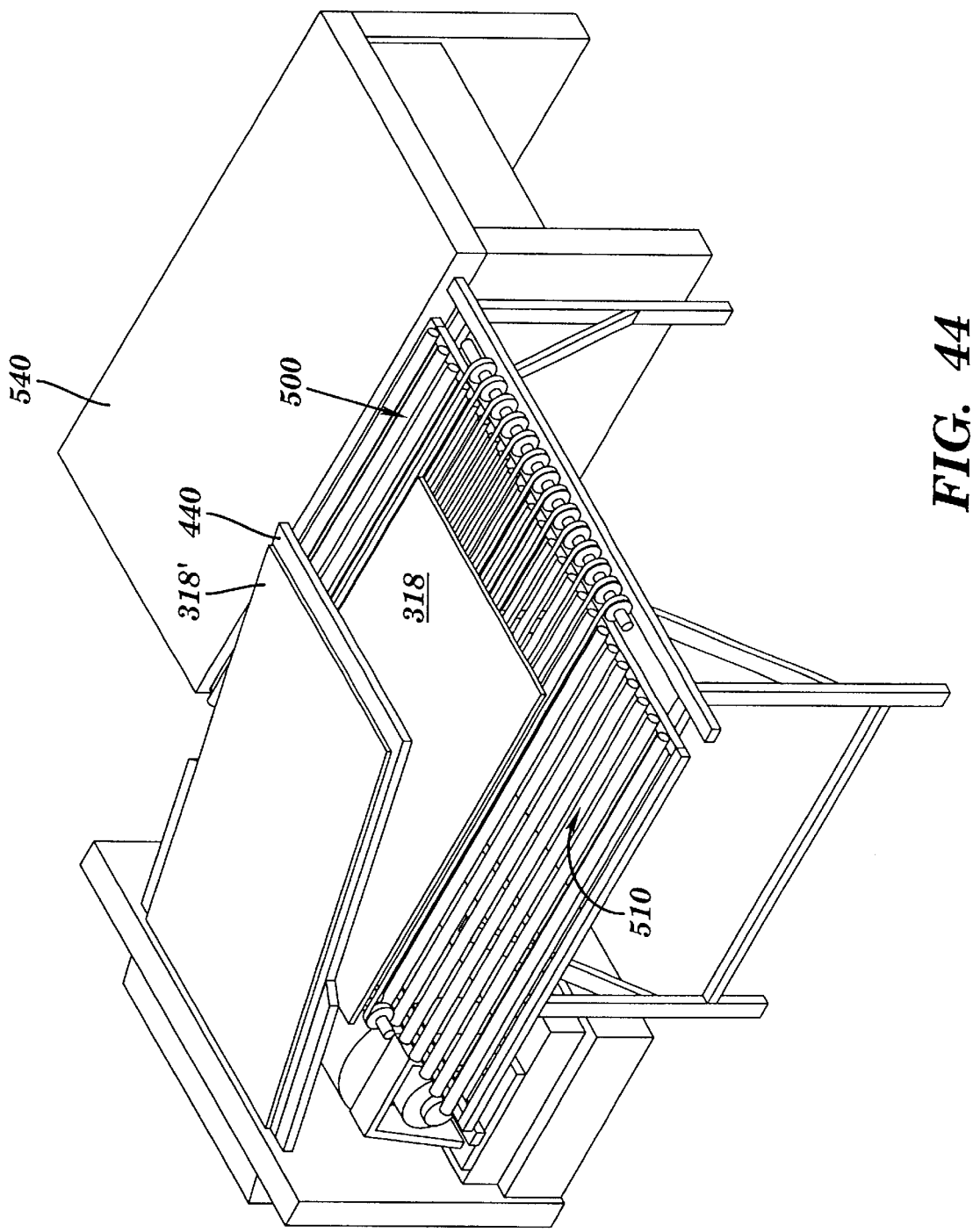

In step 626, the set of magnetic clamps 350 of the trailing edge clamping mechanism 344 are forced against and over the trailing edge 342 of the printing plate 318 by the actuating system 352 (see also FIG. 40). In step 628, the actuation system 352 and the ironing roller assembly 396 are moved away from the external drum 320 (see also FIG. 41), and a vacuum is introduced between the printing plate 318 and the external drum 320. The printing plate 318 is now fully applied to the external drum 320. In step 630, after side edge registration of the printing plate 318, the external drum 320 is rotated and the printing plate 318 is imaged (see also FIG. 42).

After imaging is complete, the external drum 320 is brought to a stop in step 632, with the set of magnetic clamps 350 of the trailing edge clamping mechanism 344 positioned under the actuating system 352. In step 634, the ironing roller assembly 396 is extended against the printing plate 318, the set of magnetic clamps 350 are pulled off the external drum 320 by the actuating system 352, and the vacuum to the external drum 320 is turned off. In step 636, the external drum 320 is rotated to position and direct the trailing edge 342 of the printing plate 318 onto the conveying system 500 and/or into and through the roller system 501 (see also FIG. 43). In step 638, rotation of the external drum 320 is temporarily halted when leading edge 338 of the printing plate 318, which is fixed in position by the leading edge clamping mechanism 340, is located beneath the actuating system 375. The ironing roller assembly 396 is then retracted. In step 640, the leading edge clamping mechanism 340 is opened by the actuating system 375, completely freeing the printing plate 318 from against the external drum 320. Finally, in step 642, the conveying system 500 and/or roller system 501 are operated to fully eject the printing plate 318 onto the output tray 510 (see also FIG. 44). The imaged printing plate 318 may be manually or automatically unloaded from the output tray 510, or may be directed into the on-line processor 540. The printing plate 318' previously loaded on the input tray 440, may now be mounted on the external drum 320 starting at step 614.

The media input/output scheme of the external drum platesetter 300 of the present invention provides, inter alia, the following:
1. The floor space (i.e., footprint) required by the external drum platesetter 300 is conserved by forming the input tray 440 separately from, and positioning the input tray 440 over, the output tray 510. Other related art input/output schemes often require at least twice the floor space as the present invention.
2. The separate input and output trays 440, 510, allow pre-staging of a second printing plate 318' while a first printing plate 318 is being imaged.
3. The landing zone 400 is optimally located; an operator is not required to blindly locate an input slot or registration point as is often required by the related art. After the printing plate 318 is "landed," the plate is easily slid to a staged position on the input tray 440.
4. After a printing plate 318 has been staged on the input tray 440, the leading edge 338 of the printing plate 318 is relatively close to the registration pins 378 on the external drum 320. Since the printing plate 318 is not required to travel a great distance to reach the external drum 320, transport errors are prevented, and transport time is reduced.

5. The loading of a printing plate 318 is assisted by gravity, due to the angled orientation of the input tray 440.
6. The external drum 320 and clamping mechanisms 340, 344, are easily accessed for service, since the input and output trays 440, 510, are positioned to the rear of the external drum platesetter 300. This configuration also provides space at the front of the external drum platesetter 300 for an optional automated multiple plate loader.

Either or both of the external drum platesetters 16, 300 may include an indicator light arrangement for providing visual signals to an operator regarding the operational and error status of the platesetter. An example of an indicator light arrangement 550 for the external drum platesetter 300 is illustrated in FIGS. 28 and 29.

The indicator light arrangement 550 comprises a pair of light columns 552 positioned on opposite sides of the input tray 440. Each light column 552 includes a plurality of individual light segments 554, each outputting one or more predetermined colors of light, and/or type of light (e.g., steady illumination, strobe, etc.).

The individual light segments 554 of the indicator light arrangement 550 of the present invention may be relatively large, thereby providing a visual indication of the operating status of the platesetter 16, 300, that is visible from a great distance. This may be useful, for example, in large printing shops with high noise levels, since the indicator light arrangement 550 allows an operator to view the status of the platesetter 16, 300, from as far away as 100 feet or more.

The indicator light arrangement 550 may be used to provide an operator with a wide variety of visual information, including, for example:

1. Platesetter on-line (ready);
2. Platesetter off-line (paused);
3. Error requiring operator intervention (e.g., clear jam, reboot, etc.);
4. Plate input allowed (i.e., a printing plate 318 may be loaded onto the input tray 440). This may occur, for example, if a job has not yet arrived from the RIP 14 (FIG. 1);
5. Plate input requested (e.g., a job has arrived from the RIP 14, but a previously received printing job has not finished imaging);
6. Plate input required (e.g., the platesetter is stalled until an operator loads a printing plate 318); and
7. Job progress percentage.

The job progress percentage may be provided, for example, by sequentially actuating individual light segments 554, from the bottom toward the top of each light column 552 (or vice versa), as a printing plate 318 is being imaged. The color sequence of the light segments 554 along each light column 552 may change from red to yellow to green as the printing plate 318 is being imaged, with green indicating that imaging is complete. Many other illumination schemes are also possible.

Many imaging systems, including internal and external drum imagesetters and platesetters, utilize a registration system comprising a pair of registration pins to accurately and repeatably position and locate several different sizes of printing plates or other recording media on a drum surface. To ensure that the registration pins properly align the leading edge of the printing plate to the longitudinal axis of the drum of the imaging system, the contact points of registration pins should be positioned as far apart as possible along the leading edge of the printing plate. To accommodate a wide variety of plate sizes, and provide the necessary separation (contact distance) of the registration pins, the registration pins of related art registration systems are often manually repositioned for each different plate size, or are automatically repositioned using a complex and expensive, active-powered adjustment system.

Figure 45:
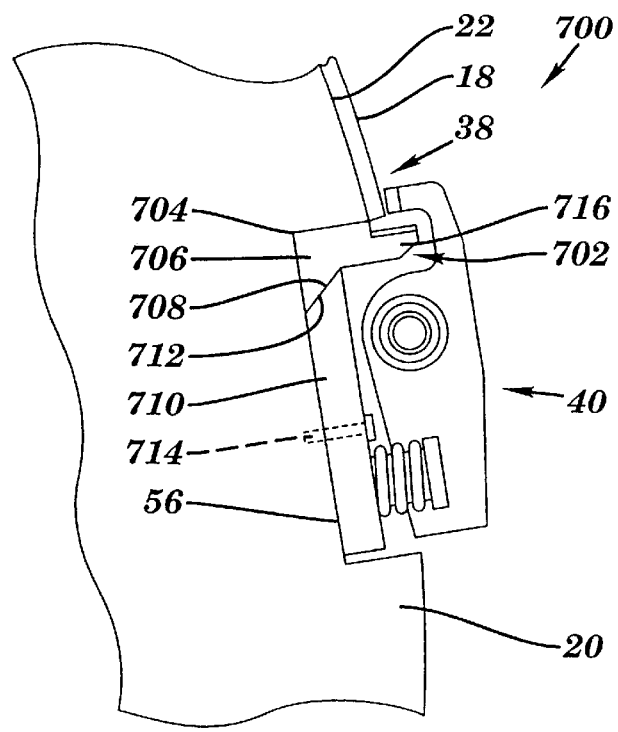
FIG. 45 illustrates an additional embodiment of the registration pins in accordance with the present invention.
Figure 46:
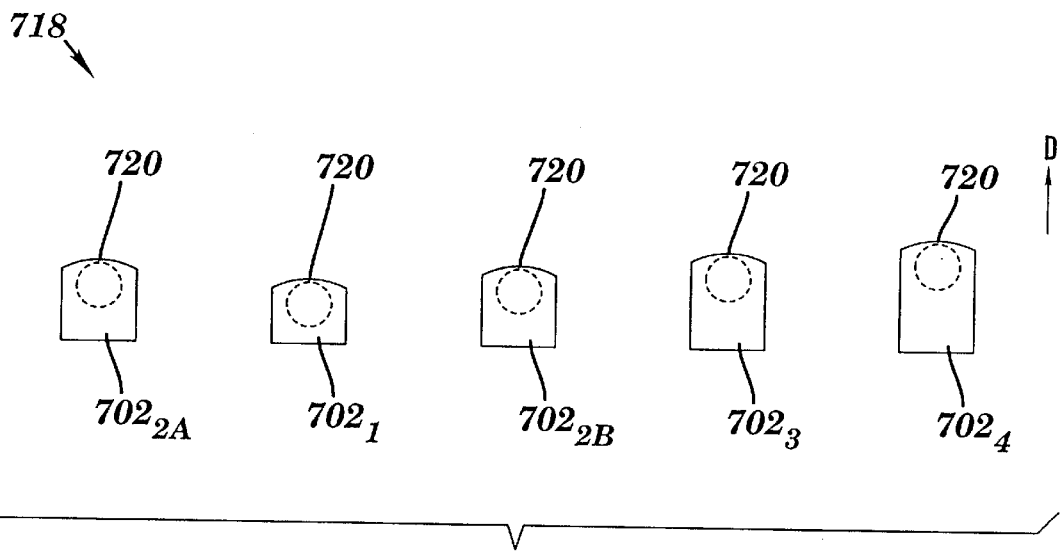
FIG. 46 is a plan view of a registration pin arrangement in accordance with the present invention.
Figure 47:
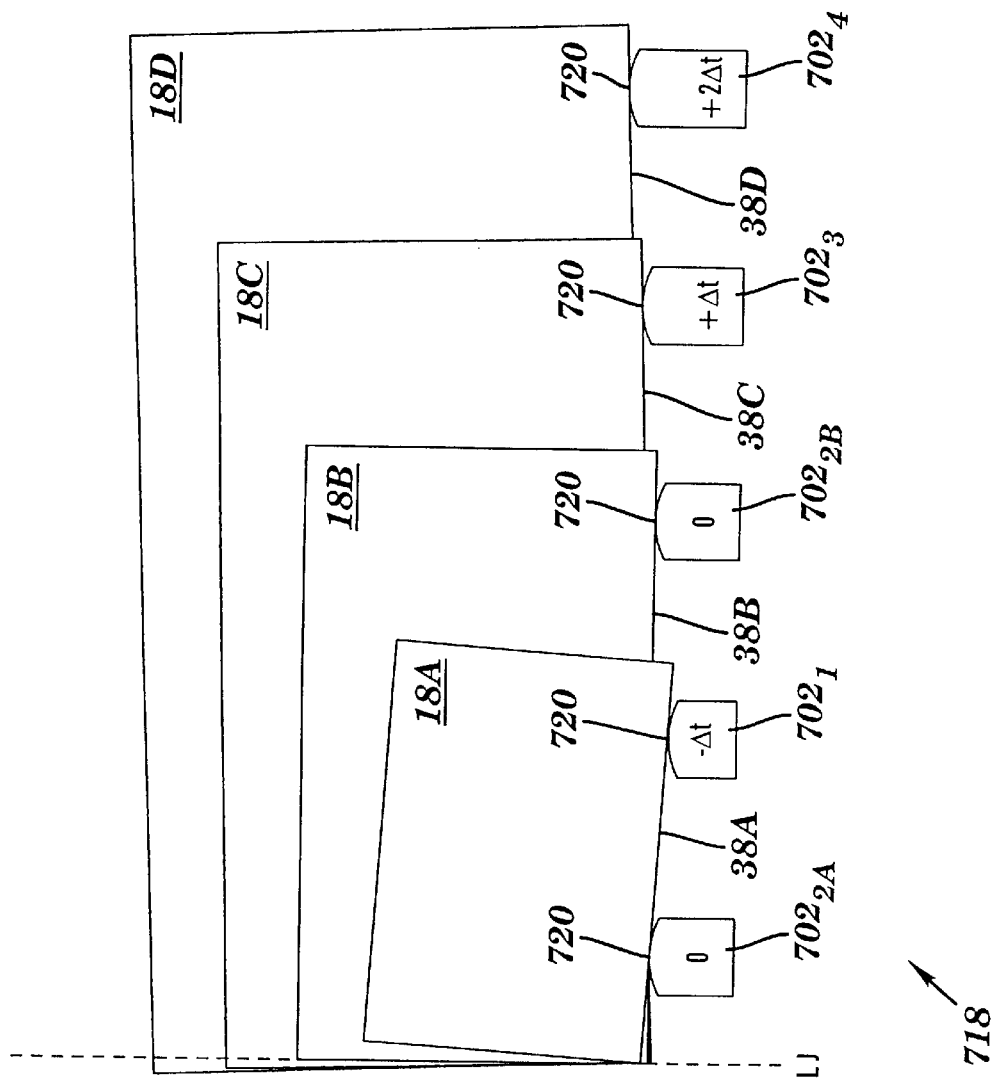
FIG. 47 illustrates the use of the registration pin arrangement of FIG. 46.

As illustrated in FIGS. 45–47, the present invention provides a registration system 700 that obviates the need for the manual or automatic relocation of the registration pins. In particular, the registration system 700 of the present invention provides a unique set of registration pins that is capable of supporting a plurality of different plate sizes and combinations of registration pin contact distances.

The registration system 700 includes a plurality of flanged registration pins 702 that are located within the groove 56 formed in the external drum 20 (or 320). The registration pins 702 may be located along the groove 56 at any axial position. A scale or fixture (not shown) may be used to accurately position the registration pins 702 along the groove 56. As described supra, the registration pins 702 are incorporated into the leading edge clamping mechanism 40. It should be noted, however, that the registration system 700 may also be used independently of the leading edge clamping mechanism 40, and in other imaging systems, to accurately and repeatably position and locate a printing plate or other recording media on a drum surface.

As shown most clearly in FIG. 45, each registration pin 702 is formed in an "L" shape that is configured to fit within and against a corner 704 of the groove 56. The leg 706 of the registration pin 702 includes an angled face 708. A bar 710 is provided to clamp the registration pins 702 against the corner 704 of the groove 56. The bar 710 includes a complementary angled face 712 that mates with, and wedges against, the angled face 708 formed on the leg 706 of each registration pin 702. A single bar 710 is used to collectively clamp the plurality of registration pins 702 within the groove 56. Alternately, several individual bar sections may be employed to clamp one or more of the registration pins 702 within the groove 56. The registration pins 702 are locked into position along the groove 56 by securing one or more fasteners 714 (e.g., bolts, screws, etc.) into the external drum 20 through the bar 710. As the bar 710 is tightened against the bottom of the groove 56, the angled face 712 of the bar 710 is wedged against the angled face 708 formed on the leg 706 of each registration pin 702, thereby securely clamping the registration pins 702 against the corner 704 of the groove 56. If axial adjustment of the registration pins 702 is required, the fasteners 714 may be loosened without removing the bar 710 from the groove 56, thereby allowing the registration pins 702 to be slid to the desired location within the groove 56.

The head 716 of each registration pin 702 extends radially beyond the media support surface 22 (or 322) of the external drum 20 (or 320). During the loading of the printing plate 18 onto the external drum 20, the leading edge 38 of the printing plate 18 contacts, and is positioned against, the heads 716 of a plurality of the registration pins 702. Only two of the registration pins 702 are contacted by each different size printing plate 18.

To ensure that only two of the registration pins 702 are contacted by any size (i.e., width, a.k.a., longitudinal dimension) of printing plate 18, the heads 716 of the registration pins 702 are provided with variable thicknesses (e.g., in about 0.005" increments) along a direction D that is parallel to the direction of rotation of the external drum 20. For example, a plan view of an arrangement 718 of registration pins 702 capable of supporting four different plate sizes, with each plate size contacting only two of the registration pins 702, is illustrated in FIG. 46. Of the five registration pins shown in FIG. 46, registration pin $702_1$ has the smallest head thickness, registration pins $702_{2A}$ and $702_{2B}$ have the same head thickness that is Δt larger than registration pin $702_1$, registration pin $702_3$ has a head thickness that is 2Δt larger than registration pin $702_1$ and Δt larger than registration pins $702_{2A}$ and $702_{2B}$, and registration pin $702_4$ has a head thickness that is 3Δt larger than registration pin $702_1$, 2Δt larger than registration pins $702_{2A}$ and $702_{2B}$, and Δt larger than registration pin $702_3$. Thus, the head thicknesses of the registration pins $702_1$, $702_{2A}$ and $702_{2B}$, $702_3$, and $702_4$ increase gradually in increments of Δt. An analogous arrangement of registration pins 702 may be provided for the case in which the different size printing plates 18 are right justified, rather than left justified.

In an alternate embodiment, the heads 716 of the registration pins $702_1$, $702_{2A}$ and $702_{2B}$, $702_3$, and $702_4$ may have a cylindrical configuration (shown in phantom in FIG. 46) with radii that vary in increments of Δt. Other configurations capable of providing the necessary variable thicknesses are also possible.

The use of the registration pin arrangement 718 is illustrated in FIG. 47. In FIG. 47, it should be noted that the relative sizes of the printing plates 18 and the registration pins 702, and the degree of tilt, if any, of the printing plates 18, have been exaggerated in order to more clearly depict the use of the registration pin arrangement 718 of the present invention. In this example, it is assumed that each different size (i.e., width) printing plate 18A, 18B, . . . , 18E, is left justified at location LJ (i.e., the bottom left edge of each printing plate 18A, 18B, . . . , 18E is positioned at location LJ. Printing plate 18A, the smallest printing plate, contacts registration pins $702_{2A}$ and $702_1$. The leading edge 38A of printing plate 18A angles downward toward registration pin $702_1$ due to the difference in thickness Δt between registration pins $702_{2A}$ and $702_1$. Printing plate 18B, the next larger printing plate, contacts the registration pins $702_{2A}$ and $702_{2B}$, which have the same thickness, and the leading edge 38B of printing plate 18B is maintained in a level orientation. Printing plate 18C, the next larger printing plate, contacts registration pins $702_{2A}$ and $702_3$. The leading edge 38C of printing plate 18C angles upward toward registration pin $702_3$ due to the difference in thickness Δt between registration pins $702_{2A}$ and $702_3$. Finally, printing plate 18D, the largest printing plate, contacts registration pins $702_{2A}$ and $702_4$. The leading edge 38D of printing plate 18D angles upward toward registration pin $702_4$ due to the difference in thickness 2Δt between registration pins $702_{2A}$ and $702_4$. The small amount of tilt, having a maximum of 2Δt in the example illustrated in FIG. 47, is typically within system tolerances, and may be easily compensated for, if necessary, by other components of the imaging system.

It should be noted that the increments in thickness between adjacent pairs of the registration pins 702 do not have to be uniform (i.e., equal to ±Δt). Rather, and more generally, the thicknesses of the registration pins 702 may have any suitable value as long as the lowest point of a line connecting the plate contact points of the registration pins 702 is located at the second registration pin (e.g., $702_1$ in FIG. 47) from the edge used for justification (e.g., LJ in FIG. 47). It should also be noted that each different size printing plate 702 contacts a common registration pin (e.g., $702_{2A}$ in FIG. 47), namely the registration pin closest to the edge used for justification.

In FIGS. 46 and 47, the head 716 of each registration pin $702_1$, $702_{2A}$, $702_{2B}$, $702_3$, and $702_4$, is provided with a large radius cylindrical registration surface 720 (e.g., a radius of about 1"). The registration surfaces 720 minimize contact stress with the leading edge 38 of the printing plate 18, thereby preventing plate edge damage.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention.

We claim:

1. A clamping mechanism, comprising:

a pair of rotatable members coupled to a first and a second end of an external drum;

a clamping bar connected to the pair of rotatable members;

a drive system mounted to at least one of the pair of rotatable members, for rotating the rotatable members and the clamping bar connected thereto; and an actuation system, positioned above a media support surface of the external drum, for radially displacing the clamping bar toward the media support surface.

2. The clamping mechanism of claim 1, wherein the clamping mechanism is configured to secure a trailing edge of a printing plate against the media support surface of the external drum.

3. The clamping mechanism of claim 1, wherein each rotatable member comprises a disc.

4. The clamping mechanism of claim 1, wherein each rotatable member further comprises:

a guided support post for supporting the clamping bar.

5. The clamping mechanism of claim 4, wherein each guided support post further comprises:

a biasing system for biasing the clamping bar radially away from the media support surface of the external drum.

6. The clamping mechanism of claim 5, wherein the biasing system comprises a compression spring.

7. The clamping mechanism of claim 1, further comprising:

a biasing system for biasing the clamping bar radially away from the media support surface of the external drum.

8. The clamping mechanism of claim 7, wherein the biasing system comprises a compression spring.

9. The clamping mechanism of claim 1, wherein each rotatable member further comprises:

a counterweight to counterbalance an overall mass of the clamping mechanism with respect to an axis of the external drum.

10. The clamping mechanism of claim 1, wherein the clamping bar further comprises:

at least one chamber; and a gasket extending along a periphery of each chamber.

11. The clamping mechanism of claim 10, further comprising:

a vacuum source coupled to each chamber.

12. The clamping mechanism of claim 11, wherein the clamping bar further comprises:

a hollow section connecting each chamber to the vacuum source.

13. The clamping mechanism of claim 12, wherein the hollow section extends along a length of the clamping bar.

14. The clamping mechanism of claim 11, wherein the clamping bar further comprises:
   a check valve between the vacuum source and the clamping bar.

15. The clamping mechanism of claim 11, wherein the clamping bar further comprises:
   a pressure relief valve for releasing a vacuum within each chamber.

16. The clamping mechanism of claim 11, wherein the gasket is configured to force a trailing edge of a printing plate against the media support surface of the external drum when a vacuum is supplied to each chamber by the vacuum source.

17. The clamping mechanism of claim 1, wherein the clamping bar further comprises:
   at least one support post slidably mounted to the external drum and coupled to the clamping bar.

18. The clamping mechanism of claim 17, further comprising:
   a biasing system coupled to each support post to bias the clamping bar radially away from the media support surface of the external drum.

19. The clamping mechanism of claim 18, wherein the biasing system comprises a compression spring.

20. The clamping mechanism of claim 17, wherein each support post further comprises:
   a retainer slidably mounted within a slot formed in the external drum.

21. The clamping mechanism of claim 20, wherein each slot extends at least partially about a circumference of the external drum.

22. The clamping mechanism of claim 20, wherein each slot includes an undercut portion for slidably receiving the retainer.

23. The clamping mechanism of claim 1, wherein the actuation system further comprises:
   an extendible arm; and
   an actuator for forcing the extendible arm against the clamping bar.

24. The clamping mechanism of claim 23, further comprising:
   a biasing system for biasing the clamping bar radially away from the media support surface of the external drum, wherein the extendible arm counteracts the biasing system to force the clamping bar against the media support surface.

25. The clamping mechanism of claim 1, wherein the drive system further comprises:
   an actuator; and
   a friction wheel selectively actuated against one of the rotatable members by the actuator.

26. The clamping mechanism of claim 25, wherein the drive system further comprises:
   a biasing system for biasing the friction wheel away from the rotatable member.

27. The clamping mechanism of claim 1, wherein the drive system is configured to rotate the rotatable members to position the clamping bar out of a printing plate loading path.

28. The clamping mechanism of claim 1, wherein the drive system is configured to rotate the rotatable members to position the clamping bar under the actuation system.

29. The clamping mechanism of claim 28, wherein the actuation system is located over a trailing edge of a printing plate positioned on the media support surface of the external drum.

30. The clamping mechanism of claim 29, further including:
   a sensor for detecting whether the trailing edge of the printing plate is located under the actuation system.

31. A clamping mechanism for an external drum platesetter, comprising:
   an actuation system positioned over an external drum;
   a clamping system for securing an edge of a printing plate against the external drum; and
   a rotary system for rotating the clamping system relative to the external drum into an operative position under the actuation system and over the edge of the printing plate.

32. A clamping mechanism for securing a trailing edge of a printing plate against an external drum, comprising:
   an actuator positioned over the trailing edge of the printing plate;
   a pair of rotatable discs coupled to a first and a second end of the external drum;
   a clamping bar attached between the pair of rotatable discs;
   a drive mechanism for rotating the rotatable discs to position the clamping bar into an operative position under the actuator, wherein the actuator forces the clamping bar against the trailing edge of the printing plate.

* * * * *